United States Patent
Crisp

(10) Patent No.: US 10,380,060 B2
(45) Date of Patent: Aug. 13, 2019

(54) LOW-PINCOUNT HIGH-BANDWIDTH MEMORY AND MEMORY BUS

(71) Applicant: Etron Technology, Inc., Hsinchu (TW)

(72) Inventor: Richard Dewitt Crisp, Hornitos, CA (US)

(73) Assignee: Etron Technology, Inc. (TW)

( * ) Notice: Subject to any disclaimer, the term of this patent is extended or adjusted under 35 U.S.C. 154(b) by 85 days.

(21) Appl. No.: 15/618,907

(22) Filed: Jun. 9, 2017

(65) Prior Publication Data
US 2017/0364469 A1  Dec. 21, 2017

Related U.S. Application Data

(60) Provisional application No. 62/351,556, filed on Jun. 17, 2016.

(51) Int. Cl.
*G06F 13/42* (2006.01)
*G06F 13/28* (2006.01)
(Continued)

(52) U.S. Cl.
CPC .......... *G06F 13/4234* (2013.01); *G06F 13/28* (2013.01); *G06F 13/4068* (2013.01);
(Continued)

(58) Field of Classification Search
CPC .............................. G06F 13/4234; G06F 13/28
(Continued)

(56) References Cited

U.S. PATENT DOCUMENTS

| 4,514,808 A | * | 4/1985 | Murayama | G06F 13/4018 |
| | | | | 710/307 |
| 4,847,867 A | * | 7/1989 | Nasu | G06F 13/4077 |
| | | | | 375/257 |

(Continued)

FOREIGN PATENT DOCUMENTS

| CN | 1489155 A | 4/2004 |
| CN | 101154210 A | 4/2008 |

(Continued)

OTHER PUBLICATIONS

International Search Report and Written Opinion for PCT/IB2017/001333 dated Feb. 22, 2018.

(Continued)

*Primary Examiner* — Farley Abad
*Assistant Examiner* — Henry W Yu
(74) *Attorney, Agent, or Firm* — Lerner, David, Littenberg, Krumholz & Mentlik, LLP

(57) ABSTRACT

A memory subsystem is provided, including a memory controller integrated circuit (IC), a memory bus and a memory IC, all which use fewer signals than common DDR type memory of the same peak bandwidth. Using no more than 22 switching signals, the subsystem can transfer data over 3000 Megabytes/second across the bus interconnecting the ICs. Signal count reduction is attained by time-multiplexing address/control commands onto at least some of the same signals used for data transfer. A single bus signal is used to initiate bus operation, and once in operation the single signal can transfer addressing and control information to the memory IC concurrent with data transfer via a serial protocol based on 16 bit samples of this single bus signal. Bus bandwidth can be scaled by adding additional data and data strobe IO signals. These additional data bus signals might be used only for data and data mask transport. The physical layout of one version of the memory IC dispatches (Continued)

switching signal terminals adjacent to one short edge of the memory die to minimize the die area overhead for controller IC memory interface circuitry when used in a stacked die multi-chip package with said memory controller IC. The memory IC interface signal placement and signal count minimize signal length and circuitry for the memory bus signals.

23 Claims, 84 Drawing Sheets

(51) Int. Cl.
G06F 13/40 (2006.01)
G11C 8/18 (2006.01)
G11C 5/02 (2006.01)
G11C 5/06 (2006.01)
G11C 11/401 (2006.01)
G11C 11/4076 (2006.01)
G11C 11/409 (2006.01)
G11C 11/4093 (2006.01)
G11C 11/4096 (2006.01)
G11C 7/10 (2006.01)

(52) U.S. Cl.
CPC .......... *G06F 13/4282* (2013.01); *G11C 5/025* (2013.01); *G11C 5/066* (2013.01); *G11C 7/1072* (2013.01); *G11C 8/18* (2013.01); *G11C 11/401* (2013.01); *G11C 11/409* (2013.01); *G11C 11/4076* (2013.01); *G11C 11/4093* (2013.01); *G11C 11/4096* (2013.01)

(58) Field of Classification Search
USPC .............................. 710/4–5, 20–21, 35, 308
See application file for complete search history.

(56) References Cited

U.S. PATENT DOCUMENTS

| | | | |
|---|---|---|---|
| 5,428,775 A * | 6/1995 | Drako | G06F 9/30181 345/204 |
| 5,600,606 A | 2/1997 | Rao | |
| 6,185,633 B1 * | 2/2001 | Johnson | G06F 13/28 710/22 |
| 6,269,029 B1 * | 7/2001 | Suh | G11C 7/1006 365/189.06 |
| 7,058,133 B2 * | 6/2006 | Menzl | H04R 25/43 375/219 |
| 7,287,119 B2 | 10/2007 | Barth et al. | |
| 9,335,951 B2 | 5/2016 | Son et al. | |
| 10,108,220 B2 * | 10/2018 | Wang | G06F 1/10 |
| 2004/0122988 A1 * | 6/2004 | Han | G06F 13/28 710/5 |
| 2004/0184325 A1 | 9/2004 | Fujioka et al. | |
| 2004/0243907 A1 | 12/2004 | Cochran et al. | |
| 2007/0233923 A1 | 10/2007 | Lee | |
| 2008/0137467 A1 * | 6/2008 | Pyeon | G11C 5/066 365/230.06 |
| 2008/0151622 A1 | 6/2008 | Qawami et al. | |
| 2008/0313382 A1 * | 12/2008 | Nurmi | G06F 13/385 710/314 |
| 2009/0089530 A1 * | 4/2009 | Bodnar | G11C 8/04 711/167 |
| 2010/0211733 A1 * | 8/2010 | Vu | G06F 12/0804 711/114 |
| 2012/0063243 A1 * | 3/2012 | Hasan | G11C 7/1093 365/189.07 |
| 2012/0131241 A1 | 5/2012 | Robertson et al. | |
| 2012/0155586 A1 | 6/2012 | Felder et al. | |
| 2012/0300555 A1 | 11/2012 | Shin et al. | |
| 2013/0262907 A1 * | 10/2013 | Zitlaw | G06F 1/10 713/501 |

FOREIGN PATENT DOCUMENTS

| | | |
|---|---|---|
| EP | 0775347 A3 | 5/1997 |
| TW | 201248406 A | 12/2012 |
| TW | 201411642 A | 3/2014 |
| WO | 2012048444 A1 | 4/2012 |

OTHER PUBLICATIONS

Search Report of Taiwanese Patent Application No. 106119792 completed Nov. 13, 2017.
Cypress Semiconductor Corporation, Cypress Embedded in Tomorrow, 3.0V/1.8 V, 64 Mbit (8Mbyte)/128 Mbit (16 Mbyte), Hyper-row, Hyper-Ram Self-Refresh DRAM, HyperRAMTM Low Signal Count Interface, Document No. 001-97964 Rev. *J, pp. 1-56, Apr. 2017.
Hyperbus Specification Low Signal Count, High Performance DDR Bus, Cypress Perform, Cypress Semiconductor Corporation, pp. 1-47, Jul. 2015.
Micron Technology, Inc., 4Gb: x4 x8 x16 DDR3L SDRAM, pp. 1-213, Copyright 2011.
OKI Semiconductor n64 RDRAM Datasheet, OKI Electric Industry Co., Ltd. pp. 1-47, Copyright 1999.
Serial Port Memory Technology—Wikipedia, downloaded on Jun. 8, 2017, https://en.m.wikipedia.org/wiki/serial_Port_Memory_Technology, pp. 1-3.
International Search Report from PCT/US2017/050718 dated Dec. 29, 2017.

* cited by examiner

Misaligned and Aligned Data Structures

ASIC DIE MINIMUM SIZE (mechanically limited):

X = DRAM X + Single Row Bonding Shelf – Die Overhang

Y = DRAM Y + 2* Single Row Bonding Shelf

LOW-PINCOUNT HIGH-BANDWIDTH MEMORY AND MEMORY BUS

CROSS-REFERENCE TO RELATED APPLICATIONS

The present application claims the benefit of the filing date of U.S. Provisional Patent Application No. 62/351,556 filed Jun. 17, 2016, the disclosure of which is hereby incorporated herein by reference.

BACKGROUND OF THE INVENTION

Technical Field

The present disclosure is directed to the area of buses and memory devices used in computing and data buffering applications such as execution memory or buffer memory and buses useful for communicating therewith.

Description of the Related Art

High-bandwidth buffer memory and buses can be used in multiple applications including video applications that advantageously use a memory bus to connect memory to system logic.

Video Display Systems in portable devices may incorporate "Panel Self Refresh" buffer memory in the display panel to enable power savings when the information on the display is unchanging.

To improve image quality and to reduce flicker, large format display systems may scan the display at a rate faster than new information is provided to the display by employing Scan Rate Converter technology incorporating buffer memory.

Touchscreen Display systems may incorporate buffer memory in the digitizer frame buffer.

Portable Video Appliances may incorporate buffer memory used in association with video capture, compression, decompression, storage, editing, display or video playback.

Portable panoramic imaging systems may incorporate buffer memory used by lens distortion correction algorithms.

Some types of systems may incorporate memory used on a bus that may accommodate more than one memory or memory type.

Many computing and video systems require memory for storage of operating instructions and or data. For all but the smallest memory capacities, is generally more cost effective to use a separate memory IC or combination of ICs to provide the memory storage versus integrating the storage on board the system logic IC. A bus is often used to interconnect a controller IC to one or more memory ICs. The controller IC may perform other tasks related to the system operation such as video processing, programmable logic, or other functions and is not limited to memory interfacing alone.

The memory technology determines in part requirements for the protocol used by a bus connected to a memory. At the same time, bus protocol and physical properties establish the bandwidth and functional requirements of the memory ICs and controllers using the bus. The number of bus signals, the speed at which they switch and the signaling protocol ultimately limits the performance of the memory bus.

Memory ICs are commonly designed to be used in a broad range of applications ranging from high capacity memory systems used in data center servers to single chip buffer memories used in WIFI routers as one example. The length of the electrical connections for the memory bus signals in these applications can range from less than a millimeter to several tens of centimeters. Bus signal integrity requirements may range from matched length wirebonds to PCB impedance control, matched trace lengths and parallel terminations with connectors in the signaling path.

Because memory ICs commonly support this broad universe of applications they usually incorporate tens of signals for electrical connection to the controller ICs to expose and access all of the memory IC functions. For example, to support construction of ranks of memory combined to make a single memory system, chip-select signals are incorporated on the memory ICs along with strobes to allow only specific memory ICs to be selected for a particular operation.

Some applications have memory access patterns that involve movement of blocks of sequential bytes that may be several thousand bytes in size while others have memory access patterns that are largely random from a cycle by cycle perspective. For that reason discrete addressing signals separate from data bus signals are used on most memory ICs to permit simultaneous addressing and data transfer.

On the one hand having separate resources for strobing, selecting and addressing memory ICs offers a high level of generality in applications using such memory ICs, on the other hand it is common to use 45 or more bus signals to connect to each memory IC. For applications served by a single memory IC and for which operate on blocks of data, many of the signals are underutilized resources that add cost with little marginal benefit.

Each signal connecting to the memory requires circuitry on the controller IC as well as a terminal on the controller IC die to permit electrical connections thereto. Such terminals or bonding pads occupy space on the controller IC die and it is possible that the size of the controller IC die is determined solely by the number of such bonding pads combined with the design rules for the IC manufacturing and packaging technology used for fabrication.

In such arrangements the efficiency of the system memory bus may be reduced for some access patterns because the memory bus can be used to transmit either data or address/control information but not both simultaneously. For example it may not be feasible for a multi-bank DRAM to be accessed in burst read mode during the time a separate internal bank of memory bits is activated when using such a memory bus arrangement. As a consequence memory bus efficiency is degraded causing a reduction in average bus bandwidth.

SUMMARY OF THE INVENTION

As a consequence it is desirable to reduce the number of signals required to connect to a memory IC for many types of applications, i.e., those that do not require large capacity memory systems. In some systems such as where the memory access patterns are primarily large sequential blocks of data, it is possible to eliminate a significant number of memory interface signals by multiplexing address and control information onto signals that otherwise carry data information. This method can significantly reduce the number of memory controller IC signals required to connect to the memory, which can in turn save memory controller IC die area and cost as well as power.

A more efficient memory protocol can therefore provide the same average bandwidth using a lower operating frequency. This can reduce power and simplify PCB as well as IC design.

This invention is directed toward improved memory buses and ICs used thereon which feature reduced signal count but accommodating high average and peak bandwidth and operational efficiency when used in miniaturized computing, video, buffering and other bandwidth intensive applications. Efficient support of DRAM memory technology characteristics and requirements is one of the features of the bus and protocol. One embodiment of the invention provides a bus and protocol for operating an improved memory device that reduces the total cost of a data processing system.

An embodiment of the invention reduces the number of bus signals interconnecting a memory integrated circuit (IC) to a memory controller IC.

An embodiment of the invention reduces the power associated with interconnecting a memory IC device to a memory controller IC and the operation thereof.

An embodiment of the invention is a memory bus architecture that transports control and addressing information for DRAM Read, Write, Activation, Precharge and Refresh functions by using a single functional signal.

An embodiment of the invention is a memory system containing two memory ICs and one controller interconnected via a common bus.

An embodiment of the invention is a memory architecture that accommodates misaligned data structures in burst write mode.

An embodiment of the invention is a high bandwidth buffer memory architecture optimized for use in multi-die packaging.

An embodiment of the invention is an improved high bandwidth memory IC with IC floorplan designed to permit reduction of the mechanically-limited minimum physical size of a controller IC when mechanically stacked with said high bandwidth memory die as elements in a multi-die interconnected assembly.

An embodiment of the invention is a low signal count high bandwidth memory suitable for wafer level packaging used in combination with separately packaged memory controller ICs to construct miniaturized systems without using stacked bare die assemblies.

An embodiment of the invention is a stacked package configuration comprising a package containing one or more memory ICs stacked atop a second package containing a logic IC wherein the two packages are electrically interconnected using in part up-facing terminals on the lower package.

An embodiment of the invention is a multichip memory package containing at least two memory die sharing the same memory bus and interconnected to a memory controller via the same memory bus.

One embodiment provides a bus configured to interconnect at least one memory storage integrated circuit (IC) to a controller IC. The bus comprises a plurality of electrical bus conductors configured to be electrically coupled to a collection of terminals on the memory IC and to corresponding terminals on the controller IC, wherein the bus conductors are categorized in one or more of the following groups based on a type of signal transmitted through the bus conductor: a data bus group, a data strobe group, a clock group, a chip select group or a control group. The one or more bus conductors in the data bus group are adapted to transport a parallel command from the controller IC to the memory IC during a command transfer time and are further adapted to transport data between the memory IC and the controller IC using a burst mode during a data transfer time, and the one or more bus conductors in the control group comprise a single conductor adapted to transport a serial command from the controller IC to the memory IC during the data transfer time such that the serial command can control the operation of the memory IC.

In some examples, the serial command includes an operation code specifying a function of the serial command, the function being one of a null operation function, a burst mode function, an activation function or a utility function, wherein the utility function includes means to command the memory IC to terminate an ongoing burst mode memory operation and includes means to command the memory IC to precharge banks contained therein. For example, the bus can transport a first serial command from the controller IC to the memory IC and immediately thereafter transport a second serial command to the memory IC. The serial command may provide for switching the bus operating mode between read mode and write mode and between write mode and read mode while the memory IC is performing a burst memory operation. A width of the data bus may be one, two, four, six, or eight bytes, where a byte is a one of eight or nine bits, and the data strobe group may comprise two, four, eight, twelve, or sixteen conductors.

In some examples, a write mask is transferred over the data bus as part of a burst write operation. The bus may be adapted to operate in a sustained burst mode of unlimited duration.

The bus may be disposed within a single semiconductor package containing a controller IC die and a memory IC die, wherein the memory IC die and controller IC die are disposed in a stacked arrangement, wherein the bus conductors comprise a group of unique bondwires, with each bus interface terminal on the memory IC die coupled via a unique bondwire to the corresponding bus interface terminal on the memory controller IC die, and a backside of the memory IC die faces a frontside of the controller IC die. Other configurations are also contemplated.

Another embodiment provides a bus for interconnecting at least one memory IC with a controller IC wherein the bus is adapted to transfer memory commands and data using the same conductors wherein the bus is comprised of 16 conductors adapted to transport memory commands and data, two conductors adapted to transport clocks, and no more than five additional conductors and where the bus is adapted to transfer data at a peak bandwidth of at least 3000 Megabytes per second.

Yet another embodiment provides a means for interconnecting at least one memory storage integrated circuit (IC) to a controller IC, comprising means for electrically coupling a collection of terminals on the memory IC to corresponding terminals on the controller IC, including means for transmitting signals of one or more of the following type: data signals, indications of stability of transmitted information, clock signals, chip selection signals, or control signals, and means for transmitting through a single pin a serial command from the controller IC to the memory IC during a data transfer time such that the serial command can control the operation of the memory IC.

DETAILED DESCRIPTION

A memory IC may be connected via a bus to a controller IC and satisfy memory related system requirements. In some cases the memory IC is combined with the controller IC in the same package.

Figure 1:
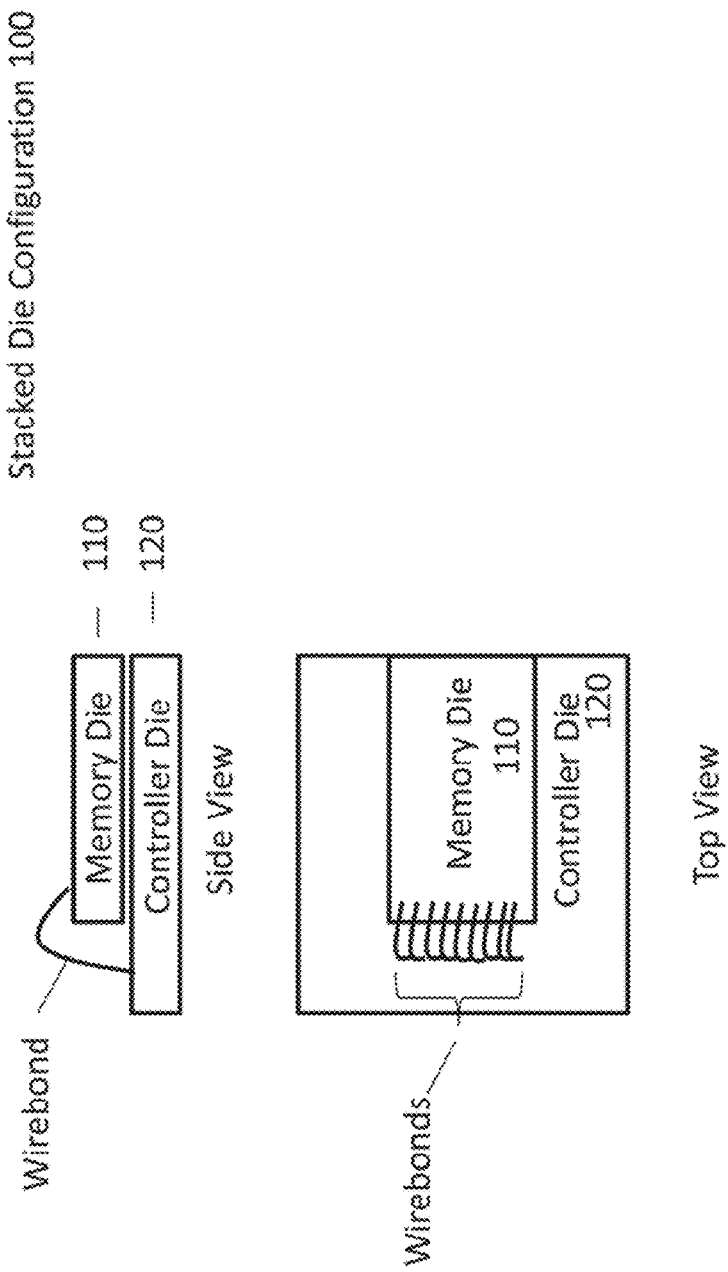
FIG. 1 is diagram showing a memory die stacked atop a memory controller die and electrically interconnected using wirebonds.

FIG. 1 illustrates one example configuration, where the memory IC is stacked on top of the controller IC in bare die form and interconnected using wire-bonding technology to provide electrical connections to the memory IC. There are numerous other ways to interconnect multiple die placed in the same package. No matter what method is used, from a manufacturing perspective it is beneficial to minimize the number of these electrical connections. This invention is directed toward reducing the number of connections used for a memory bus.

In some examples herein, the term "signal" means electrical conductors configured for transport of digital information. In other examples, the term "signal" may refer to transmission of data or other information. The meaning of the term should be understood by those of skill in the art based on the context.

With fewer bus signals less silicon area is required for the memory interface circuitry on the controller IC. Having a small number of signals also makes it easier to keep the signals together in a small region on the floor plan of the controller IC, which can offer IC layout benefits. Also fewer signals mean there are fewer connections used to interconnect the memory and controller ICs. But as the number of signals is reduced, so is the maximum bandwidth of the bus for a given switching speed: there are simply fewer switching signals to transport information.

A memory bus may transport addressing and control information to the memory devices as well as to transport data between the controller ICs and memory ICs. The addressing and control information are used to direct the memory to perform the requested operation and the data is the payload in the transaction. Other signals required by the bus may include signals used to support the signaling technology such as reference voltages or termination power supplies.

Figure 2:
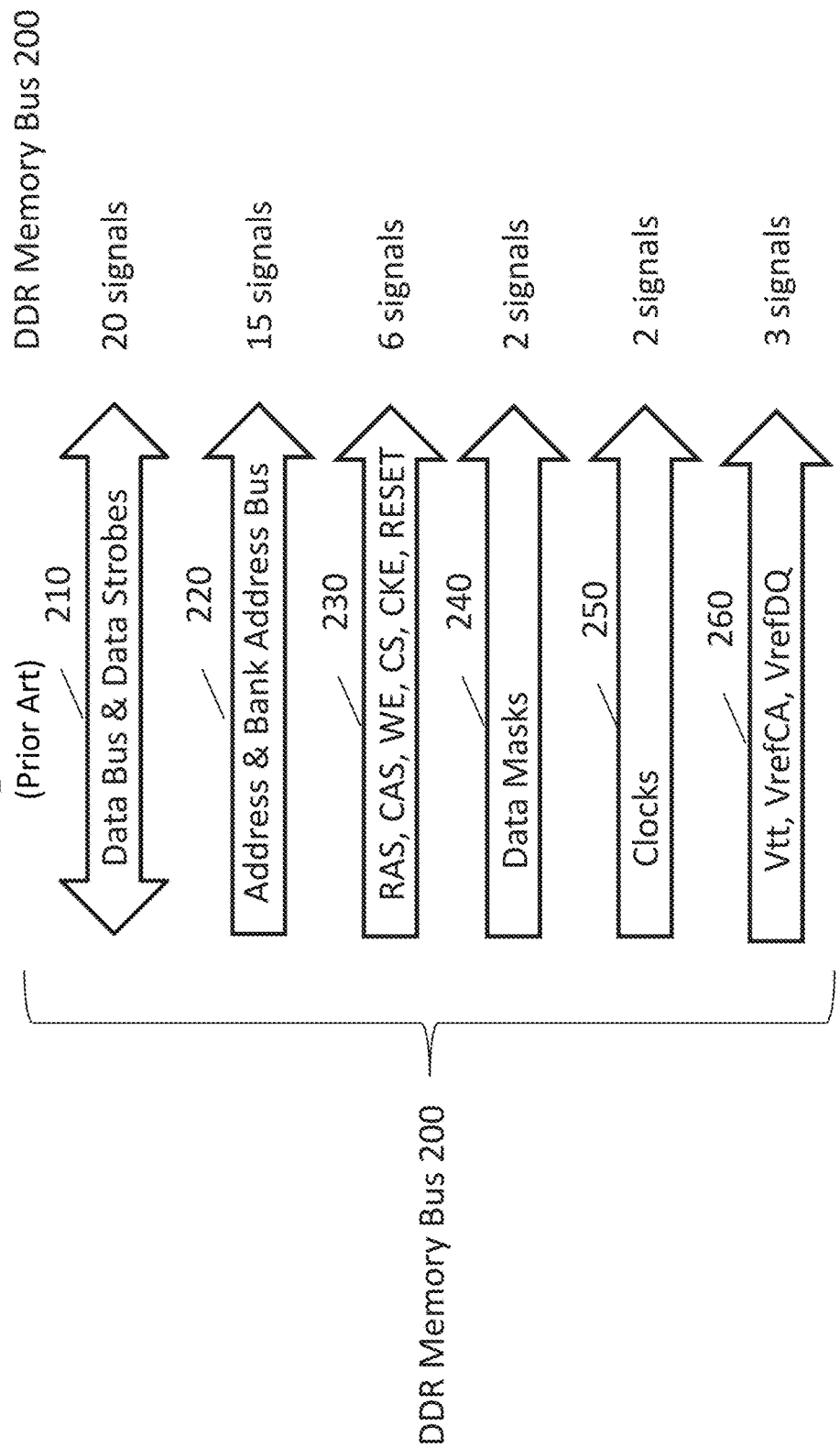
FIG. 2 is a diagram showing main bus signals used in Prior Art for connecting to a commonly used DDR3 type dynamic random access memory (DRAM).

FIG. 2 illustrates a Prior Art DDR3 type Memory Bus used for interconnecting a DDR3 DRAM to a Controller. The DDR3 DRAM bus has clock signals, data signals, address signals, bank address signals, command signals, strobe signals, reference voltage signals, termination voltages and so on that comprise the DDR3 memory bus. A total of more than 45 signals are used with the DDR3 bus.

Eliminating signal pins from a DDR3 type bus by multiplexing addressing/control information onto the data bus pins would necessitate timesharing the same signal wires for transferring address/command information and data information by timesharing. Since data cannot be transferred during address/command transfer time, the efficiency of the bus would be severely reduced.

Access patterns to the memory may vary significantly from application to application. Some applications involving photographic images or video may access memory in long sequential bursts with non-sequential jumps interspersed among the memory traffic. In applications where the memory is used as execution memory, the accesses are often to fill cache lines and may include sequential speculative prefetching. The cache lines are often groups of 16 to 32 bytes. In both of these examples such a multiplexed bus memory is accessed in bursts of multiple bytes in a sequential or other predetermined order. In those cases the memory bus may transfer only a starting address and burst information to initiate access to the memory: address and control information transfer may be infrequent compared to the data. The multiplexed bus so described may meet efficiency requirements in certain classes of applications and uses a reduced number of signals when compared with a conventional DDR3 type bus that uses dedicated address, command and data signals. The data signals may be used for transferring address and control information during one part of a memory transaction and using them for transferring data during another part. In such a scheme a significant number of signals may be eliminated from the bus with tolerable impact on its operational efficiency. In such a scheme the bus would transfer address and command information to the memory to initiate the memory transaction. The data would follow after a latency period has elapsed.

Because the multiplexed bus is used to send commands/addressing information and is used to transfer data, there are limits to the bus efficiency (ratio of clock cycles used for data transfer divided by total clock cycles for a transaction). This efficiency limit reduces the average bandwidth to a value less than the peak bandwidth. Efficiency is improved for longer bursts versus shorter bursts since the overhead for addressing and commands is a limited number of clock cycles.

Memory traffic on such a bus will therefore comprise a collection of transactions, each of which includes a command/address transfer period and a data transfer period. Optimizing the effective bandwidth on such a bus includes scheduling long sequential bursts of data, be it read or write traffic. For some data types this is a natural feature of the data such as video. In other applications it may not be a simple matter to increase the data burst lengths.

Figure 3:
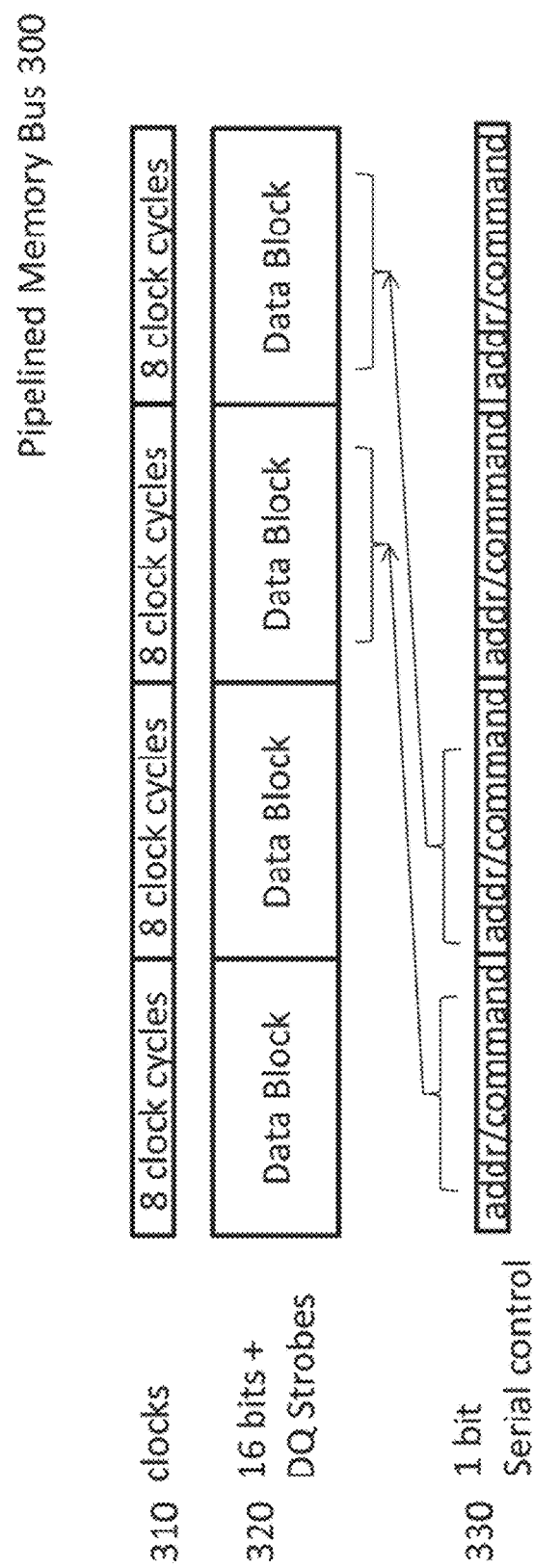
FIG. 3 is a bus operation diagram showing address streaming to a memory using an embodiment of the invention.

The inventive bus described in the present disclosure goes beyond the multiplexed bus just described. To increase the efficiency of a multiplexed bus arrangement, this inventive bus incorporates a dedicated narrow signal path that is used to transfer command and addressing information to the memory irrespective of data traffic on the bus. In this way addressing and command information can be streamed to the memory concurrent with data being transferred by the bus. By using a pipelined address and command decoding scheme in the bus protocol, data transfers can be performed continuously with optional random addressing on a cycle by cycle basis. FIG. 3 illustrates an example of this invention incorporating an address/command streaming function using a single signal included in the bus protocol to provide high operating efficiency. See FIG. 3.

The electrical environment of a bus formed by combining a bare memory IC stacked on top of a bare controller IC can provide benefits from a signal integrity perspective. Spurious EMI (electromagnetic interference) radiation may be reduced by using short connections and confining high speed memory bus signals within a single multi-chip package versus routing the memory bus a distance on a PCB to interconnect separate packages.

If wirebonding technology is used to interconnect the memory to the controller directly in such a stacked die application, then such connections may be relatively short, often less than 1 mm. As a result bus settling times are also short, simplifying termination requirements and potentially saving power by sidestepping use of parallel terminations.

Another advantage from having a small number of signals is placement on the memory IC floorplan: all the switching signals can be arranged along one short side of the die. Similarly it is advantageous to place all of the controller IC's memory interface signals for a given memory channel in a common region of the controller die, so having a small number aids in that goal.

Still another advantage of reducing the number of signal connections makes the signal-to-signal length matching a simpler task: fewer signals are length and impedance-matched. It is also possible to reduce the complexity of the circuits designed for the drivers and receivers when the connections are short: PLLs and DLLs may be avoided for example, reducing power, complexity and start up time.

When the memory IC and the controller ICs are placed in separate packages and interconnected via a PCB, careful attention may be given to shielding, trace length matching, impedance control and proper termination practices, depending on the operating frequencies and total bus routing length.

In some systems a package containing one or more memory ICs is stacked directly atop a lower logic IC package using vertical electrical connections. Such a configuration may be referred to as POP ("Package On Package") and may be fabricated by placing electrical connections around the periphery of an upper and a lower semiconductor package and forming said electrical connections using soldering technology. The solder connections may be placed in one or more rows around the periphery of the packages.

The upper package may contain one or more memory ICs while the lower package contains a system logic IC.

Figure 4:
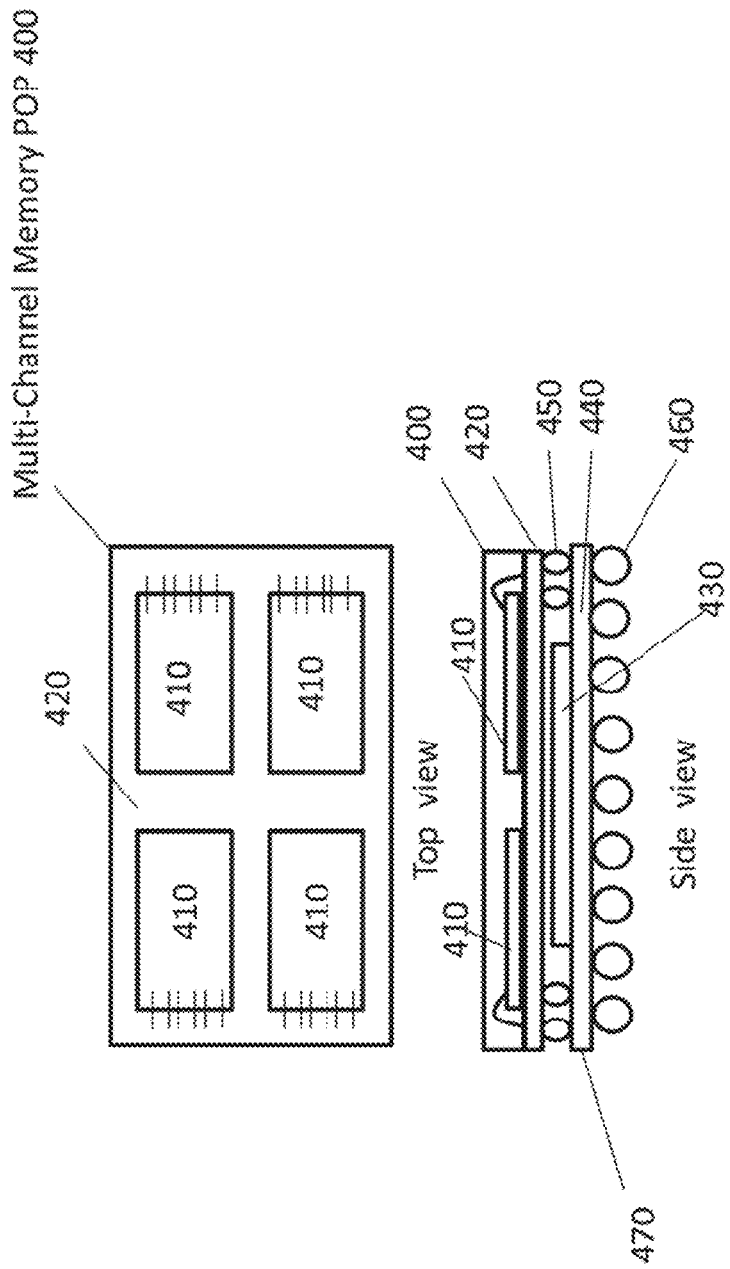
FIG. 4 is a diagram showing a Package on Package configuration of an embodiment of the invention that uses multiple memory die each dispatched on a separate memory channel.

The bandwidth benefits of operating multiple memory ICs in parallel may therefore be economically deployed in a multi-parallel-channel configuration using a POP packaging scheme. In the example of FIG. 4, four separate memory channels, each with one memory IC, are deployed using POP technology. In this example, four LPC Memory Die 410 are placed on a common substrate 420 and are electrically connected via wirebond technology. The four die are operated in parallel providing a 4× increase in overall bandwidth. The memory assembly 400 is placed atop a lower package 470 in a package on package POP configuration. This provides high memory bandwidth without routing signals on a PCB and occupying space for the memory package and signal routing area. One of the advantages over this approach versus conventional memory die is the smaller number of signals needed allow a larger pitch between signals used for the vertical connections leading to lower cost technology options for the lower package 470.

In some systems each memory interface on a memory controller IC has its memory bus signals connected to a memory bus containing only a single memory IC. In other system configurations the memory bus may contain multiple memory ICs of the same type or possibly of different types. One example would be a DRAM memory IC and a FLASH memory IC both connected to the same memory bus.

It is possible to intermix, on the same memory bus, memory ICs that have different bandwidth and latency characteristics. The memory bus can be designed to accommodate such different devices. For example the memory bus can be designed to access some memory ICs using so-called DDR signaling while for accessing a different type of memory SDR signaling can be used. It is also possible to dynamically change the frequency of the system clock used for the memory bus to accommodate the requirements of devices with different access characteristics.

The x16 Low Pin Count Bus ("LPC BUS") is a high bandwidth x16 bus (>3000 Megabytes/second) designed to interconnect memory to a controller using fewer signals than conventional memory buses. The bus and operating protocol are particularly designed to permit memory devices using DRAM technology to be used efficiently on the bus.

The Low Pin Count DRAM ("LPC DRAM") is a memory IC designed to be used on the LPC bus. It offers high bandwidth data IO using fewer pins (or other signal terminals) than conventional memory architectures. The LPC DRAM uses data bus signals to receive address and control information at different times to avoid using multiple separate address and control signals in the bus. The LPC DRAM device also uses a single unidirectional signal to receive addressing and command information from the controller to boost operational efficiency.

Figure 5:
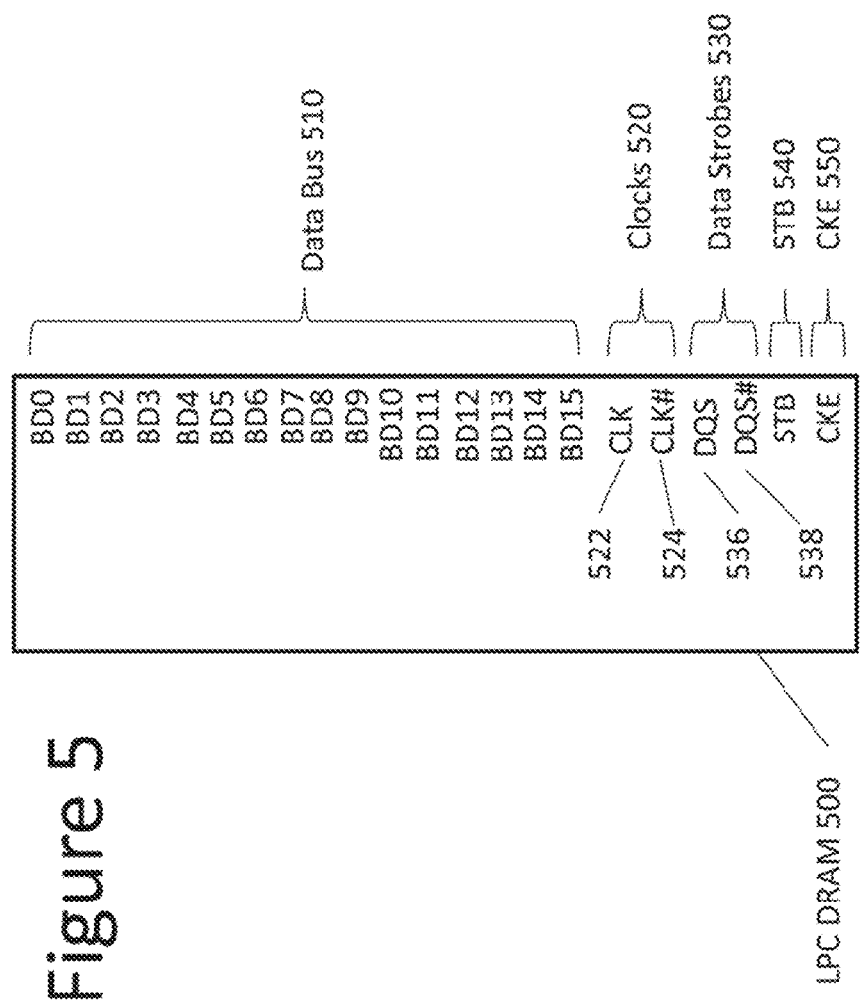
FIG. 5 is a diagram showing the signals connecting to the Low Pin Count (LPC) DRAM.

FIG. 5 illustrates an example of LPC DRAM 500. The DRAM's switching signals include the Data Bus 510, Clocks 520, Data Strobes 530, Strobe (STB) 540 and Clock Enable (CKE) 550. These signals comprise the high speed switching signals used in the LPC BUS.

The x16 LPC DRAM is designed to store and recall data in 32 byte (256 bit) groups called Words. Addressing of the DRAM's storage locations is specified to the Word level. Using Write Masks, it is possible to limit writes to specific bytes in a Word.

Figure 6:
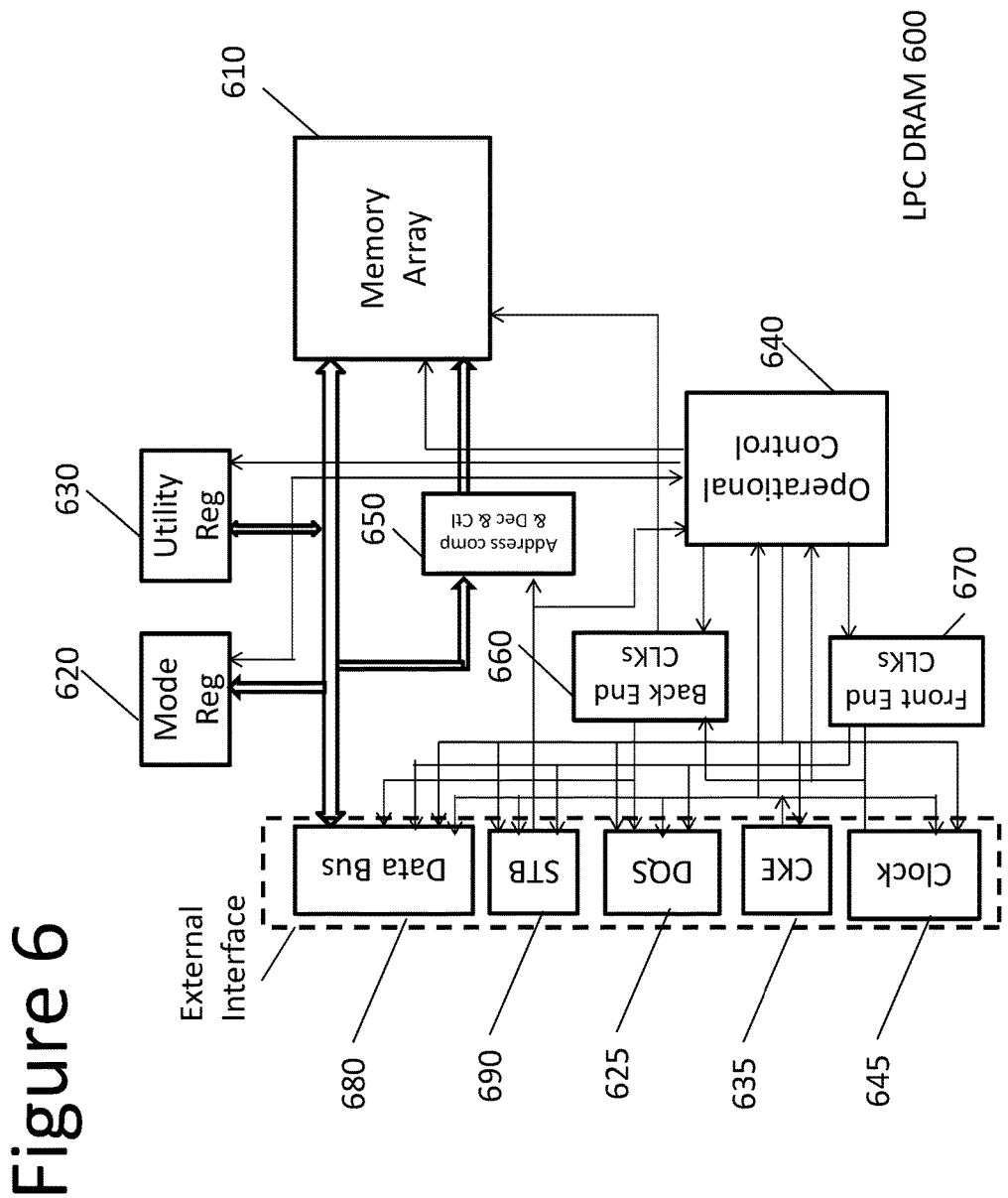
FIG. 6 a block diagram of the LPC DRAM.

FIG. 6 illustrates a block diagram of the DRAM. Memory array 610 is organized into one or more banks. The memory array 610 is a dynamic memory array and receives bank, row, and column addresses to specify a given Word to access. Before a bank may be used for data storage and retrieval, it is first precharged and then activated. Activation means decoding a specific wordline in the bank and sensing the bits the wordline selects.

Addressing and commands are provided via both the Data Bus 680 and the STB 690 external signals using different protocols.

Addressing and control is provided to the DRAM using packets. Packets can be supplied by the Data Bus 680 using a parallel protocol or by the STB signal 690 using a serial protocol.

The Address Computation and Decoder/Control ("ACDC") 650 block receives packets and includes an internal address incrementing circuit. A common mode of operation is for the DRAM to receive an address from a packet which is used to access a Word in the Memory Array 610. Subsequent addresses may be generated by auto-incrementing a previously used address originally received via the packet protocols. The ACDC 650 also stores row address information to support multiple open pages. The ACDC block additionally selects and schedules the address to be decoded for accessing the memory array. Furthermore the ACDC block sequences these operations for pipelined array and bus operation.

Random column addresses can also be provided to the DRAM via the Serial Request Packet Protocol transported over the STB signal 690 during Active cycles in a pipelined manner if non-sequential addressing or other control is desired.

High Bandwidth Core Architecture

Figure 7:
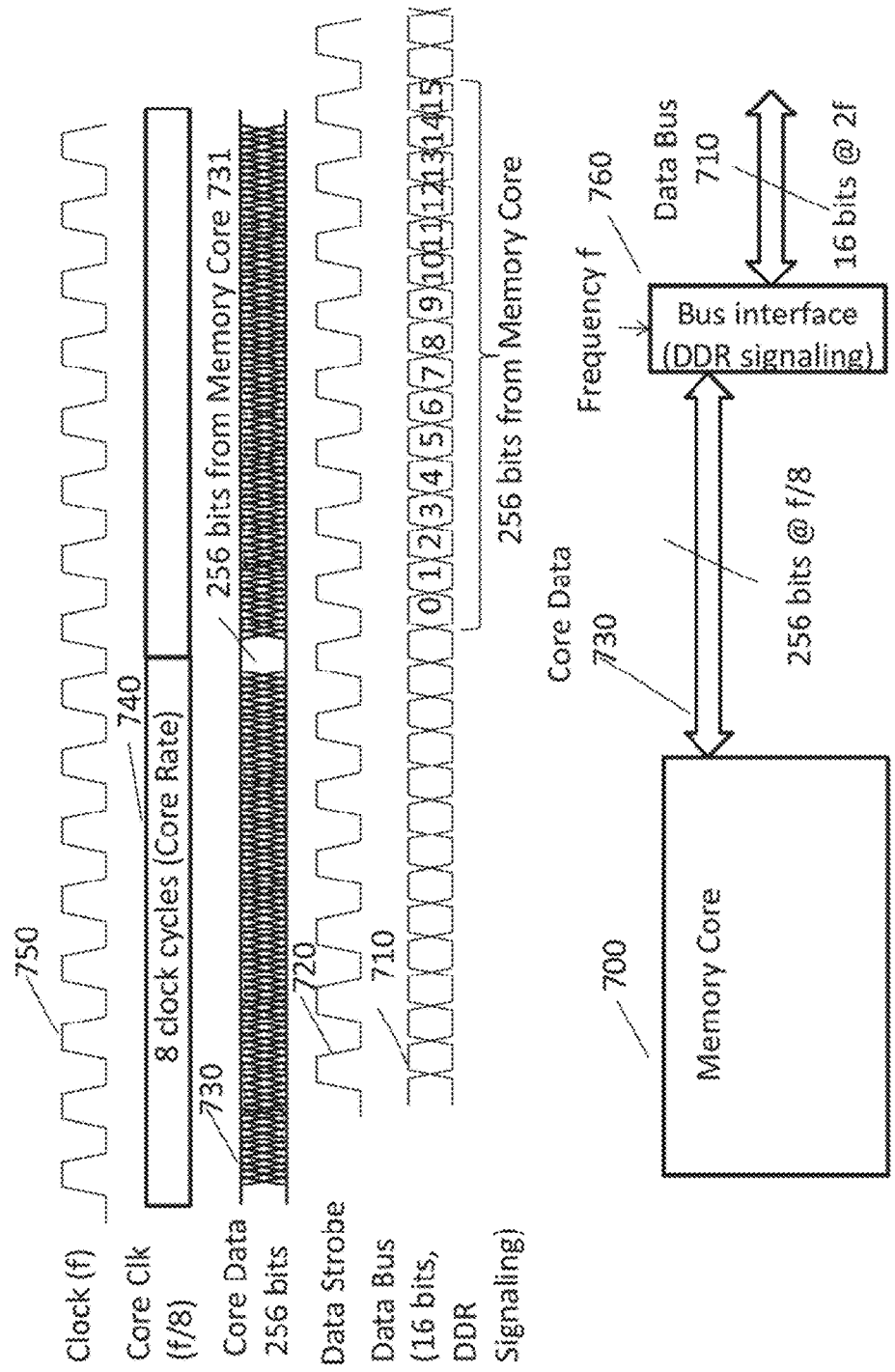
FIG. 7 is a diagram showing bandwidth matching between a moderate speed memory core and a high speed external port.

FIG. 7 illustrates an external Data Bus 710, which provides a 16 bit data sample twice per Clock 750 cycle. With a Clock frequency of F, the Data Bus transfers bytes at frequency 4 F. Due to circuit design constraints, the Memory Core 700 cannot cycle as fast as the external clock. As a result the Memory Core runs at a reduced frequency of F/8. Because the Memory Core 700 provides the Core Data 730 at the same bandwidth as the Data Bus, the width of the Core Data path is 16 times greater than the external Data Bus. For a 16 bit wide DDR-type Data Bus, the internal Core Data path is 256 bits wide. The memory array is therefore accessed one Word (e.g. 256 bits) at a time, and is the minimum addressing granularity of the DRAM.

Internal Clocking

Figure 8:
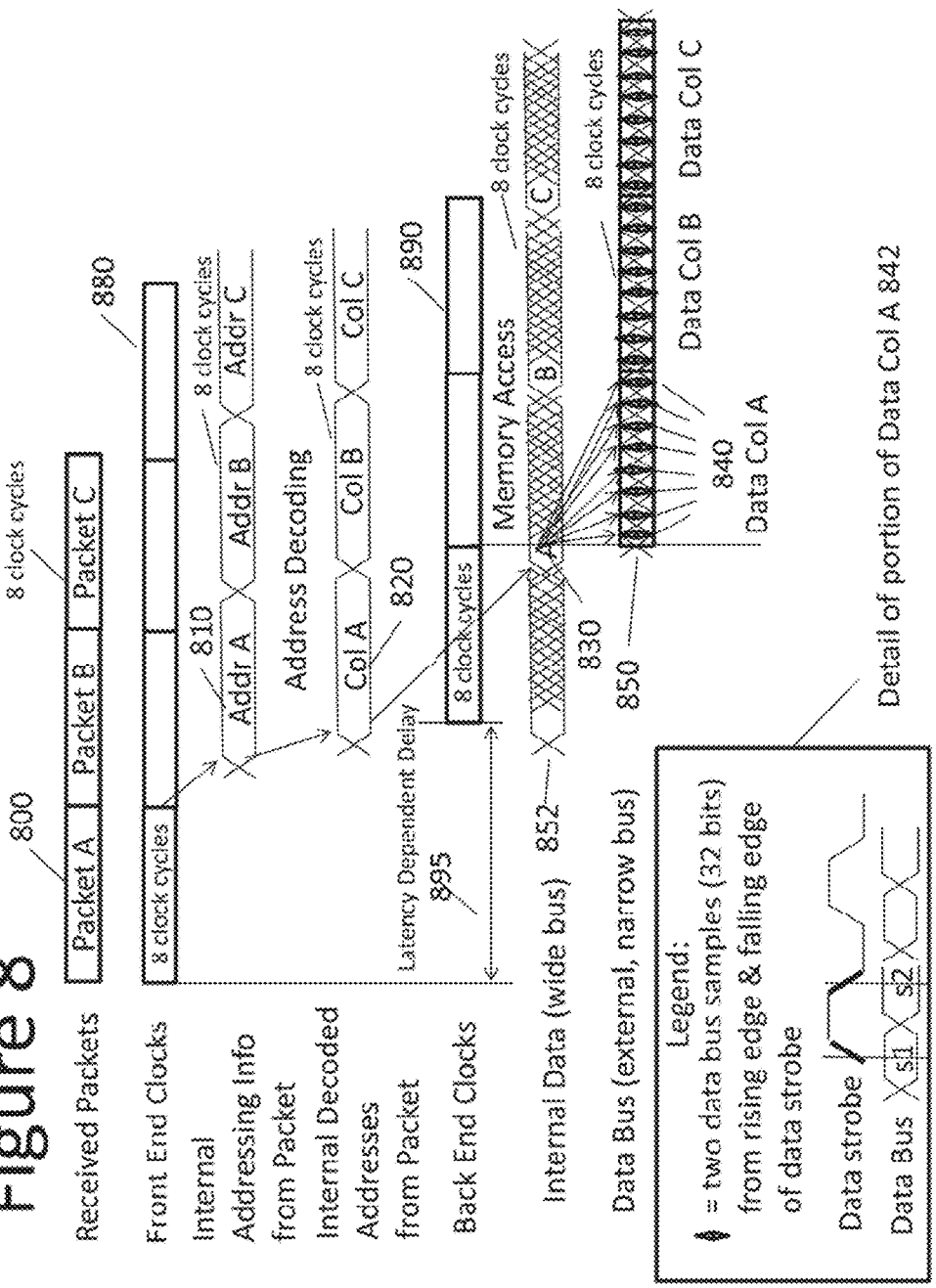
FIG. 8 is a timing diagram showing pipelined addressing and data accessing in the LPC DRAM using front end and back end clocking systems.

Referring to FIG. 8, there are two internal clocking domains, including Front End Clocks 880 and Back End Clocks 890. Received Packets 800 are framed and timed using the Front End Clocks which provide Internal Addressing Info 810 into the address decoding of the ACDC block resulting in Internal Decoded Addresses 820 supplied to the memory core. New addresses can therefore be provided to the memory core at frequency F/8 when the Clock is operating at frequency F. The Decoded Address information 820 is used for a Memory Access that provides Internal Data A 830 on Internal Data bus 852.

Data operations into the memory core are framed relative to the Backend Clocks 890. The Back End Clocks 890 are timing-offset from the Front End Clocks 880 using a Latency Dependent Delay 895. All sampling of the Internal Data and control and timing of the Data Words is framed to the Back End Clocks 890 when transmitting or receiving Data Packets.

Figure 9:
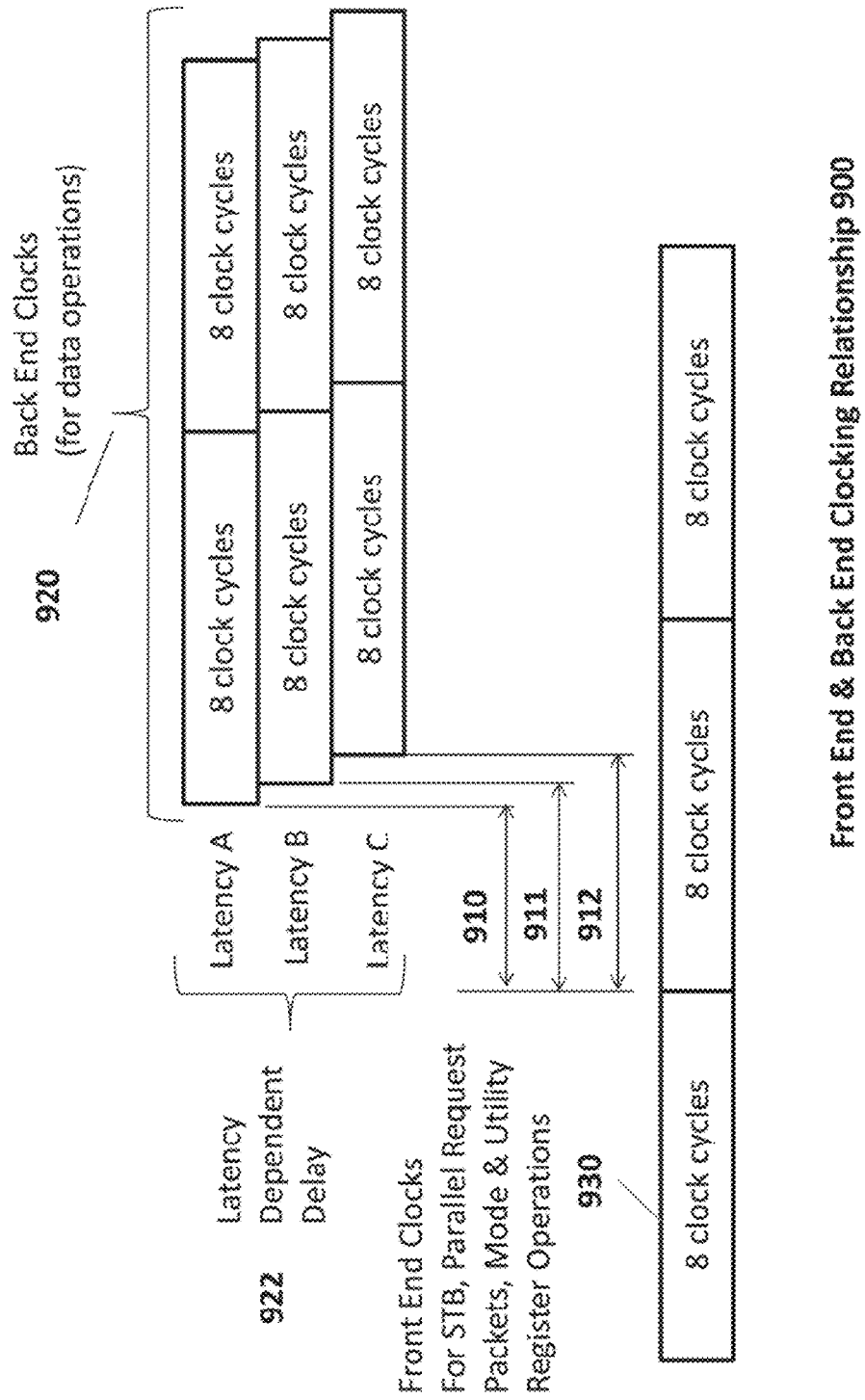
FIG. 9 is a timing diagram showing relationship between front end clocks and back end clocks using a latency dependent delay.
Figure 10:
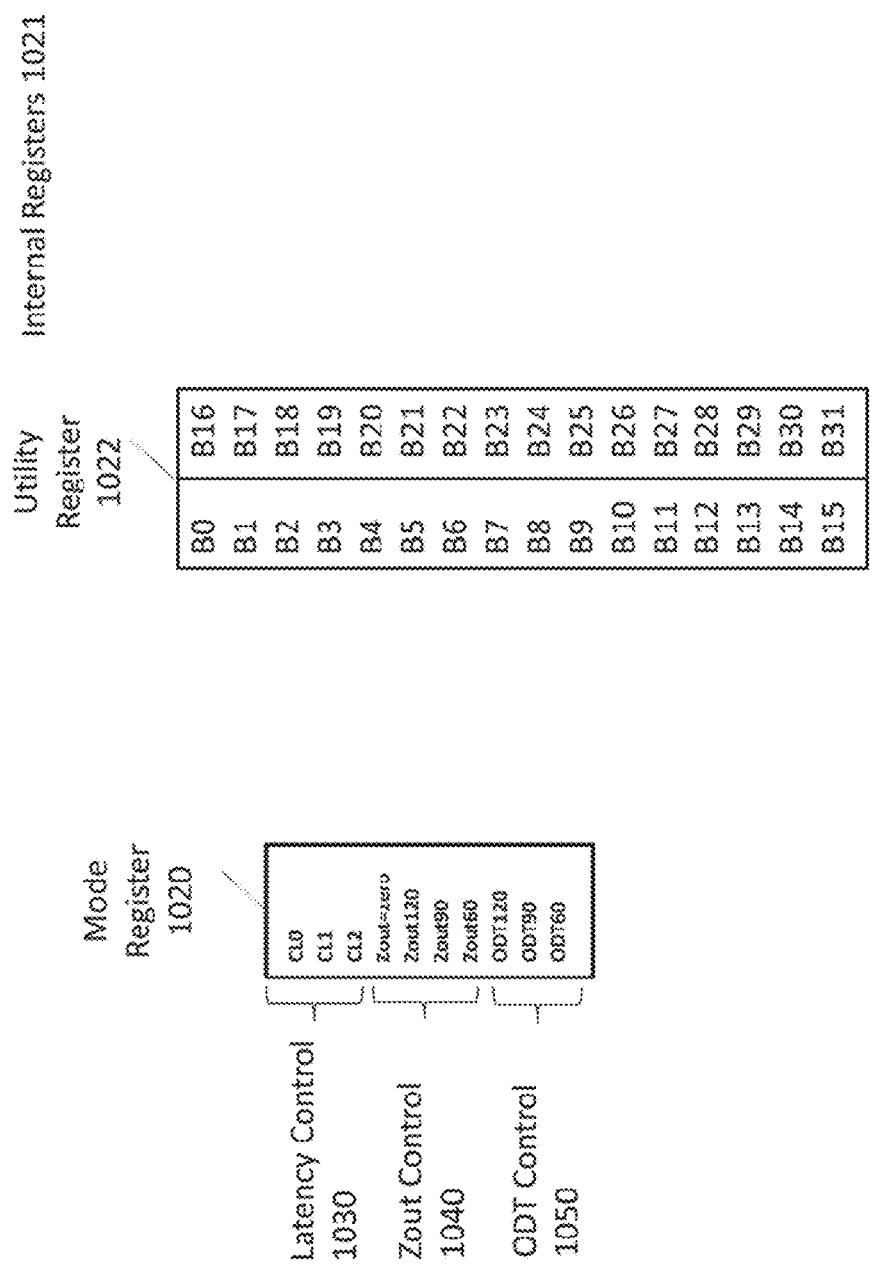
FIG. 10 shows internal registers of the LPC DRAM.

The Latency Dependent Delay 922 shown in FIG. 9 is controlled by bits in the Mode Register (see FIG. 10, Latency Control 1030). While three Latency Control bits are allocated for programmable latencies, only three examples are shown in FIG. 9 for clarity versus the 8 possible values associated with three bits. FIG. 9 shows three different Latency values: Latency A 910, Latency B 911 and Latency C 912 that determine the timing offset for the Back End Clocks 920.

Operation

When power is initially applied, the DRAM is initialized before use. Initialization consists of placing the DRAM into the Power Down State. The Power Down state is entered by driving CKE signal low and clocking the DRAM one time. The Clock can then be stopped. Exiting the Power Down state is done by restarting the Clock while CKE is low (false or disabled) and then driving CKE high while the STB signal is high.

Figure 11:
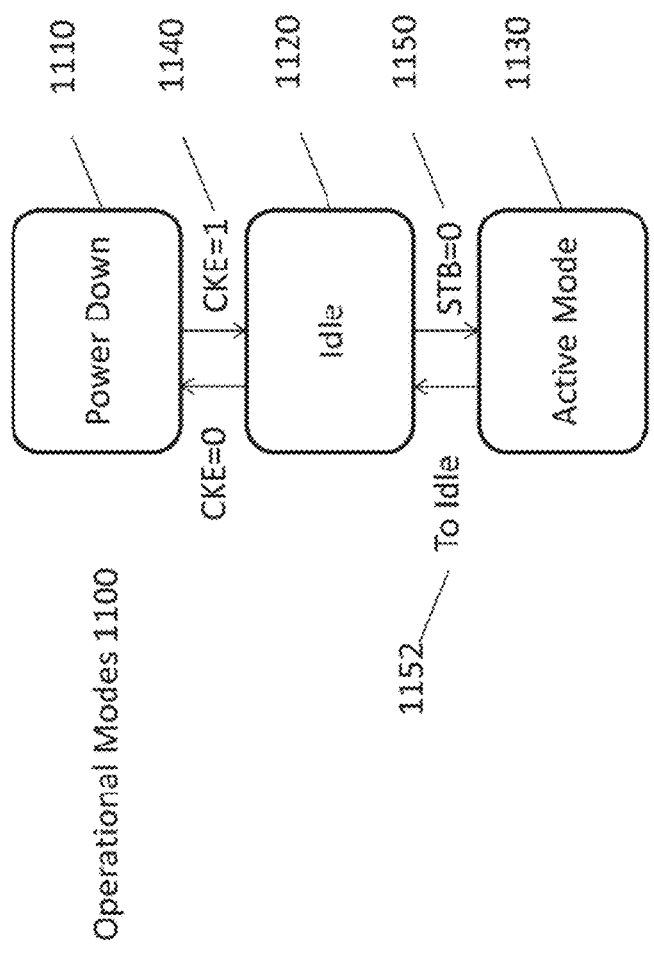
FIG. 11 is a high level state transition diagram of the LPC DRAM.

The DRAM has three primary operational modes 1100 shown in FIG. 11: Power Down 1110, Idle 1120 and Active 1130.

The DRAM remains in the Power Down Mode while the CKE signal is in the FALSE state.

When the CKE signal is asserted 1140, the DRAM transitions to the Idle Mode 1120. While in the Idle Mode 1120, the DRAM is ready for normal operation. A low going transition on the STB signal 1150 is used to signal the beginning of the Active Mode 1130. Once in the Active Mode, the DRAM's behavior follows the State Diagram shown in FIGS. 12, 13 and 14.

Figure 12:
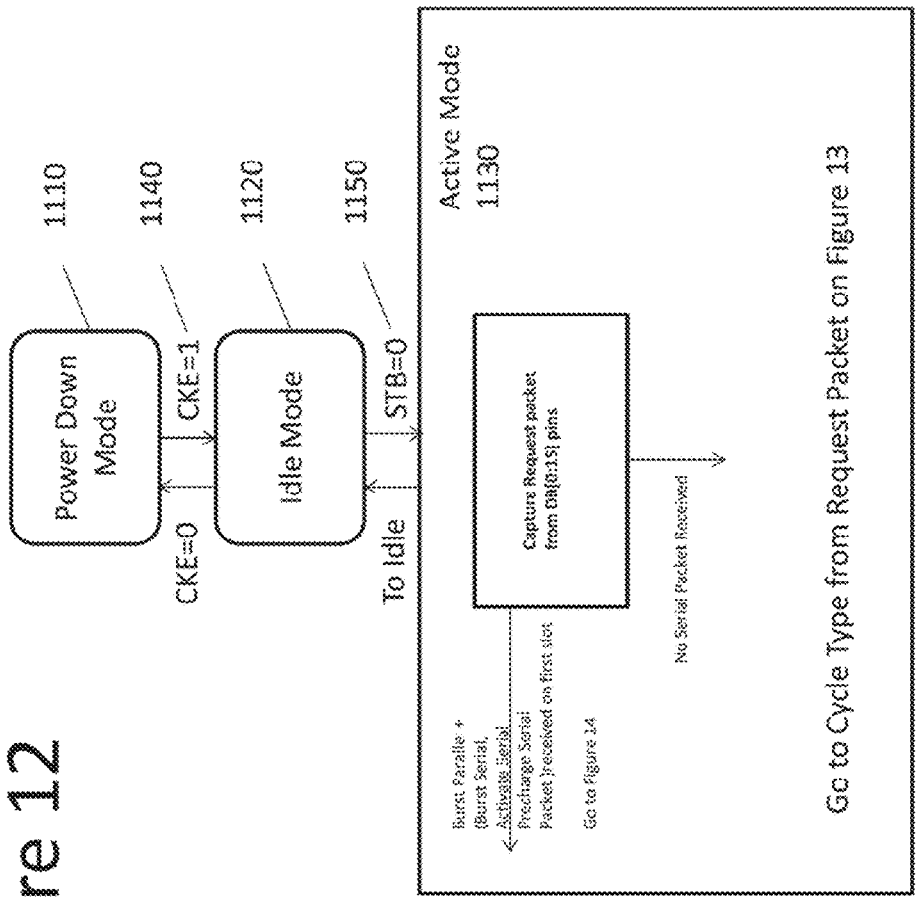
FIG. 12 shows a more detailed view of the high level state transition diagram of FIG. 11.

FIG. 12 shows a high level state transition diagram. The Active Mode 1130 is shown in more detail in FIG. 13 and FIG. 14.

Figure 13:
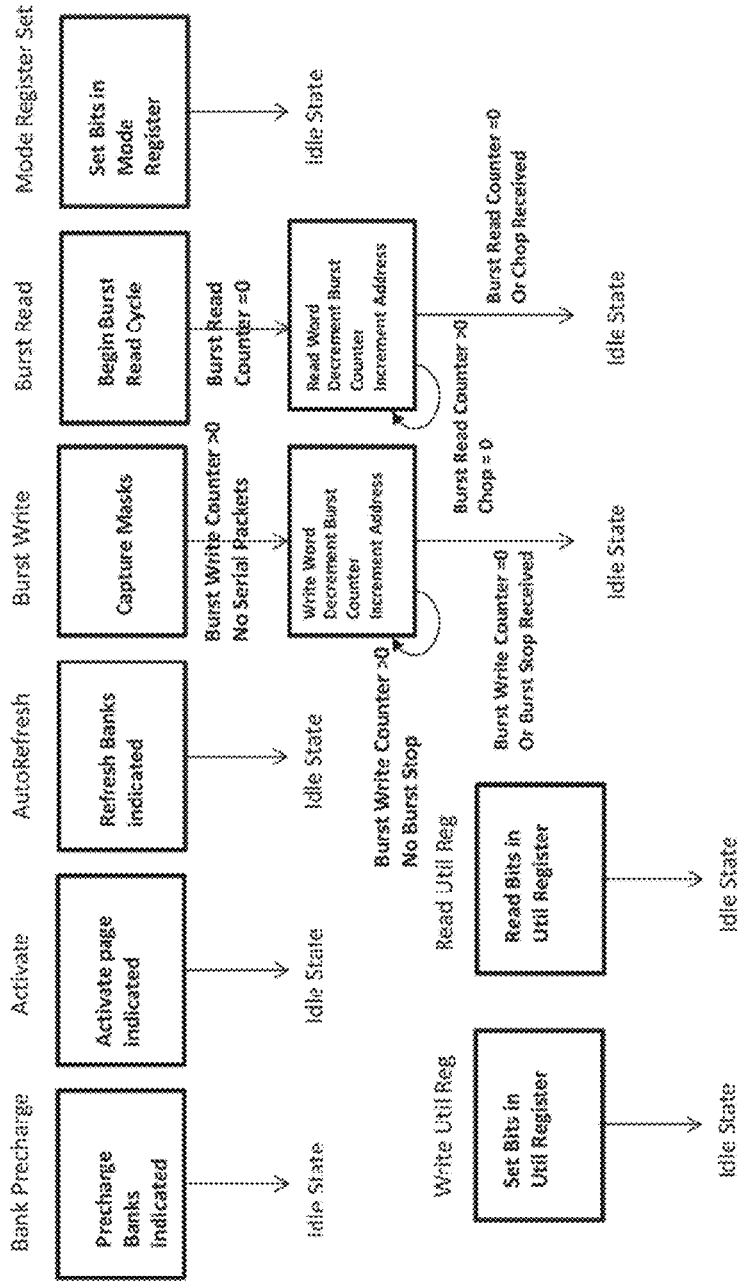
FIG. 13 is a continuation of the more detailed view of the LPC DRAM state transition diagram of FIG. 12.

FIG. 13 is the first of two pages of a detailed state transition diagram of the Active Mode 1130. This shows the operations controlled by parallel commands.

Figure 14:
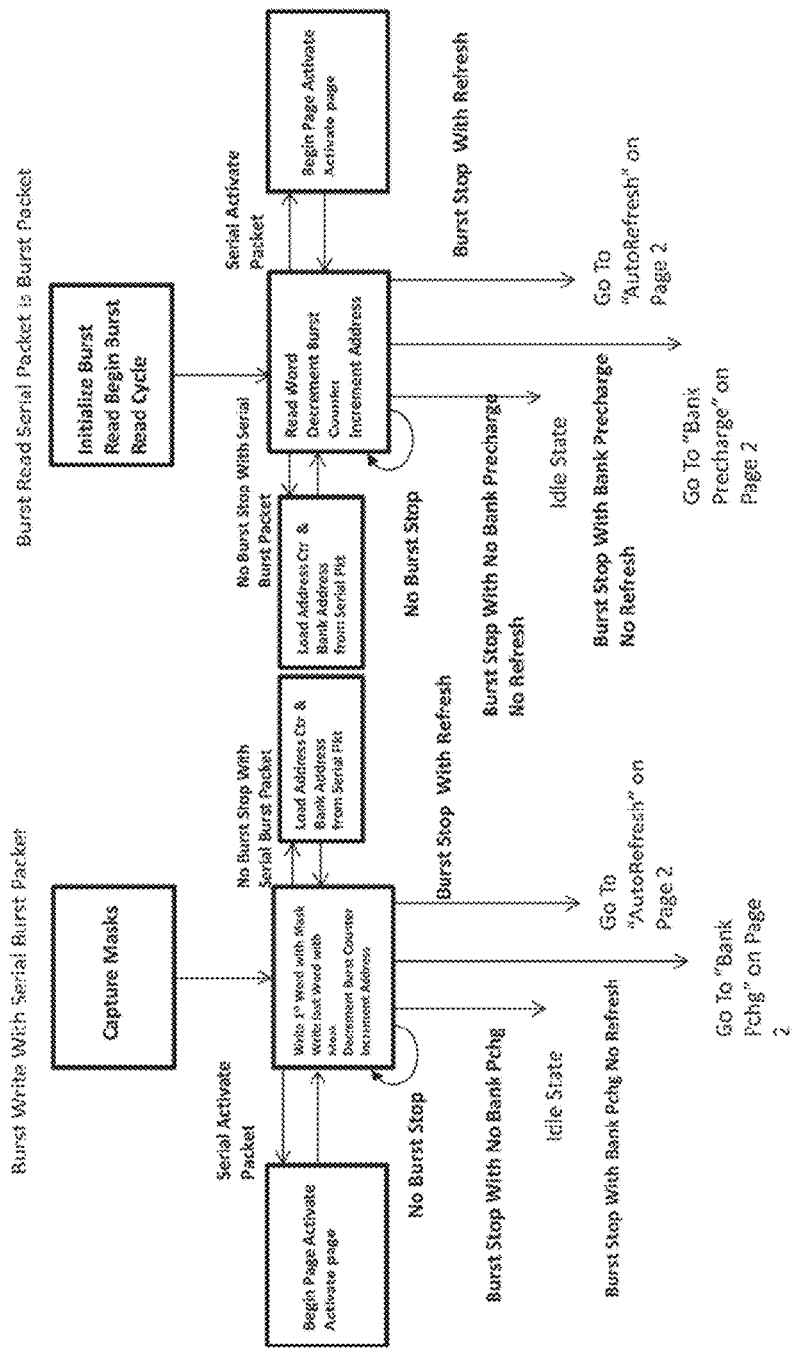
FIG. 14 is a continuation of a more detailed view of the LPC DRAM state transition diagram of FIG. 12.

FIG. 14 is the second of two pages of a detailed state transition diagram of the Active Mode 1130. This shows the burst operation control by serial commands.

Burst Read Cycles

Figure 15:
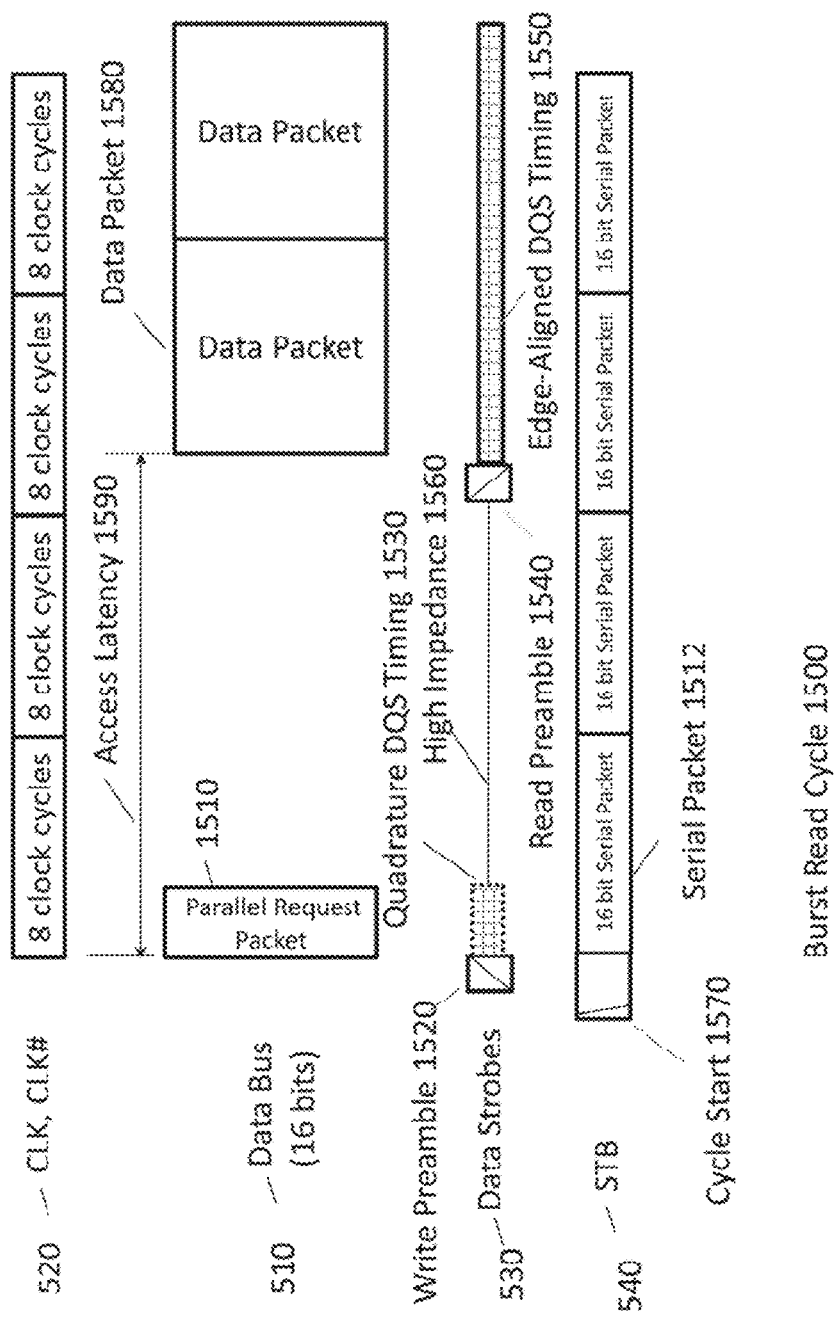
FIG. 15 is a timing diagram showing a Burst Read Operation.

FIG. 15 illustrates a timing diagram showing a Burst Read Cycle 1500. When Idle 1120, Active state 1130 begins when a Cycle Start 1570 preamble is received on the STB signal 540. The Cycle Start 1570 preamble begins on the first rising edge of the clock 520 after the STB signal 540 is driven low. Two clock cycles later, a Parallel Request Packet 1510 is received on the Data Bus 510. Just before the Parallel Request Packet 1510 is received, the Data Strobes 530 are driven with a Write Preamble 1520. During the time the Data Bus 510 contains the Parallel Request Packet 1510, the Data Strobes 530 are driven in a Quadrature DQS timing 1530 relationship to the Clock. Quadrature means the strobe transitions essentially in the middle of the time the Data Bus contains a stable value. Rising edge of CLK means on the rising edge of the CLK 522 signal versus the rising edge of the CLK#524 signal. These two signals comprise a differential pair and are operated as complementary when the device is not operated in the power down state.

At the same time the Parallel Request Packet 1510 is received, the STB signal 540 is sampled for the presence of a Serial Packet 1512. The STB signal is again sampled for the presence of a Serial Packet for each clock cycle afterward for a predetermined number of clock cycles, such as 8 clock cycles. This periodic sampling of the STB signal continues until the DRAM returns to the Idle state and the cycle is said to be Retired.

After the Access Latency 1590, the requested Data Packet 1580 for the Burst Read Cycle begins to appear on the Data Bus 510. One clock cycle before the Data Packet 1580 begins to appear on the Data Bus, the DRAM drives a Read Preamble 1540 on the Data Strobes. During the time the DRAM is driving the Data Packet it also drives the Data Strobes 530 with Edge Aligned DQS timing 1550. Edge Aligned DQS timing means the DQS signals transition in phase with the DB 510 signals. The DRAM then auto-increments the Column address and provides subsequent Words from sequential addresses in a seamless stream on the Data Bus 510.

The Data Strobes and Data Bus are cycled in this way until the Burst Count 1620 is reached at which time the cycle is retired. At that time the DRAM places the Data Bus and the Data Strobes into a high impedance state 1560.

Parallel Request Packet Format for Burst Read and Burst Write Cycles

Figure 16:
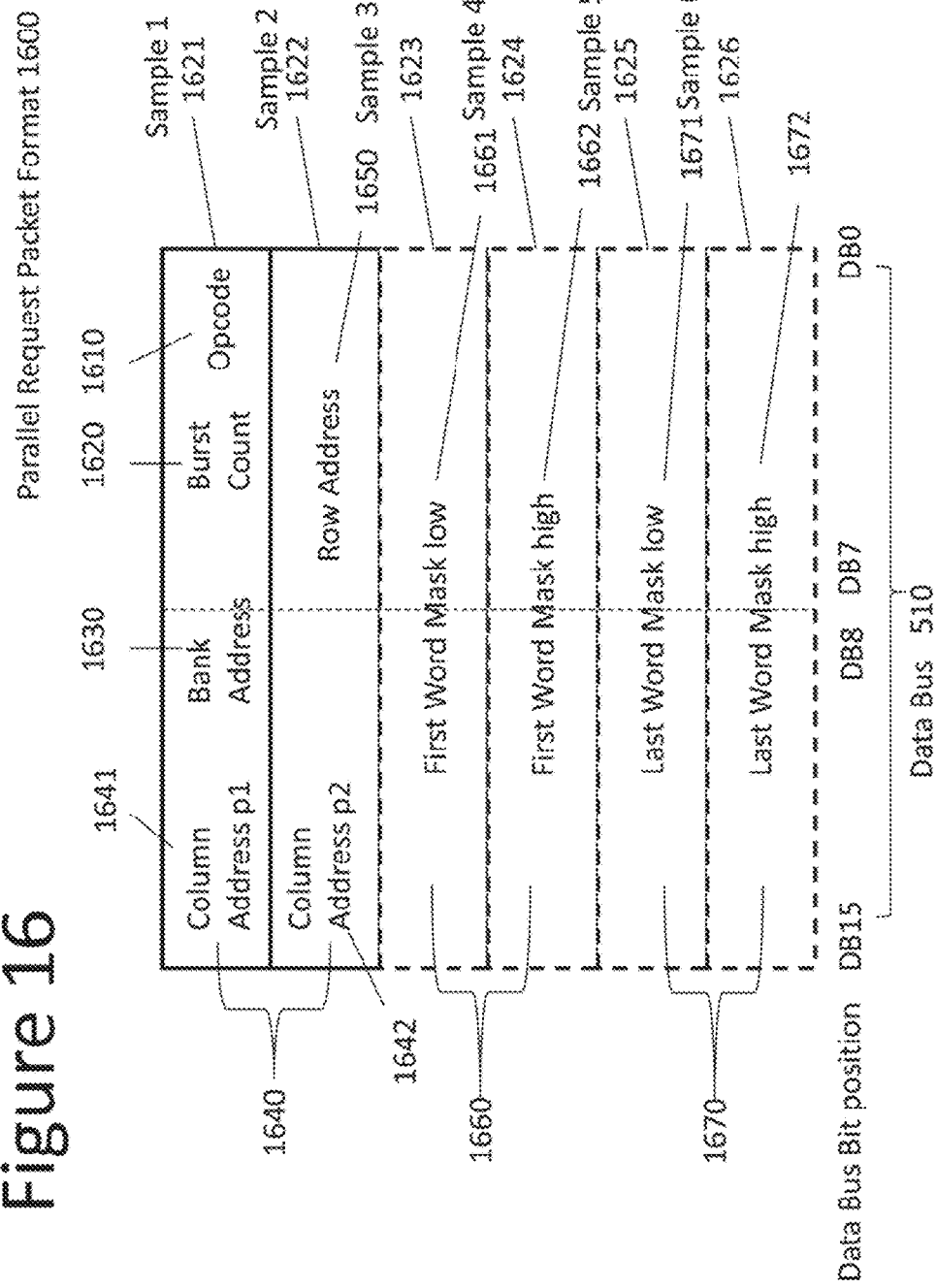
FIG. 16 is a diagram showing a Parallel Request Packet.

FIG. 16 illustrates a Request Packet Format 1600. The Parallel Request Packet 1510 is delivered to the DRAM using the Data Bus 510 signals and with its validity marked by the Data Strobe 530 signals. For Burst Read cycles, the Request packet requires two bus samples to transfer its information. The bus is sampled the first time on the rising edge of CLK 520.

During the First Sample 1621 the Opcode 1610, Burst Count 1620, Bank Address 1630 and a Column Address P1 1641 of the Column Address 1640 are sampled from the Data Bus 510. During the Second Sample 1622 Column Address P2 1642 of the Column Address 1640 and the Row Address 1650 are sampled from the Data Bus 510.

The order of the bit field assignments contained within the Parallel Request Packet may be unimportant. However, some specific organizations may be preferable for implementation reasons. The specific assignment of the locations of the fields as described in this section and in other sections and illustrations should not be considered limiting for purposes of practicing the invention.

Burst Write Cycles

If the cycle is a Burst Read Cycle the two Bus Samples 1621 & 1622 comprise the entire Parallel Request Packet 1510. If the cycle is a Burst Write Cycle the Data Bus 510 is sampled four more times. The specific timeslots used for the four additional samples may be time-separated from the first part of the request packet based on IC implementation considerations, but the Mask is transmitted before the first Data Word to be written to the memory is transmitted.

Bus Sample 3 1623 is used to capture the First Word Write Mask low 1661 field and the Fourth Sample 1624 is used to capture the First Word Write Mask high 1662) The Fifth Sample 1625 provides the Last Word Write Mask low 1671 and the Sixth Sample 1626 provides the Last Word Mask high 1672. As the names imply the First Word Write Mask 1660 applies to the first Word in a Burst Write, while the Last Word Write Mask 1670 applies to the last Word in a multi-Word Burst Write.

Figure 17:
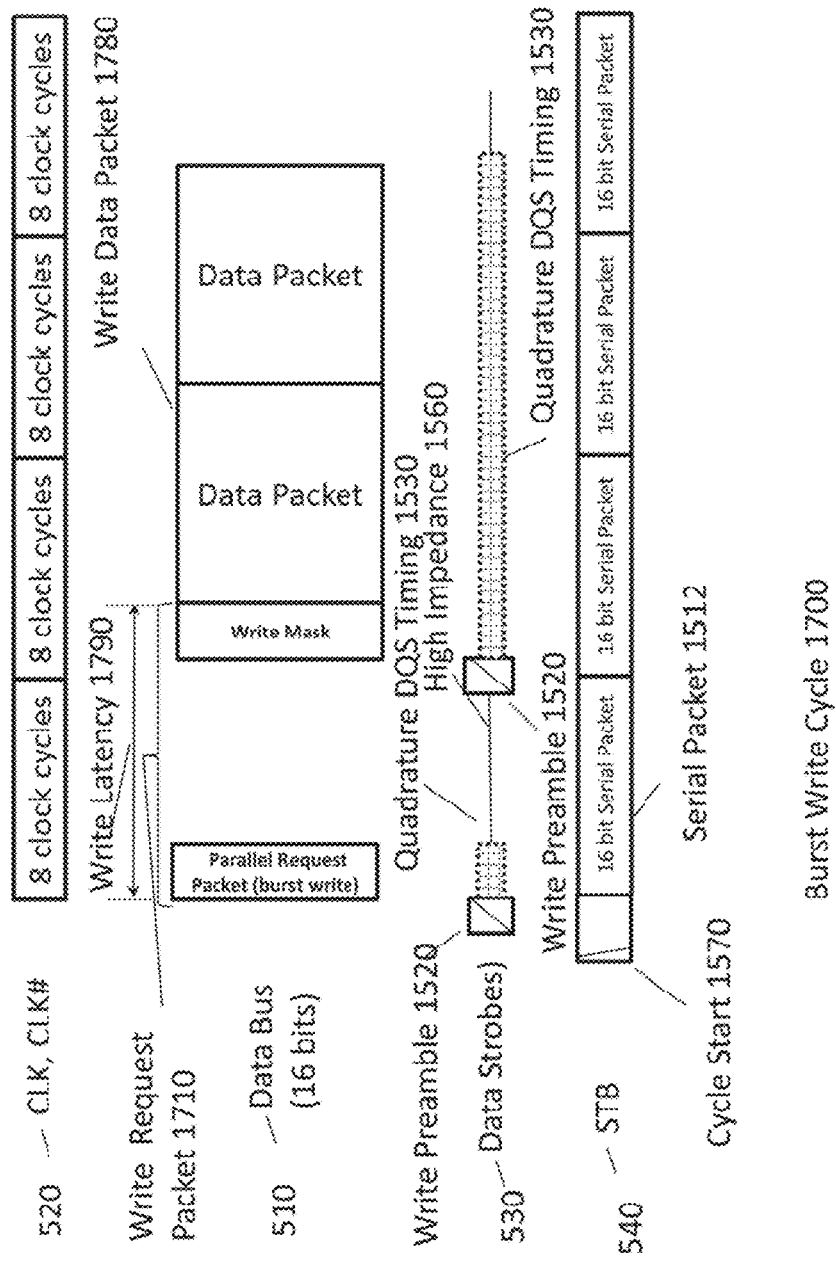
FIG. 17 is a timing diagram showing a Burst Write Operation.

FIG. 17 shows the template of a Burst Write Cycle 1700. Compared to a Burst Read Cycle 1500 there are a few differences in the cycle template. The Parallel Request Packet for a Burst Write 1710 is comprised of six bus samples (1621, 1622, 1623, 1624, 1625, 1626) for a total of 96 bits. The last four bus samples (1623-1626) are used to transfer the First Word Write Mask 1660 and the Last Word Write Mask 1670. The Write Latency 1790 will be less than the Read Latency 1590, i.e. 8 clock cycles less in the preferred embodiment. The Data Strobes 530 are inputs to the DRAM and before the Write Data Packet is received by the DRAM a Write Preamble 1520 is driven onto the Data Strobes 530. Immediately following the Write Preamble 1520 are the Data Strobes cycling with Quadrature DQS Timing 1530 relative to the Data on the Data Bus 530. Quadrature timing means the DQS signal transitions in the middle of the validity window of the DB signals: when the data is stable. Like in the Burst Read case, the Burst Write continues from sequential column addresses until the Burst Count has been reached. At that time the cycle is retired and the DRAM returns to the Idle State 1120 in the example shown.

Misaligned Data Structures

Operationally the Burst Write cycle 1700 differs from the Burst Read Cycle 1500 by including the transfer of Data Masks as a part of the Request Packet to permit intra-Word byte addressing during write cycles. The First Word Mask 1660 is a total of 32 bits with each bit corresponding to a byte position within the Word. Bit 0 applies to the first byte in the 32 byte Word. Bit 1 applies to the second byte in the 32 bit word and so on. If the Data Mask has any bits set to "1", then the corresponding byte will not be written. The First Word Mask 1660 only applies to the first Word in a Burst Write. The Last Word Mask 1670 only applies to the last word in a multi-word Burst Write. No other Words transferred in the multi-word Burst Write are masked.

This method permits support of byte writes within a word. This dual mask write scheme can also be used to support data structures that are not aligned to 32 byte boundaries ("misaligned data").

Figure 18:
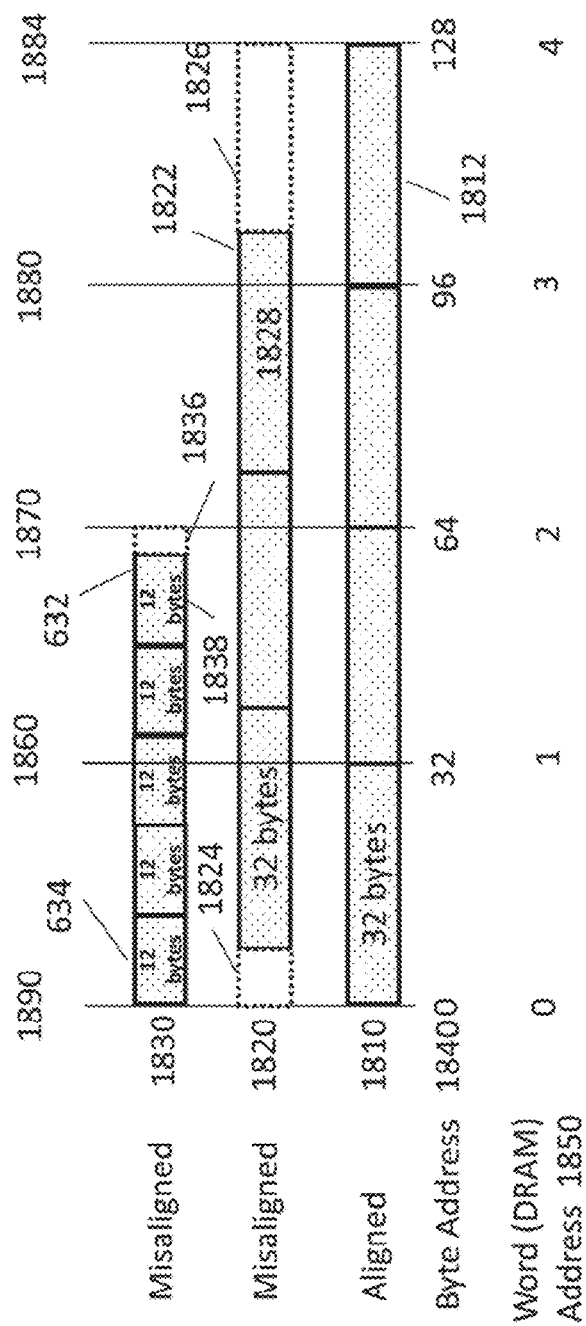
FIG. 18 is a diagram showing aligned and unaligned data structures.

For misaligned data write cycles Write Masking provides a way to avoid using read-modify-write cycles to prevent writing bytes that are to be unmodified when writing the data in a specific word. In FIG. 18 is shown Aligned 1810 and two different misaligned cases 1820 and 1830. In the Aligned structure case 1810 there are four 32 byte words comprising the data structure 1812. These will be transferred in four written words. No byte masking is used when writing this data to the DRAM.

For the misaligned data shown in 1820, the data structure is composed of three 32 Byte Words 1822 that are not aligned on 32 byte boundaries but are instead are offset from a 32 byte boundary by 8 bytes. The DRAM will require a burst of four written words to write the three misaligned Words contained within in the data structure. The first word transferred in the burst will have the lower 8 bytes 1824 masked and the lower 24 bytes of the first 32 bit data word will be written. The second and third words transferred in the burst will have all bytes written in each word transferred but bytes will be apportioned between two adjacent 32 byte words in the misaligned structure offset in accordance with the misalignment. The final word transferred in the burst will write the upper 8 bytes of the last 32 byte word 1828 of the misaligned data structure 1822 by transferring those eight bytes and masking the upper 24 bytes 1826 in the transferred data word.

In the second misaligned case 1830 the data structure 1832 is comprised of five 12 byte quantities for a total of 60 bytes for the data structure 1832 to be written to the DRAM. While the first 12 byte quantity 1834 is aligned to a 32 byte boundary 1290 the overall length of the data structure 1832 is not an integer multiple of 32 bytes so the final word transferred in the burst has the high eight bytes 1836 masked. It will take a burst of two transferred words to write the data structure to the DRAM.

There are other operations that can be initiated by using a Parallel Request Packet. Some examples include page precharge, row activation, mode register write operations. Additional operations include refresh, and utility register read/write operations.

Page Activations

Before the DRAM can be used to write or read data, the target row and bank are activated. A Parallel Request Packet can be used to activate a specified row address in a specified bank. In alternate terminology, a particular row and bank address can be referred to as a "page" and those terms will be used interchangeably in this document.

FIG. 17 illustrates a subset of the Parallel Request Packet 1510 format used for an activate command. There is no Burst Count 1620 or Column Address 1640 used when a page is activated so those fields are undefined in the activate command. The fields that are retained are the Opcode 1610, Bank Address 1630 and Row Address 1650. There are two samplings 1621, 1622 of the Data Bus 510 required for the DRAM to receive the Parallel Request Packet 1510.

It generally requires more time to activate a page than it does to read a column from a random address so there may be more than one 8 clock cycle period required to complete the Page Activation command. The specific time required is a timing specification that is specific to a particular DRAM design.

Figure 20:
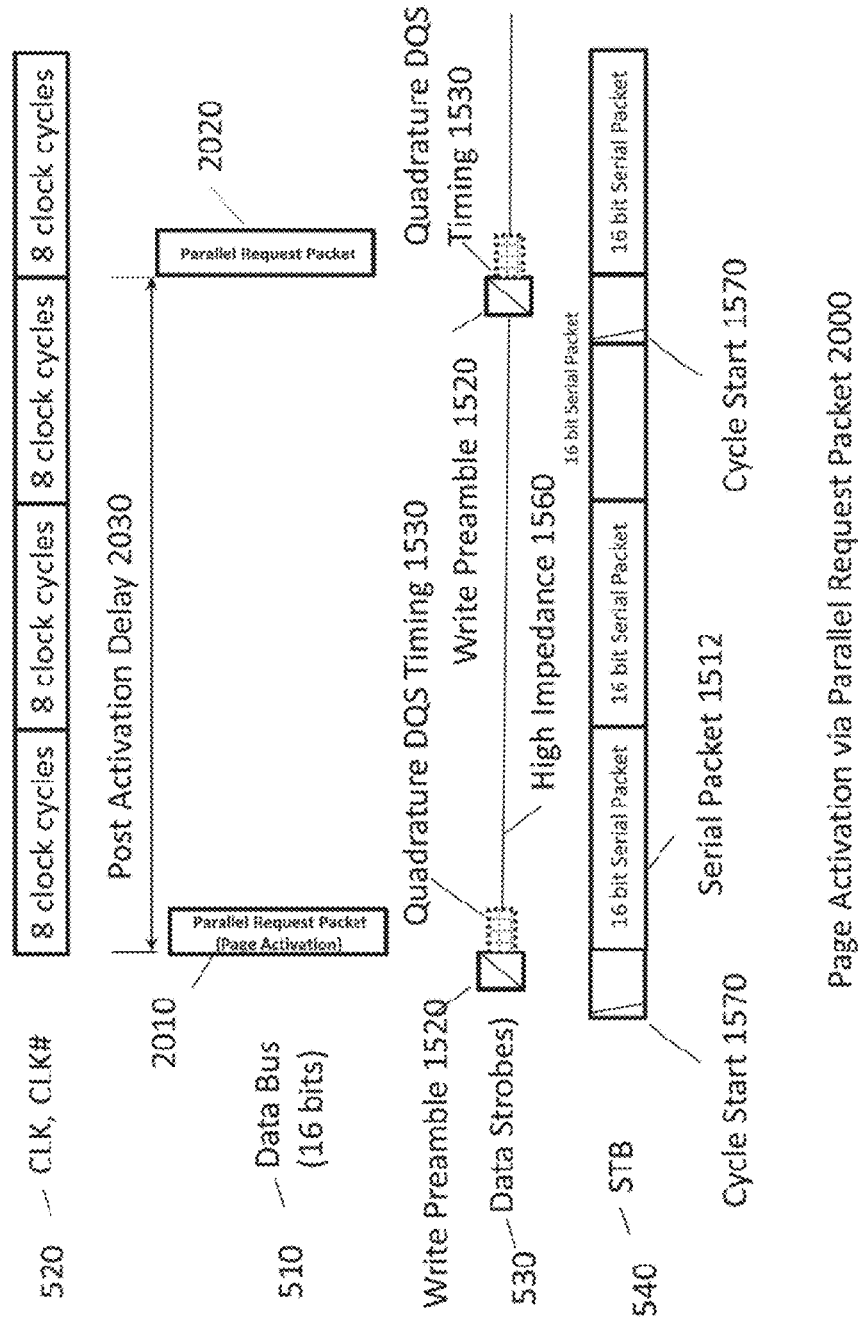
FIG. 20 is a timing diagram showing an activation cycle followed by a Parallel Request Packet.

Because of the finite time required to perform a Page Activation, any subsequent command sent via a Parallel Request Packet 2020 may be deferred for a minimum time 2030 which is another design-specific specification. This Post Activation Delay 2030 is shown in the Timing Diagram in FIG. 20. Also shown is the Parallel Request Packet 2010 that initiates the first Page Activation, A second Parallel Request Packet 2020 can be supplied to the DRAM after this minimum delay 2030.

Bank Precharge

Figure 21:
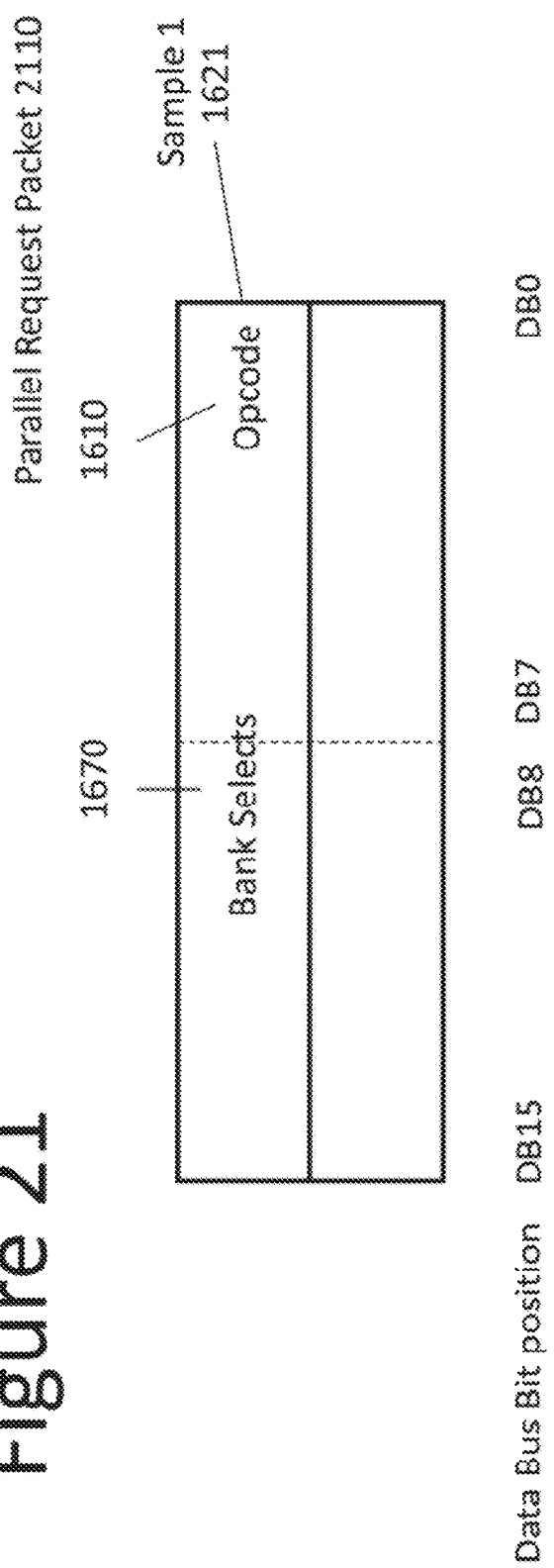
FIG. 21 is a parallel request packet format for Bank Precharge cycles.

Before a Page can be activated the target Bank is Precharged. This can be done via a Parallel Request Packet 2110 shown in FIG. 21. The required fields are an Opcode 2110 and information as to which Banks to precharge. To improve operating efficiency it is often advantageous to precharge more than one bank at a time. To support multiple bank precharging the Parallel Request Packet 2110 has a collection of bits 2170 that correspond to each Bank in the DRAM. These bits are called Bank Select Bits 2170. For each bit set to a value of logical "True", the corresponding Bank will be Precharged during the Bank Precharge Cycle.

Figure 22:
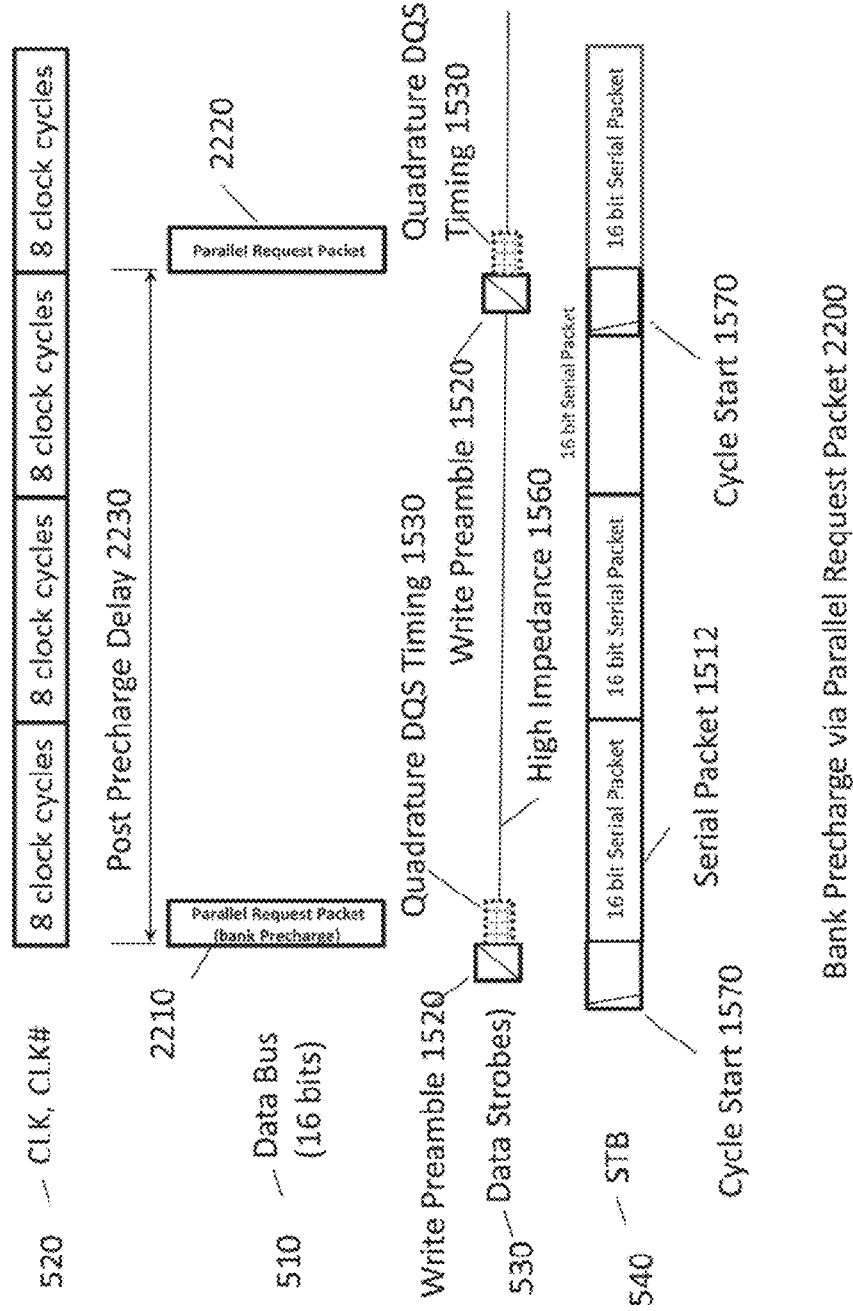
FIG. 22 is a timing diagram showing Bank Precharge followed by a Parallel Request Packet.

FIG. 22 shows a timing diagram of a Bank Precharge operation 2200 initiated by use of a Parallel Request Packet 2210. To allow the bank precharge operation to complete, a minimum delay called Post Precharge Delay 2230 is allowed to expire before any subsequent Parallel Request Packet 2220 is supplied to the DRAM. The Post Precharge Delay 2230 is a design-dependent parameter.

Mode Register Set and IO Impedances

Figure 23:
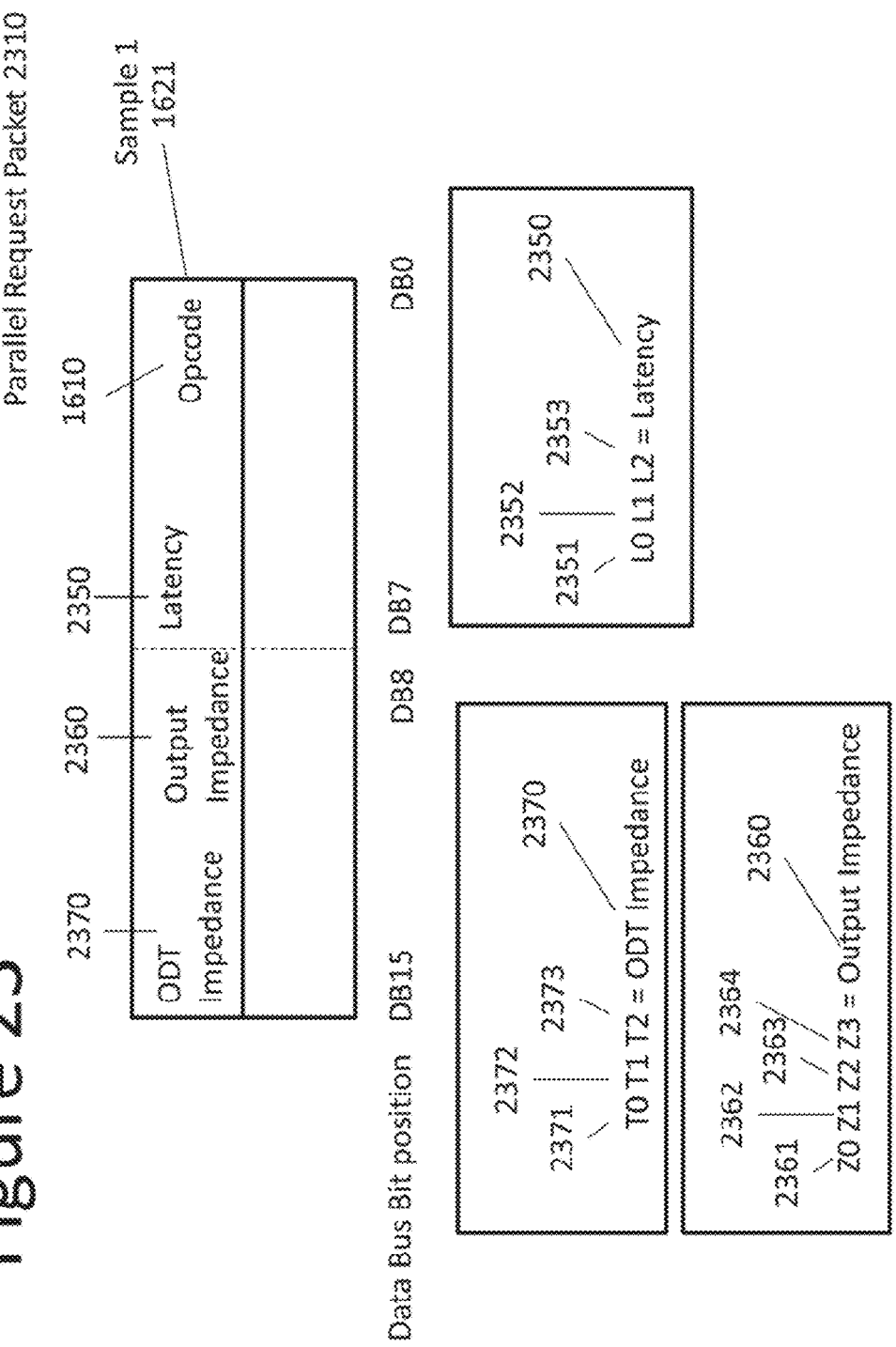
FIG. 23 is a diagram showing the fields contained within a Mode Register Set Parallel Request Packet.

The DRAM contains a Mode Register that is used to store a number of operational parameters used by the DRAM. The Mode Register is written using a Parallel Request Packet 2310 shown in FIG. 23. Contained within the Parallel Request Packet is an Opcode field 1610, an ODT Impedance 2370 field, an Output Impedance 2360 field and a Latency Field 2350. The specific bit assignment order is unimportant and can be optimized to benefit IC implementation.

Figure 24:
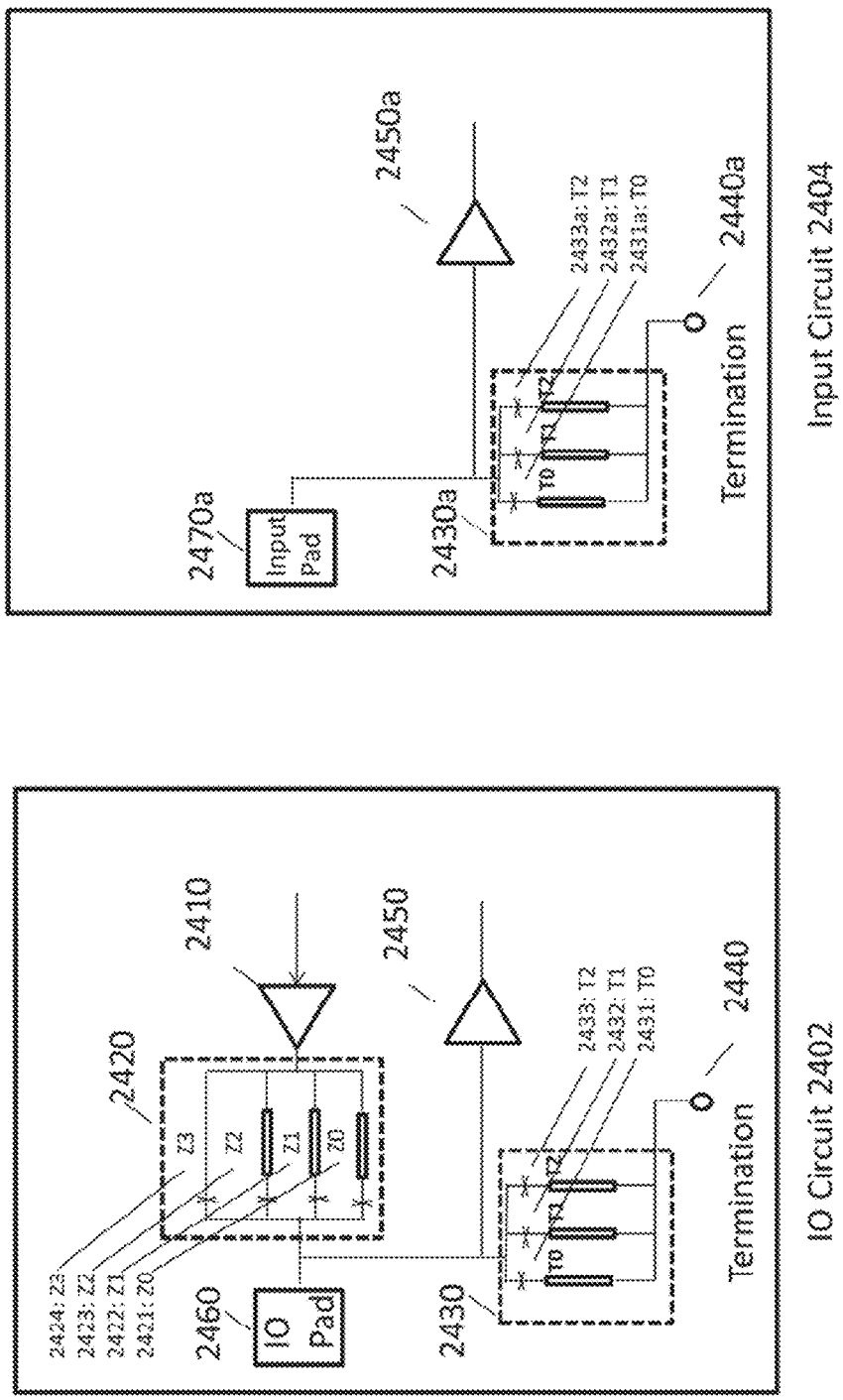
FIG. 24 shows schematic representations of the IO Circuit and the Input Circuit used on the LPC DRAM.

FIG. 24 shows a simplified schematic representation of the adjustable impedances associated with an IO Circuit 2402 and an Input Circuit 2404. For the Input Circuit 2404 there are three terminations with impedances T0 2431, T1 2432 and T2 2433 that are able to be combined in parallel in order to set the on-die-termination (ODT) impedance to any one of 8 values controlled by ODT Impedance 2370 bits (2371, 2372, 2373) set inside the Mode Register. When Mode Register bit T0 2371) is set to a logical "True" state, the T0 Resistor 2431 is switched ON when the On Die Termination function is active. In a similar manner to the way the T0 Resistor is selected, bits T1 2372 and T2 2373 in the Mode Register select resistors T1 2432 and T2 2433. If these three bits are all set to a logical "False" state then the On Die Termination function is disabled. The effective impedance of the enabled On Die Termination is the parallel combination of the enabled resistors. The specific value of the resistors chosen to include on the DRAM is made to allow a range of useful impedances to be supported under programmable control. It is possible to change the impedance values any time a Mode Register Set command can be issued to the DRAM. This can be used to support dynamic impedance adjustment to optimize signal integrity.

The DRAM has support for use in a point to point signaling environment. In some cases it is advantageous to use series termination when using point to point signaling links to avoid consuming power by the use of parallel DC type termination. There are four bits in the Mode register corresponding to specific Parallel Request Packet bits (2361, 2362, 2363, 2364) that control the Output Impedance (2360). In a similar manner to the mode register control of the On Die Termination impedance by selecting on-chip resistors to combine in parallel, the Output Impedance of an IO Circuit 2402 can be controlled by writable bits in the Mode Register's Output Impedance 2360 field. Bit Z0 2361 selects resistor Z0 (2421), Bit Z1 2362 selects resistor Z1 2422, Bit Z2 2363 selects resistor Z2 2423 and bit Z3 2364 selects resistor Z3 2424. Resistor Z3 is a short circuit, designed to eliminate series termination. If Z3 is set, then the other bits are ignored. At least a one of bits Z0-Z3 is selected.

Other elements of the IO circuit 2402 are an Output Driver 2410 and an Input Receiver 2450. The Input Circuit 2404 includes an Input Receiver 2450a and the On Die Termination resistors, but no Output Driver 2410 or Output Impedance Circuitry 2420.

The DRAM can be used in a point to point signaling or a multi-drop signaling environment. The DRAM IO Circuit 2402 is shown in FIG. 24. Also shown is an Input Circuit 2402 in the same figure. The IO circuit has programmable output impedance structure 2420 and has a programmable on-die parallel termination, ODT 1230. The ODT circuit is enabled only when the signal flows to the IO circuit in Receive mode. The Impedance of the ODT circuit is set by which of the three termination resistors 2431, 2432 and 2433 are selected via the Mode Register. If none are selected, then the ODT function isn't activated.

A similar circuit is used as the Input Circuit 2404. The Input Circuit is similar to the IO Circuit with the output structure removed. The ODT structures remain and operate in the same way as for the IO Circuit.

The IO Circuit is used for the Data Bus and Data Strobes, while the Input Circuit 2404 is used for the CKE, Clocks, and STB signals.

Figure 25:
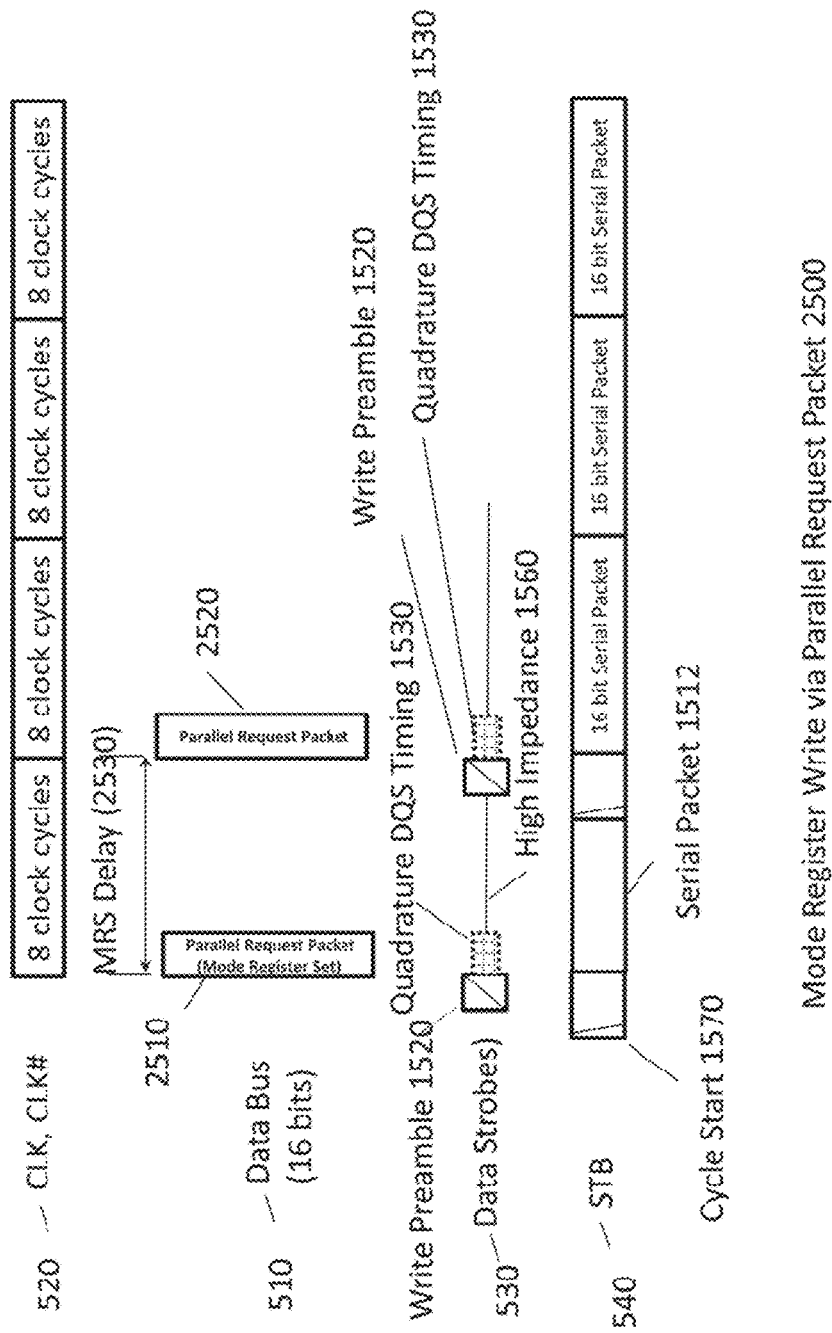
FIG. 25 shows a timing diagram of a Mode Register Set operation followed by a Parallel Request Packet.

FIG. 25 shows a timing diagram of a Mode Register Write 2500. The cycle is initiated by a Parallel Request Packet 2510. The cycle is retired after 8 clock cycles. Another Parallel Request Packet 2520 may be sent after MRS Delay 2530.

Utility Register

Figure 26:
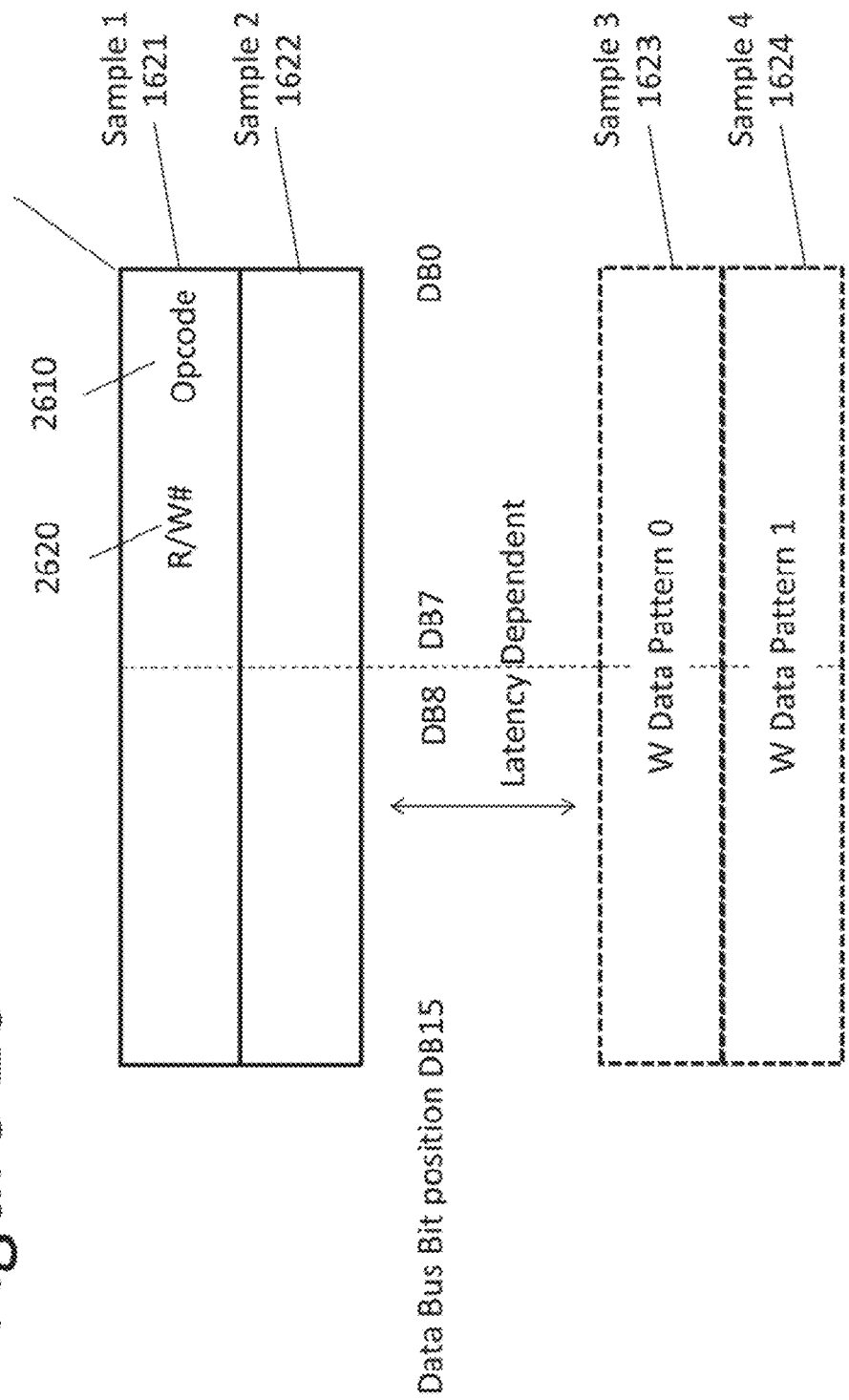
FIG. 26 shows a Parallel Request Packet for a Utility Register Operation.
Figure 27:
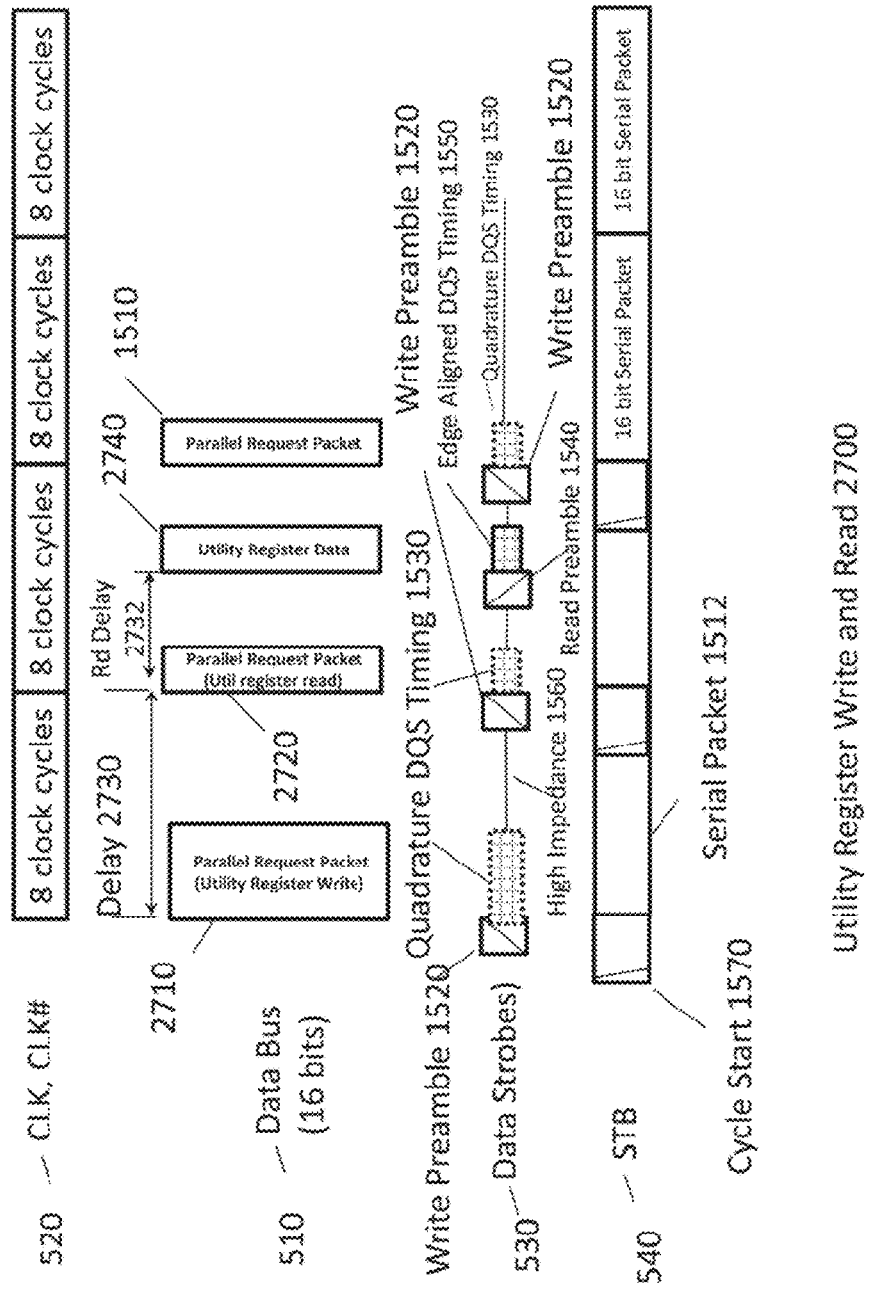
FIG. 27 shows a timing diagram showing a Utility Register Write followed by a Utility Register Read followed by a Parallel Request Packet.

FIG. 26 shows the Parallel Request Packet for a Utility Register Operation 2710. It contains an Opcode 2610 field and a read/write (R/W#) bit 2620 captured in the first bus sample 1621. If the operation is a Write, then the data to be stored in the Utility Register is supplied during bus sample 3 1623 and bus sample 4 1624. If the operation is a Utility Register Read operation then the data returned from the Utility Register is sampled from the Data Bus 510 after a Read Delay 2732 as shown in FIG. 27.

Back to Back Cycles

Figure 28:
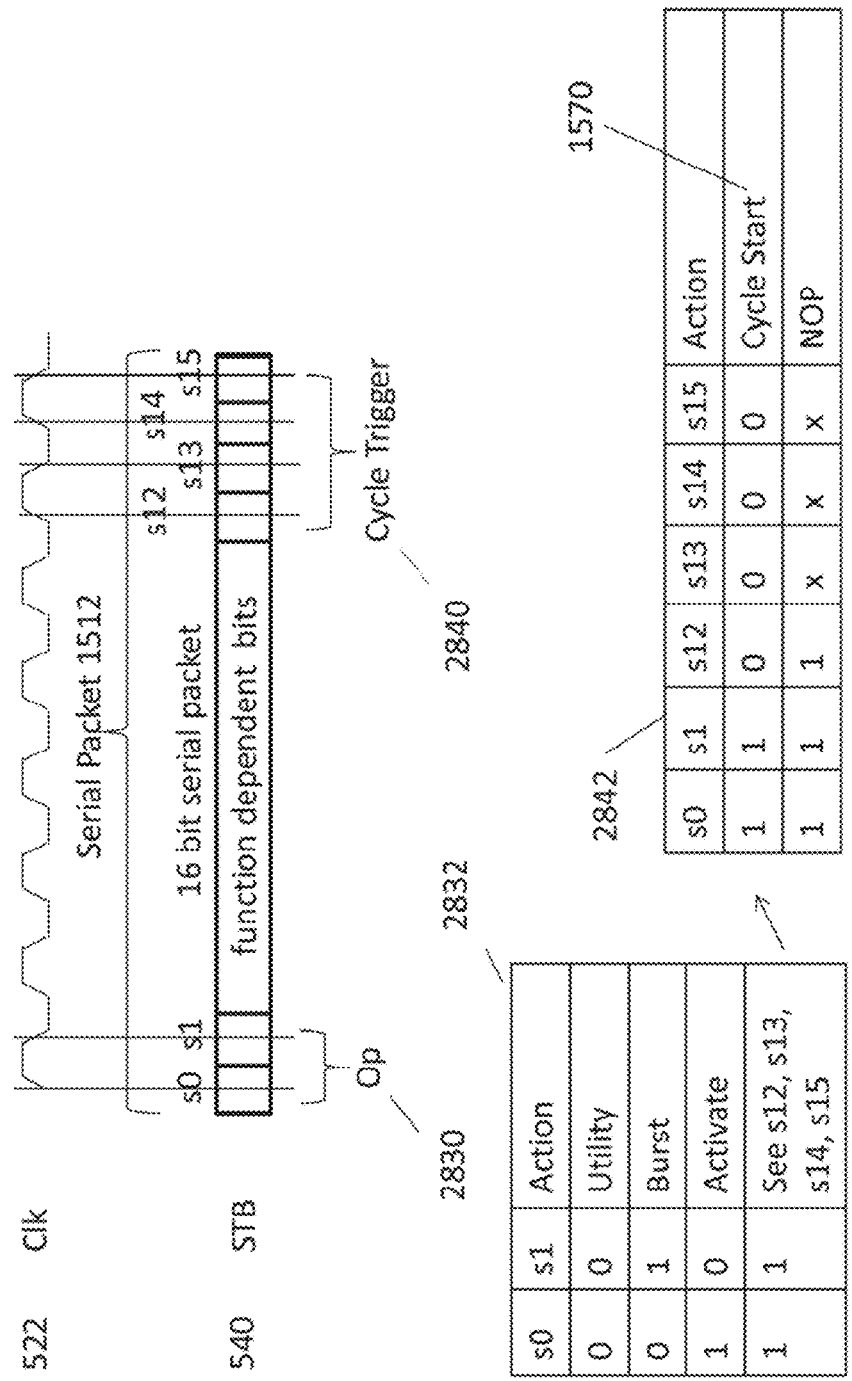
FIG. 28 shows the format of a Serial Packet with some of the bit field state assignments.

FIG. 28 shows some of the bits in a Serial Packet 1512 that are sampled in the cycles just described in the text above. The Serial Packet 1512 contains a total of 16 bits and is delivered serially on the STB signal using eight consecutive Clock cycles 520 by sampling on the rising and falling edge of Clk 522. The bits received using this method are numbered s0 through s15 with s0 being the first bit received and with s15 being the last as shown in FIG. 28. The s0 and s1 bits are the Operation Code ("Op Code") 2830 and define the serial packet function.

When the serial packet is sampled during the end of an Active Cycle if the s0 and s1 bits are both equal to "1" then the serial packet is called a NOP Serial Packet. The NOP Serial Packet's last four bits, s12, s13, s14 and s15 are called Cycle Trigger bits 2840 and are sampled to see if a Cycle Start 1570 is requested. The remaining bits in the packet are ignored. If the Cycle Trigger bits indicate a Cycle Start 1570 then a new Parallel Request Packet will begin being sampled on the first rising edge of the Clk 522 after the s15 bit is transferred. During the s14 and s15 timeslots, the Data Strobes 530 supply a Write Preamble 1520 in this clock cycle preceding the following Parallel Request Packet.

If there's no Cycle Start indicated at the end of the last NOP Serial Packet and there are no specified delay times between Parallel Request Packets required such as a Post Activation Delay 2030 or a Post Precharge Delay 2230 then the cycle is Retired and the DRAM device returns to the Idle State 1120.

Cycle Start from Idle State

Once in the Idle State 1120 the DRAM samples the STB pin on each rising edge of CLK 522 to see if a Cycle Start is requested. Once logic "0" state is observed on the STB signal on a rising Clk 522 edge while the DRAM is in the IDLE state a Cycle Start 1570 is indicated and the STB signal remains low for the next 1.5 clock cycles (falling, rising, falling edges). On the rising edge of the CLK 522 following the Cycle Start 1570 beginning, the Write Preamble is presented on the Data Strobes 530 followed by the first part of the Parallel Request Packet on the next Clk 522 rising edge.

AutoRefresh Via Parallel Request Packet

Figure 29:
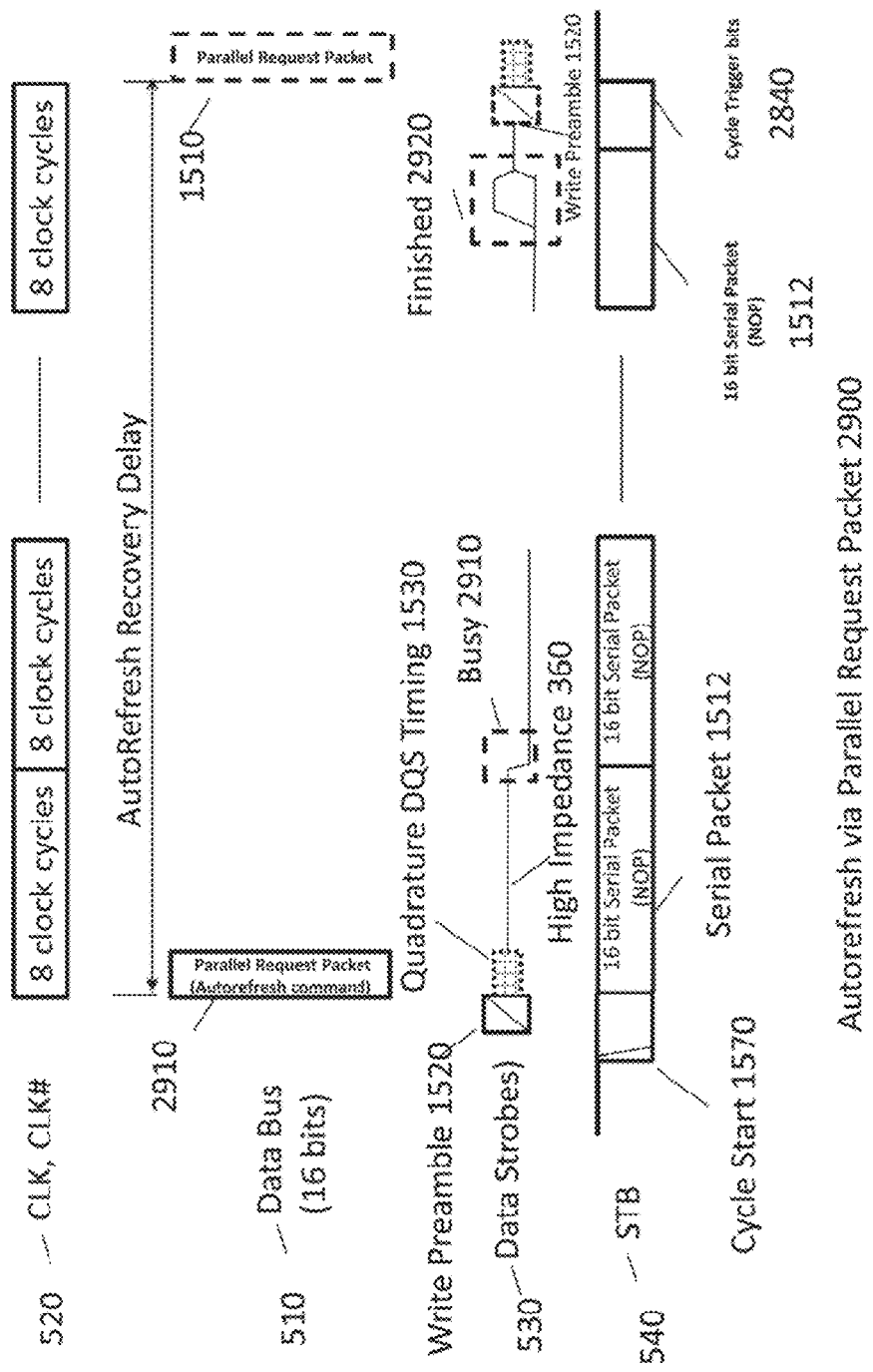
FIG. 29 shows a timing diagram showing an AutoRefresh operation.

A Parallel Request Packet 2910 can initiate Autorefresh as shown in FIG. 29. The Parallel Request Packet format is the same as the Precharge Bank format shown in FIG. 21. The Opcode 1610 differentiates the Precharge versus Autorefresh operation.

The Bank select bits 1670 indicate which banks are to be refreshed. For example, for the Precharge operation each bank has a corresponding Bank Select bit. Bank Select bits that are set to logical "1" will be autorefreshed. Only one bank is refreshed at a time. Selected banks are refreshed in sequential order starting with the lowest-numbered bank.

The Autorefresh operation will refresh each row in the selected banks. As a consequence the DRAM will take thousands of cycles to completely refresh with the actual number dependent on array design. The DRAM indicates it is Busy 2910 when refreshing by driving both Data Strobes 530 low 8 clocks after the Parallel Request Packet is first presented to the DRAM. Both Data Strobes 530 remain low until the last row is refreshed. At that time the DRAM drives the non-inverted Data Strobe 536 high while leaving the complement Data Strobe 538 low. The strobes are held in this state for one full clock cycle and then are placed into the high impedance state at which time the DRAM Retires 1152 the Autorefresh cycle and returns to the Idle 1120 state provided no Cycle Start 1570 was indicated on the STB pins via the Serial Protocol. If a Cycle Start was indicated by the Cycle Trigger 2840 bits then a new DQS Write Preamble 1520 with Parallel Request Packet 1510 will be provided as in the other cases.

Serial Packets

At the beginning of an Active Cycle 1130 a serial protocol is initiated that defines a way the STB 540 signal is sampled in order to receive Serial Packets 1512. Serial Packets 1512 can be used to provide commands and address information to the DRAM during Active cycles. The serial protocol defines a 16 bit Serial Packet 1512. The STB signal is sampled at the beginning of the Active Cycle 1130 and is sampled every Clock 520 edge over a period of 8 clock cycles to receive a complete 16 bit Serial Packet 1512. After 8 Clock 520 cycles the Serial Packet 1512 has been fully transferred and a new one begins to be sampled in the same way. The process repeats every eight clock cycles until the cycle is Retired 1152 and the DRAM returns to the Idle State 1120.

Figure 30:
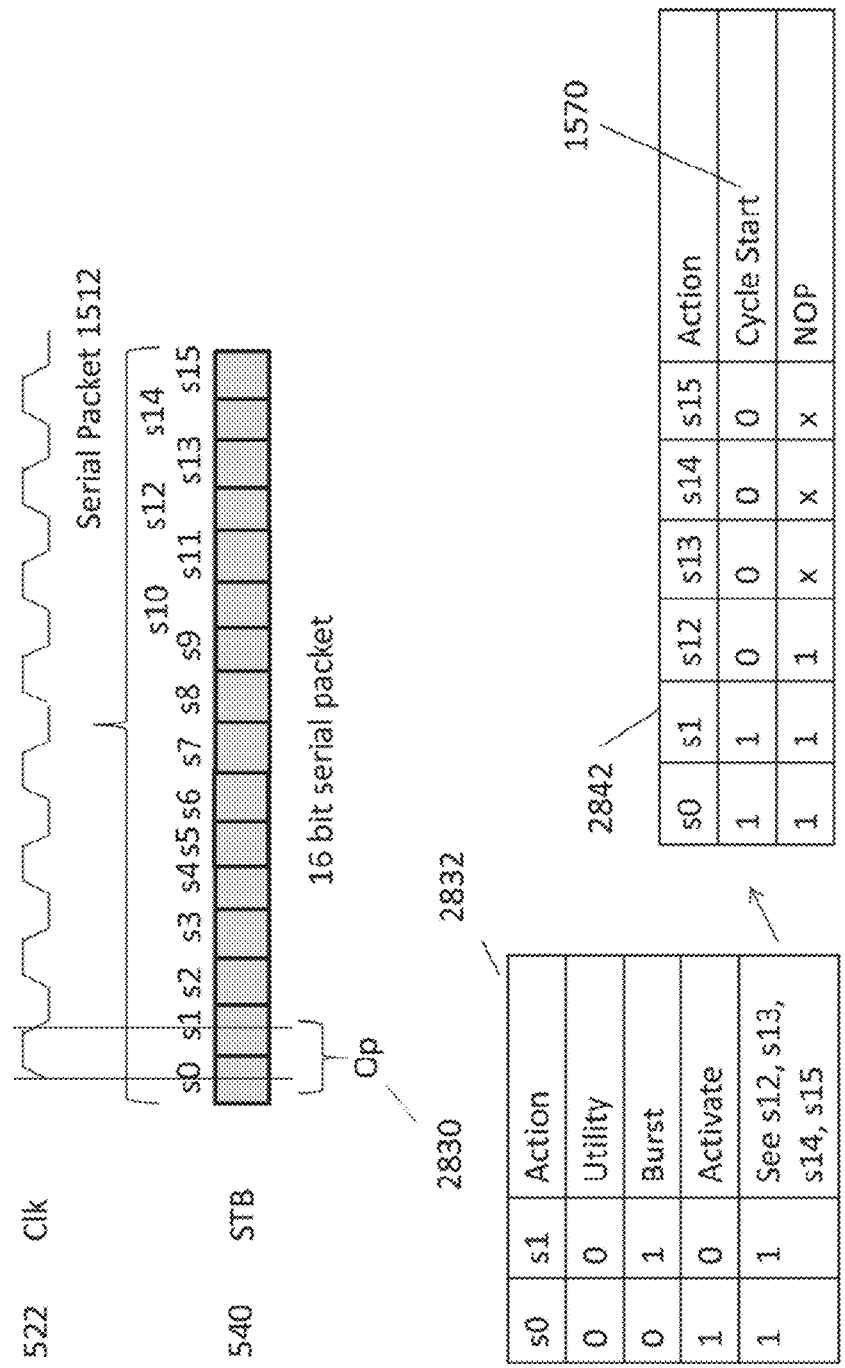
FIG. 30 shows a diagram showing a generic Serial Packet format.

The Serial Packet (312) format is shown in FIG. 30. For clarity the 16 bit positions are assigned a designator ranging from s0 to s15. S0 is the first bit received in the Serial Packet 1512. Bits s0 and s1 define four OP codes 2830 mapped according to Table 2832.

Figure 19:
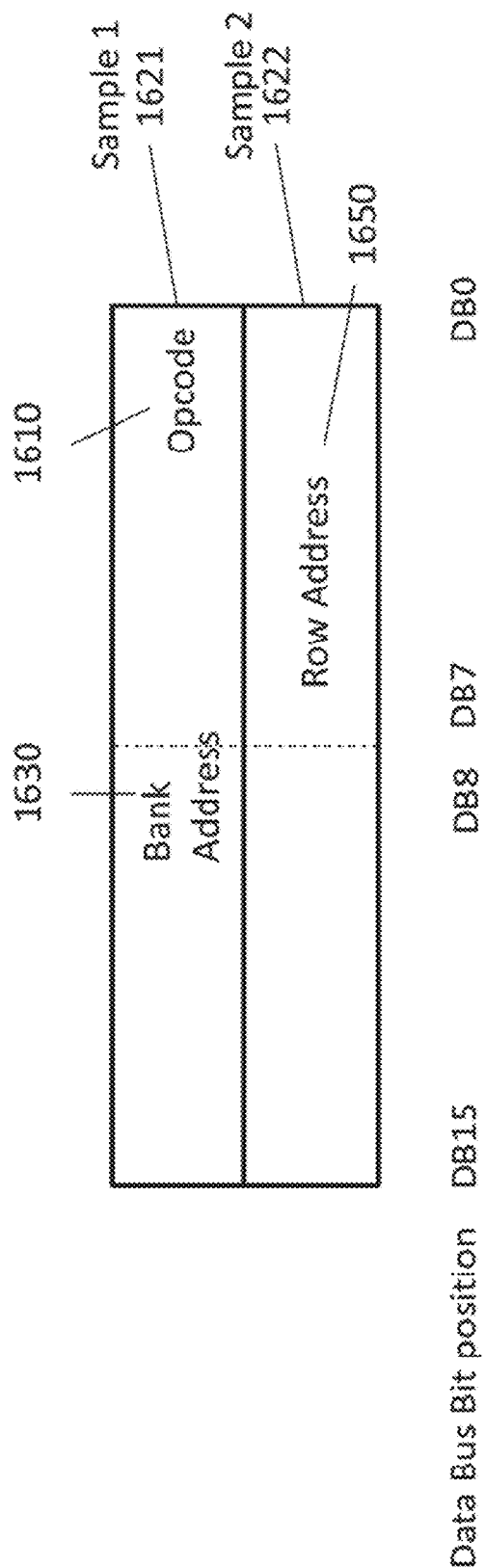
FIG. 19 is a diagram showing a Parallel Request Packet format.
Figure 31:
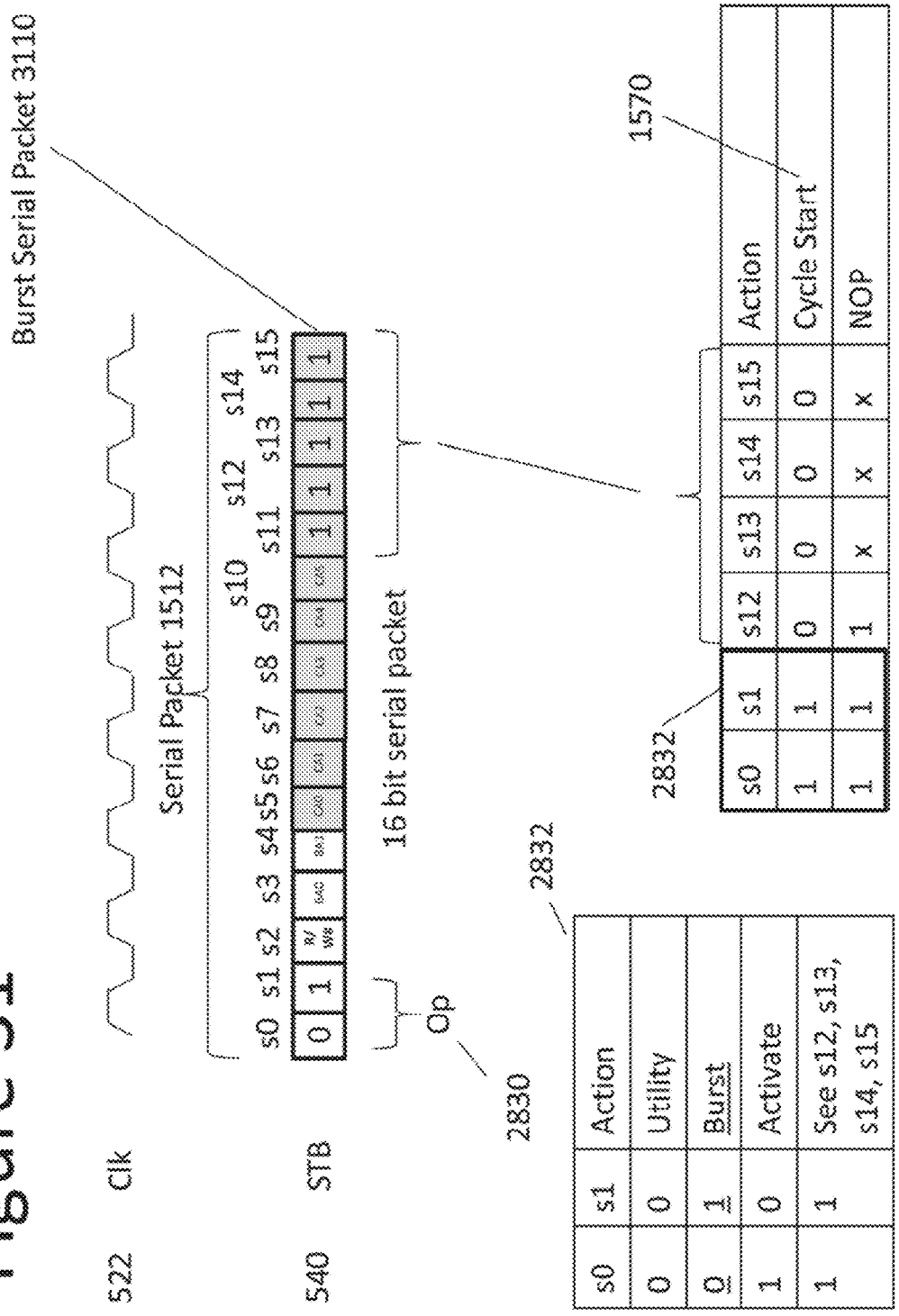
FIG. 31 shows a diagram showing a Burst Serial Packet format.

FIG. 31 shows the bit assignments for a Burst Serial Packet 3110. The first two bits are s0=0 and s1=1 as shown in FIG. 19. Bit s2 is used to indicate if the Burst is to be a Burst Read or a Burst Write. If s2=1 it is a Burst Read Cycle and if s2=0 it is a Burst Write Cycle. Bits s3 and s4 are assigned to Bank Addresses using a binary encoding such that BA0=s3 and BA1=s4. Bits s5, s6, s7, s8, s9 and s10 are assigned to CA0-CA5. CA0 corresponds to s5, CA1 corresponds to s6 and so on. All remaining bits in the Burst Serial Packet are set to logical "1". Again the specific bit assignment is unimportant as to practicing the invention, other specific formats may be employed.

The Burst Serial Packet provides Bank and Column addresses to the DRAM while it is active and transferring data using the Data Bus 510. For example while the DRAM is performing a Burst Read operation and transferring data on the Data Bus 510, a new Bank and Column Address can be received by the DRAM to be used as the next Bank/

Column Address in the Burst. In this way seamless Data Bus occupancy can be sustained for arbitrarily long bursts. The Burst Serial Packet 3110 can access any column in any open bank in the DRAM and each Burst Serial Packet can access as small of a datum as a single Word. Each Word transferred in a Serial Burst can come from a different Bank and or Column address in an activated page and the Data Bus remains 100% occupied.

Figure 32:
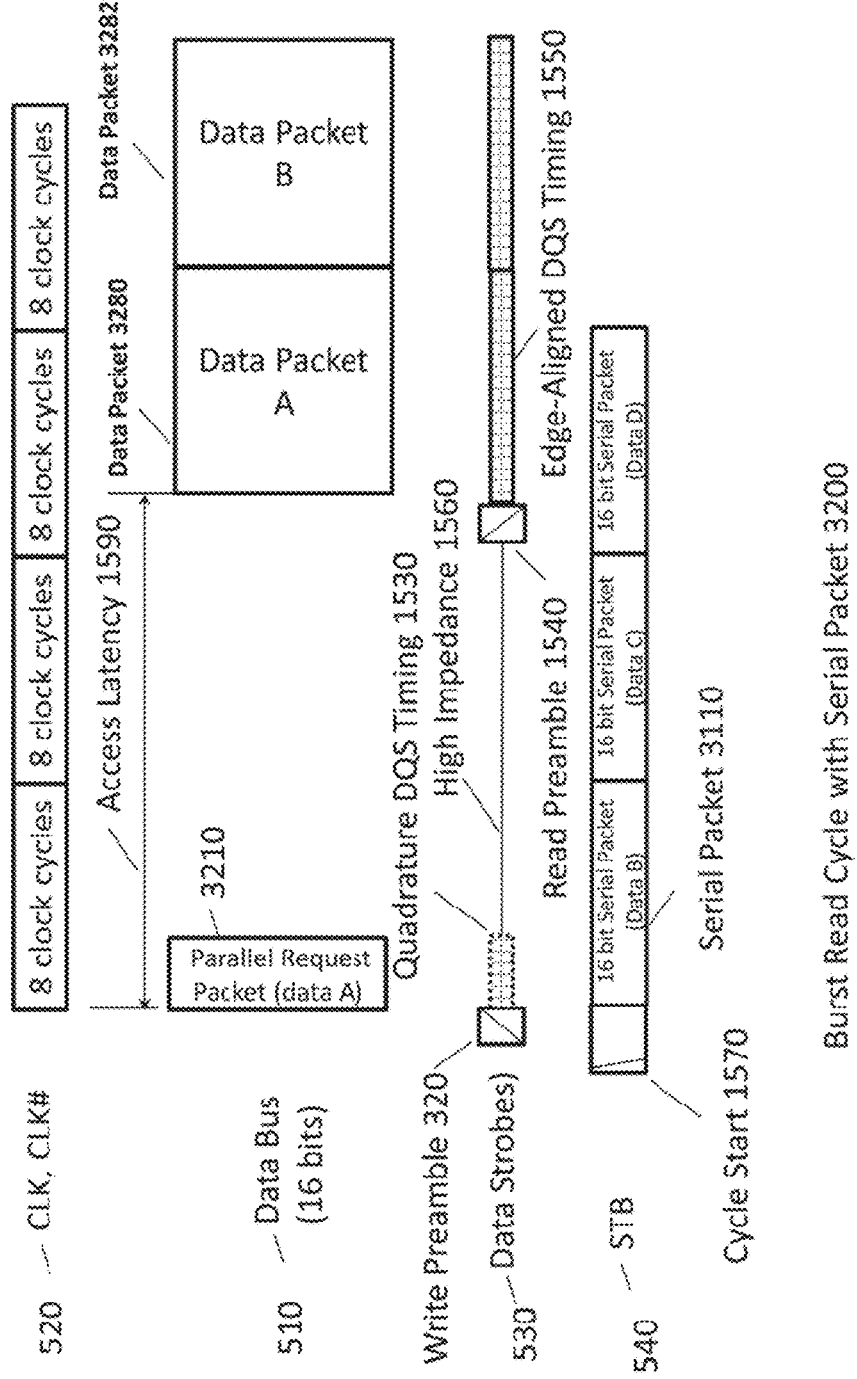
FIG. 32 shows a timing diagram showing a Burst Read cycle using Serial Packets.

In FIG. 32 is shown a Burst Read Cycle 3200 that incorporates Burst Serial Packets 3110. The Parallel Request Packet 3210 initiates a Burst Read Cycle from location A (a particular bank and column address). At the same time the Parallel Request Packet is presented to the DRAM a Serial Packet 3110 is presented to the DRAM on the STB signal. In FIG. 32 the first Serial Packet illustrated is a Burst Read Packet and points to location B. After the first Word of data addressed by the Parallel Request Packet from Location A is transferred by the DRAM 3280 the first Word of data addressed by the Burst Serial Packet from Location B 3282 immediately follows. If the subsequent Serial Packet is a NOP (s0=1, s1=1) the next Word accessed will be from a next sequential address, e.g., Location B+1. If NOPs continue to be supplied via Serial Packets in succession then the address will continue to automatically increment in a strictly ascending order until the last column address in the open row is accessed. The burst will continue uninterrupted but the address will begin at the starting column address of the accessed row. This will continue until the Burst is Retired via a Utility Burst Stop 3314 command is received via the Serial Packet. So in other words, once a Burst Serial Packet 3110 is received the original Burst Count in the initiating Parallel Request packet is ignored; only a Utility Burst Stop 3314 Serial Packet can be used to stop the burst.

Retiring the Burst Cycle via Utility Burst Stop

Once a Burst Serial Packet 3110 has been issued to the DRAM, the burst length field in Parallel Request Packet is ignored. The burst cycle is halted by issuing a Utility Burst Stop 3314 packet using the serial protocol via the STB signal. The format of a Utility Burst Stop Packet is shown in FIG. 34. Once the DRAM receives the Utility Burst Stop command 3314 shown on FIG. 33, it completes data operations that are in process then enters the Idle state if no further Active Cycles are scheduled.

Figure 33:
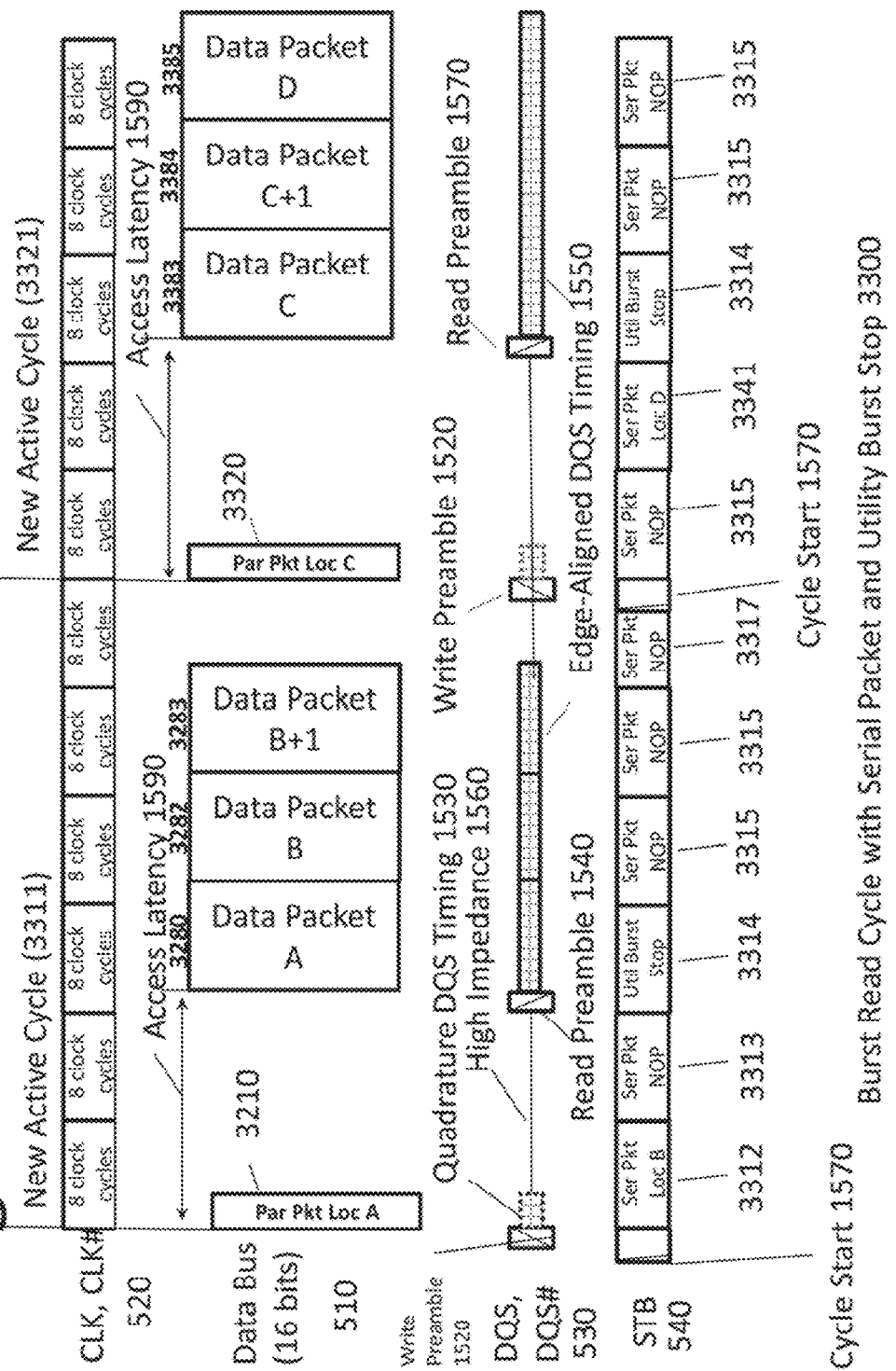
FIG. 33 shows a timing diagram showing a Burst Read cycle with Serial Packets and a Utility Burst Stop command.
Figure 34:
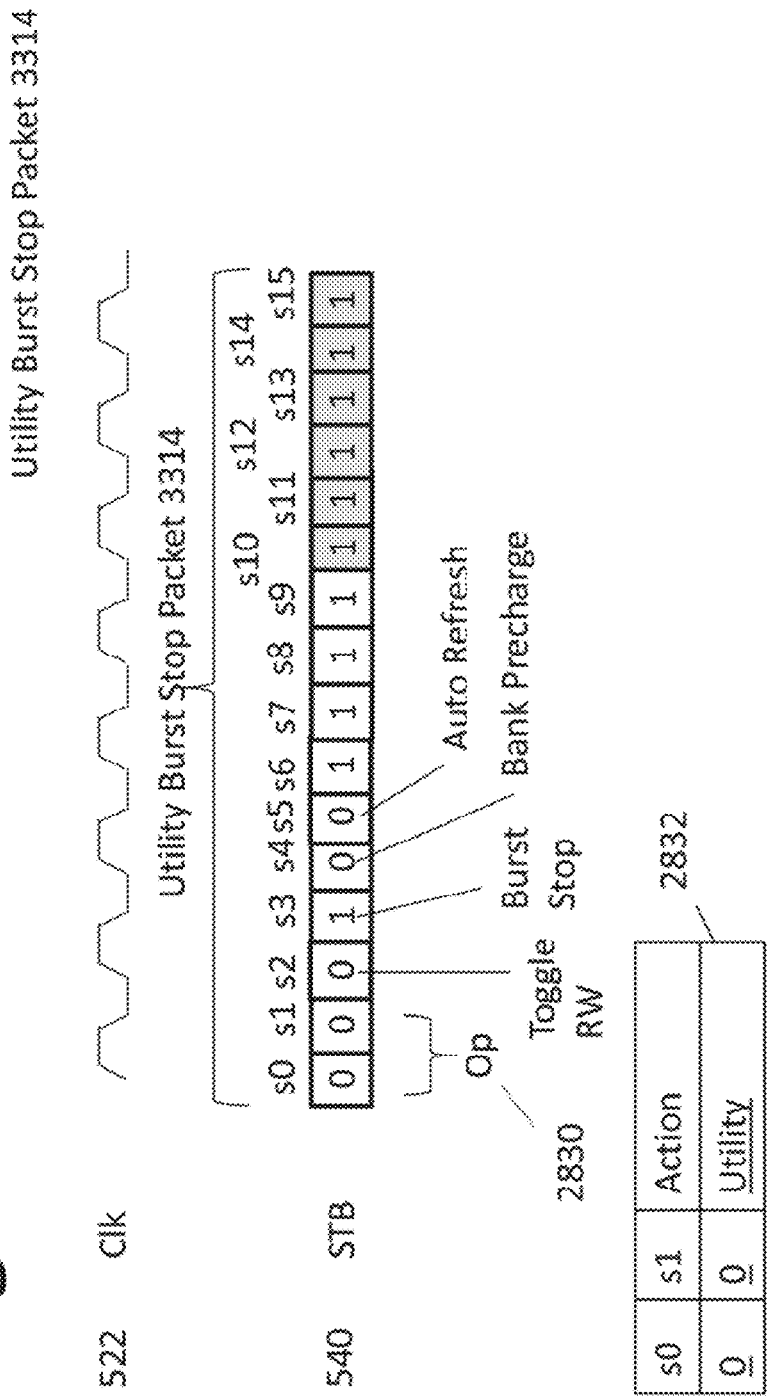
FIG. 34 shows a diagram showing a Utility Burst Stop Serial Packet format.

Referring to FIG. 33 the Utility Burst Stop 3314 begins the process of terminating the Burst cycle Immediately following the Stop command 3314 three NOP commands are sequentially supplied on the STB signal (3315, 3316, 3317) after which the DRAM will enter the Idle State. However in the case shown in FIG. 33 a Cycle Start (1570) command is issued within the last NOP 3317. Consequently a Parallel Request Packet (3320) is received at the end of the previous NOP packet 331) that contained the Cycle Start command 1570 indicating the beginning of a new Active Cycle 3321. As a frame of reference, Active Cycles 3311, 3321 begin when a Parallel Request packet is received.

Active Cycle 3321 is a Burst Read Cycle. During the time of the Parallel Request Packet 3320 being received, a NOP 3315 is received on the STB signal. As a consequence the first two Words from the Burst Read will be sequential Words addressed by the Bank and Column addresses contained within the Parallel Request Packet 3320 starting at location C. During the second Serial Packet timeslot a Read Serial Burst 3341 command is received that addresses a location D, that can be a different Bank and Column address. Following the Read Serial Burst command 3341 is a Utility Burst Stop 3314 command with two of the three required NOPs (3315, 3315) shown following in immediate succession.

The Parallel Request Packet 3320 requested a burst Read from location C and that data packet 3383 is driven by the DRAM after Access Latency 1590. The next word 3384 is accessed from location C+1. The third word 3385 is addressed by the Burst Read Serial Packet 3341 from location D. After the Word from Data Packet D has transferred the DRAM returns to the Idle state 1120 if no Cycle Start command is received in the cycle following the last NOP 3315.

Toggling Read/Write Mode During Burst Cycles

Figure 35:
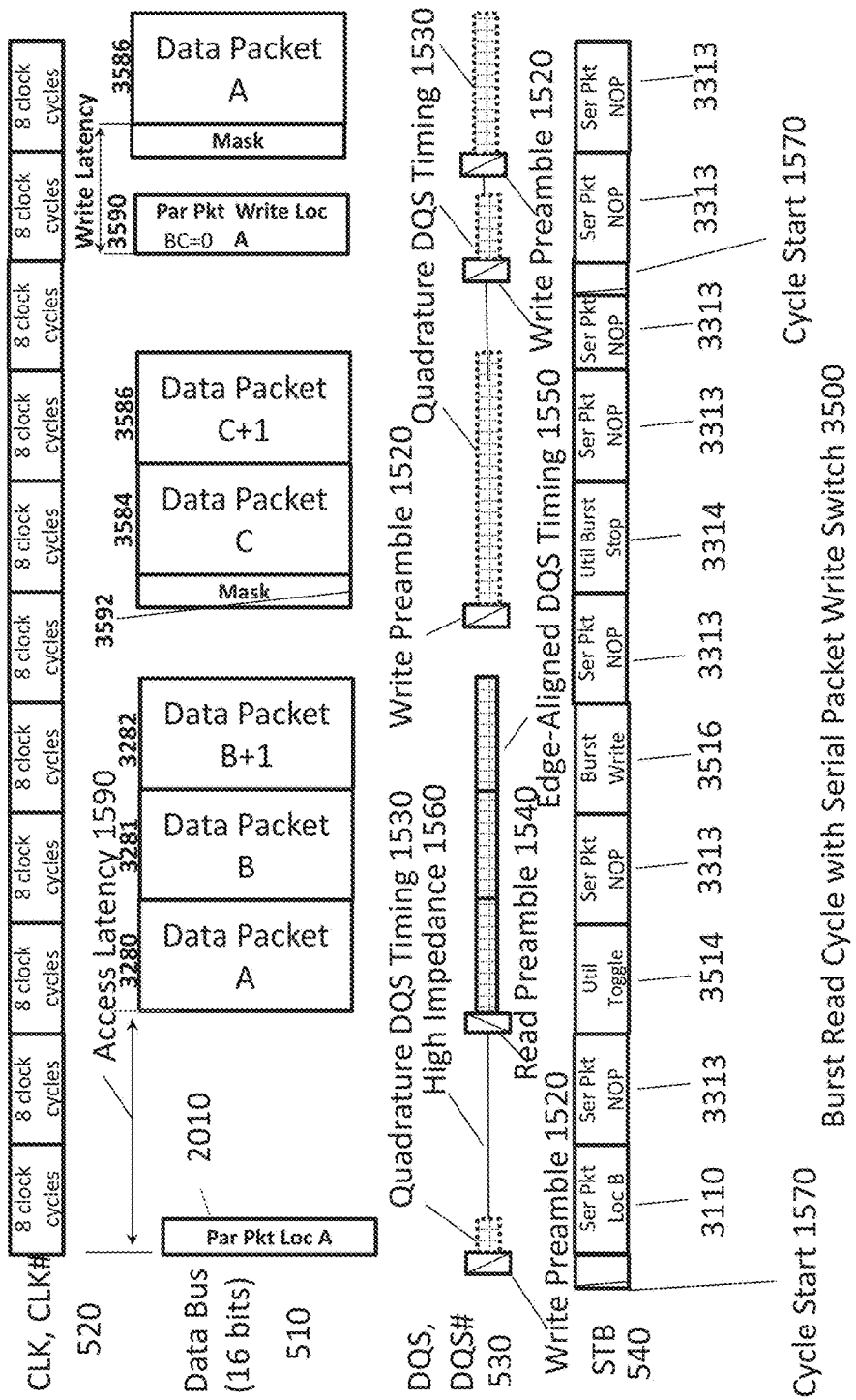
FIG. 35 shows a timing diagram showing a Burst Read Cycle with Serial Packet Write switch.
Figure 36:
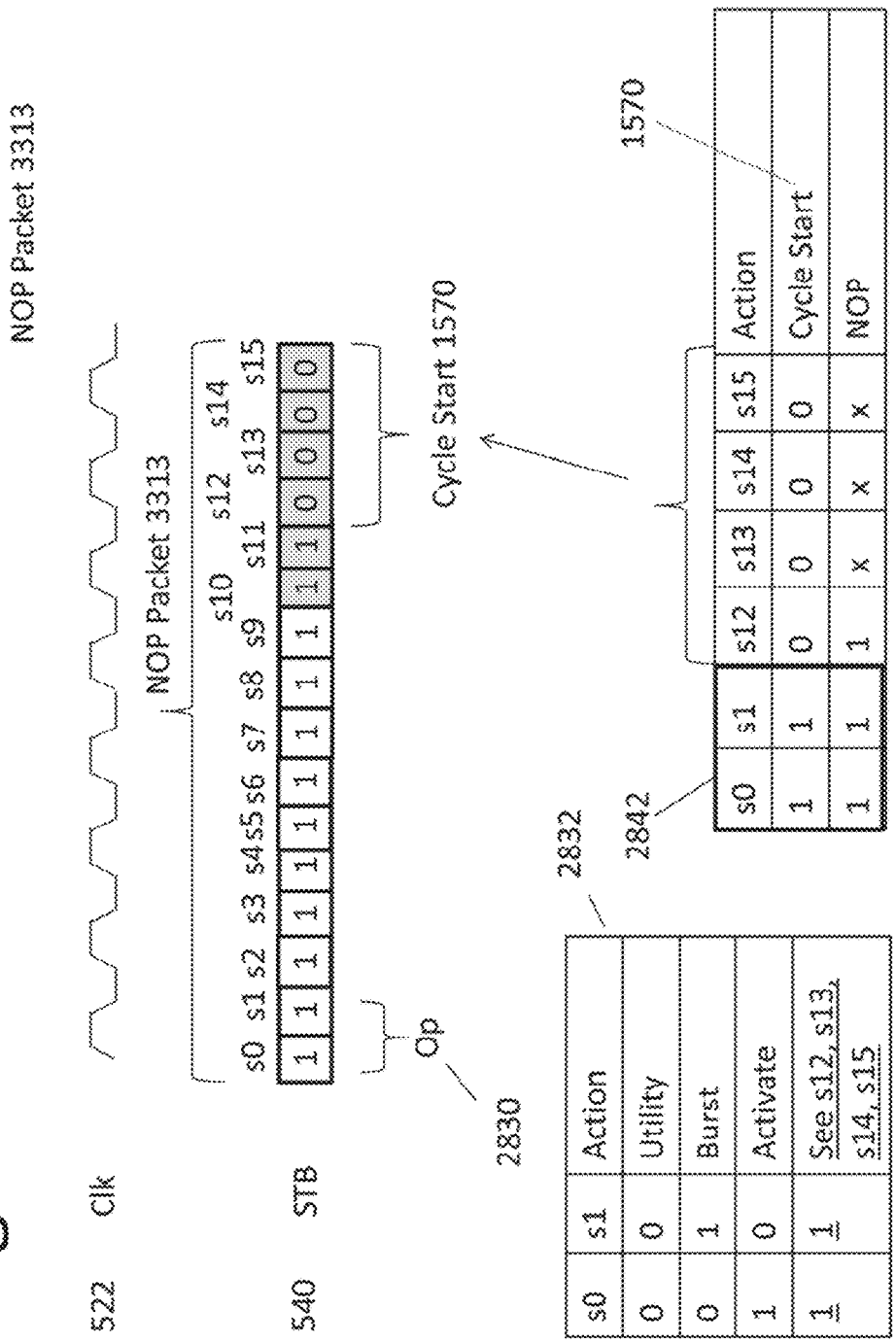
FIG. 36 shows a diagram showing a NOP Serial Packet format with Cycle Start.
Figure 37:
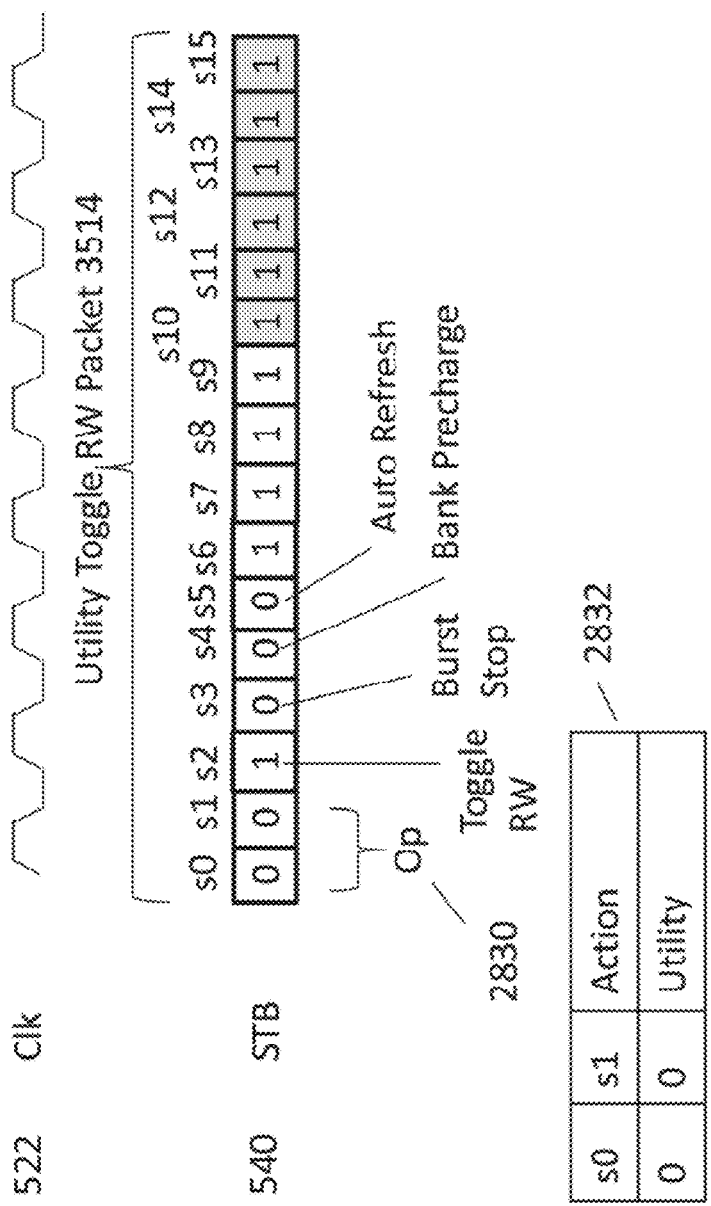
FIG. 37 shows a diagram showing a Utility Toggle RW packet format.

During Burst Read or Burst Write cycles that are using Serial Packets for addressing/control it is possible to switch modes from read to write or write to read using the Utility Toggle Packet 3514. As shown in FIG. 35, Utility Toggle Packet 3514 is received during a Burst Read Cycle. Any data cycles in queue will complete in a manner similar to how Utility Burst Stop operates. If the Active Cycle is a Burst Read cycle, then the Utility Toggle (FIG. 37) command will require a single NOP command 3313 (FIG. 36) to immediately follow. Following the NOP 3313 command is a Burst Write Command 3516, which in this case is addressing location C.

Once the pending data packets 3181 & 3182 have been output, the Data Bus 510 is put into the high impedance state as the DRAM is switched to operate in Write mode. During the time the bus is placed into the high impedance state and before the Data to be written to location C is provided, the Data Mask for the first and last words 3592 of the burst is presented to the DRAM. The mask is used just as in the Burst Write case involving the Parallel Request Packets: the first Data Mask is applied to the first word written while the second Data Mask is applied to the final word in a multi-word burst.

For the case illustrated in FIG. 35, the Serial Write is two words long so both words can be masked if the appropriate bits are set in the Data Mask 3592.

Pipelined Precharging and Activation of Banks

Figure 38:
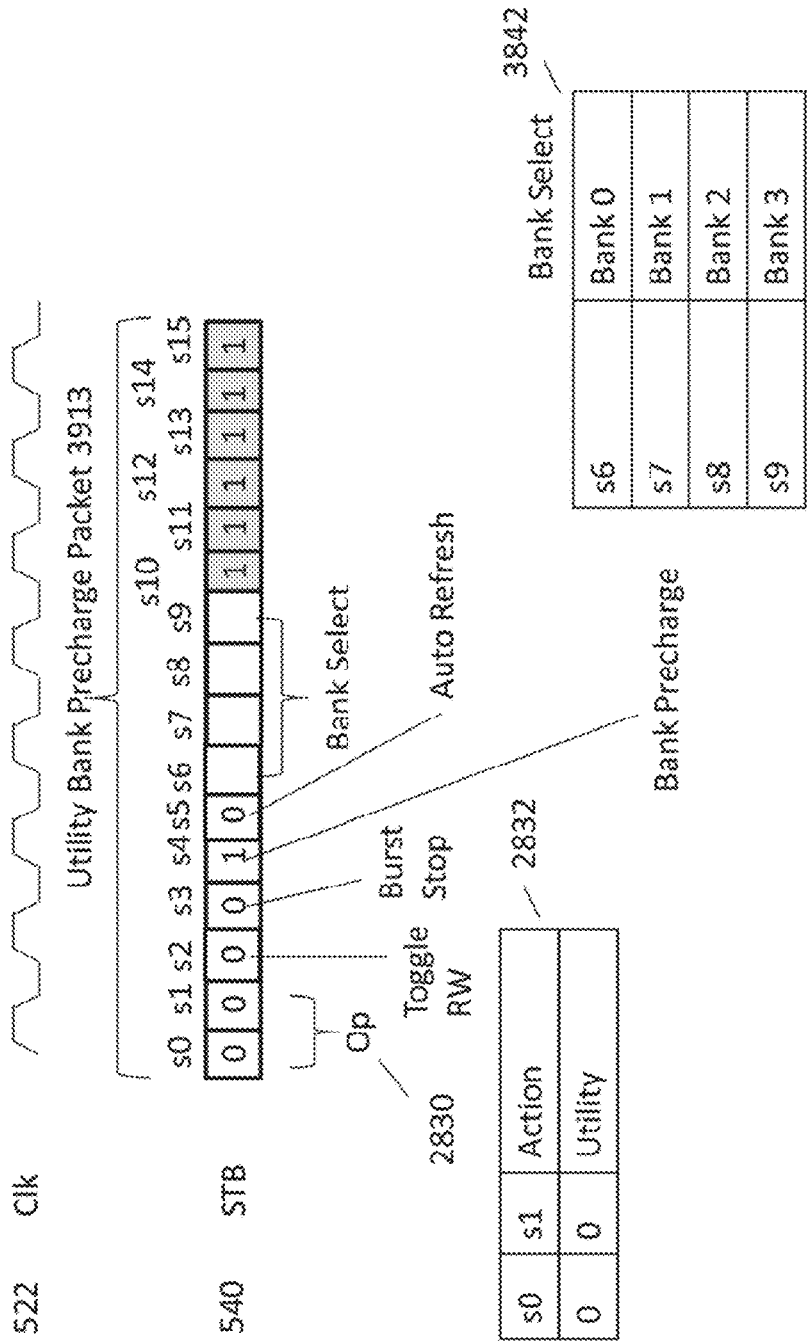
FIG. 38 shows a diagram showing a Utility Bank Precharge packet format.
Figure 39:
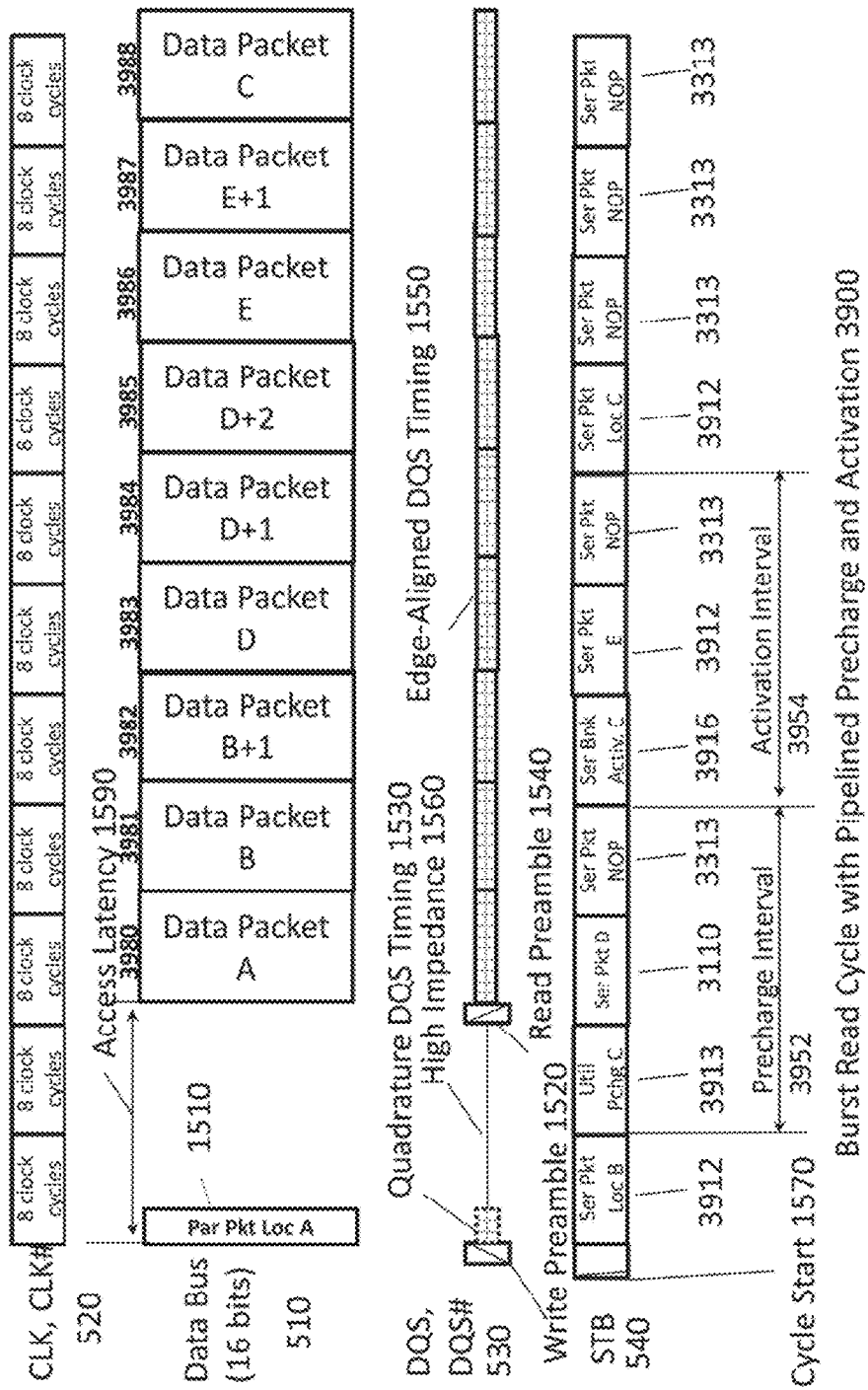
FIG. 39 shows a timing diagram showing a Burst Read Cycle with Pipelined Precharge and Activation.
Figure 40:
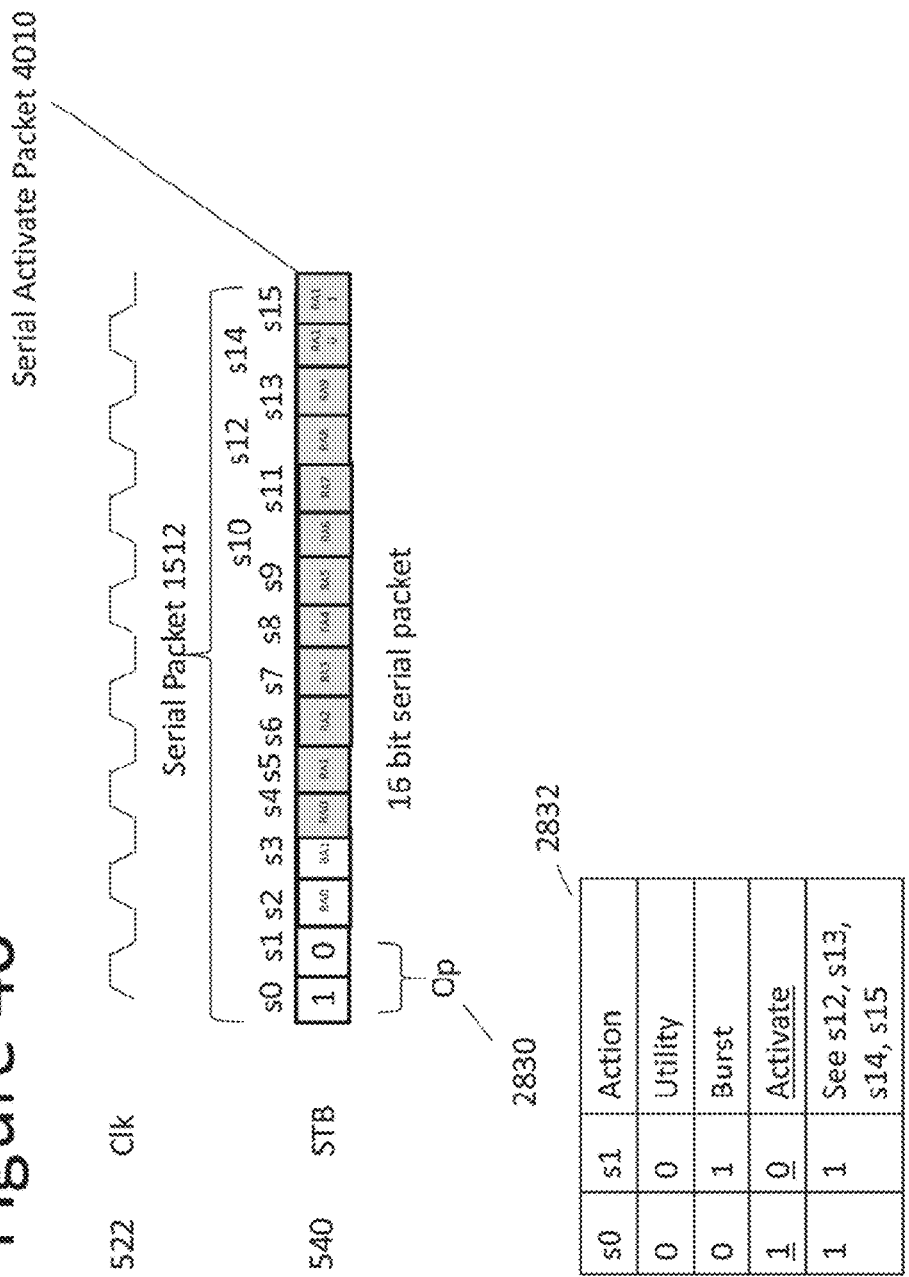
FIG. 40 shows a Serial Activate Packet format.

During Read Burst or Write Burst Operations banks can be selectively precharged using the Utility Bank Precharge command 3913 (also called Pipelined Precharge). After the Precharge Interval 3952 the bank can be Activated by the Serial Activate Packet 4010 as shown in FIG. 39. The format of the Utility Bank Precharge Serial Packet 3913 is shown in FIG. 38 and the format of the Serial Activate Packet 4010 is shown in FIG. 40.

FIG. 39 shows an Active Burst Read Cycle that accesses one Word from Location A as addressed by the Parallel Request Packet 1510. At the beginning of the Active Cycle, Serial Burst Read Packet 3912 is received requesting the data from Location B. Immediately following the Serial Burst Read packet 3912 is a Utility Bank Precharge Packet 3913 that precharges the bank containing Location C concurrent with the Burst Read continuing sequentially from location B+1. After waiting the Precharge Interval 3952 a Serial Bank Activate 3916 command is received instructing the DRAM to activate the bank/row containing location C. This activation is concurrent with the ongoing burst transfer. After the Activation Interval 3954 a Serial Burst Read request to Location C 3912 is issued to the DRAM and the Data Packet 3988 is read from the DRAM after the access latency. Once this sequence of Burst Read data begins to appear on the Data Bus 510 in the Active Cycle, the Data Bus 510 operates seamlessly until a Utility Burst Stop command is issued returning the DRAM to the Idle State.

Figure 41:
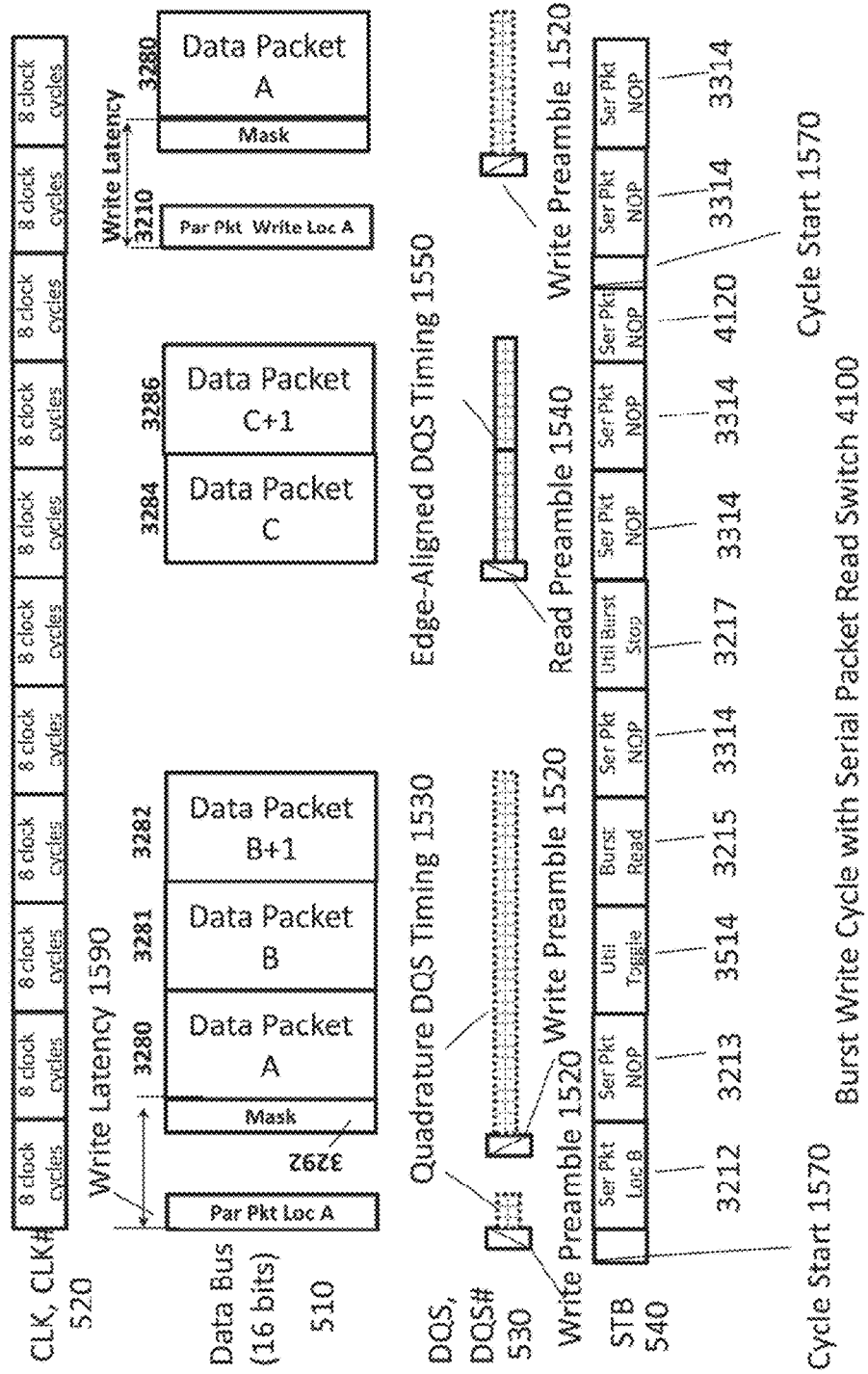
FIG. 41 shows a timing diagram showing a Burst Write Cycle with Serial Packet Read switch.

It is also possible to toggle from read to write or write to read and use Pipelined Bank Precharge and Pipelined Activations all within the same Active Cycle. There is no limit to the length of the Active Cycle once it has begun. For example in FIG. 41 is shown a timing diagram of a Burst Write Cycle where a Serial Utility Toggle RW 3514 is received switching it to a Burst Read Cycle. A Utility Burst Stop 3314 is used to halt the burst operations after transferring two Words (3284 and 3286) in the Read Burst. A Cycle Start 1570 is included in the last NOP 4120 of the Read Burst Cycle indicating Parallel Request Packet 3210 follows.

Refresh Operations Via the Serial Protocol

In many video frame buffer applications, the frame buffer will be continuously updated with new data while it is being read out to display the data. In such applications, a data refresh for the DRAM may be optional. For example, because of the scan rate of the display and the organization of DRAM, a data refresh for the DRAM may have only incremental benefit.

If refresh is desired, the Serial Packets can also be used to initiate a Refresh: the banks to be refreshed are specified in the packet and the DRAM then functions similarly as it does when the Refresh commands are issued via the Parallel Request Packet.

Operation of Signaling in Point to Point Environments

Figure 42:
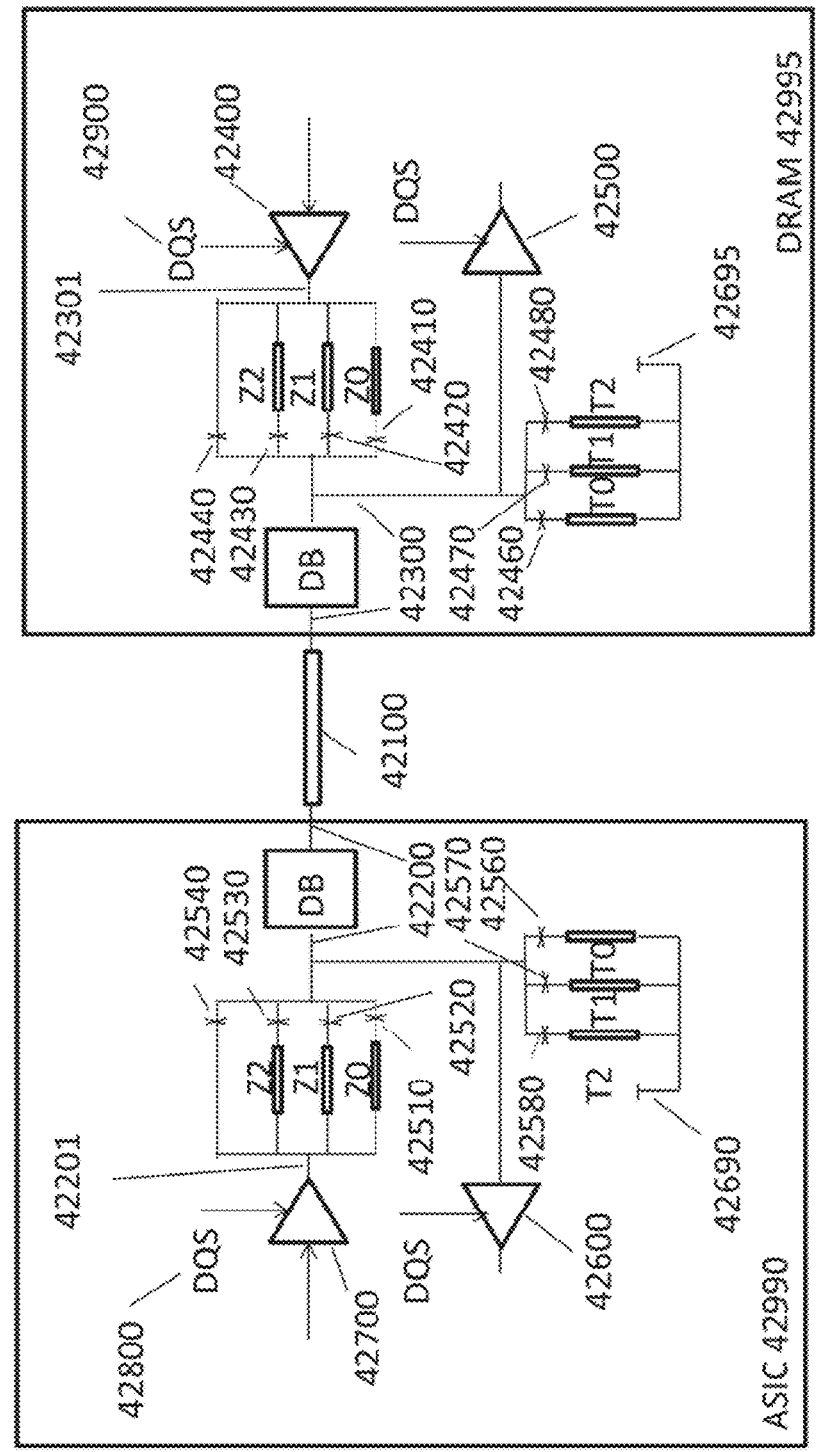
FIG. 42 shows a schematic of the IO circuits of an application specific integrated circuit (ASIC) and DRAM interconnected for signaling using a series termination scheme for each signal flow direction.

FIG. 42 shows a single bidirectional signal interconnecting an ASIC 42990 controller IC and the DRAM 42995. By having a near-identical structure on opposite ends of the interconnecting signal wire 42100 a series terminated signaling scheme can be employed. The key benefit of using a series-terminated scheme is avoidance of consumption of DC power associated with parallel termination circuits.

In order to configure the IO Circuits to be used in a series termination scheme the on-die termination (ODT) circuits 2430, 2430a shown in FIG. 24 on both ICs, ASIC and DRAM, are disabled via Mode Register bits. The programmable output impedance 2420 shown on FIG. 24 is configured to approximate the impedance of the external interconnecting link.

Figure 43:
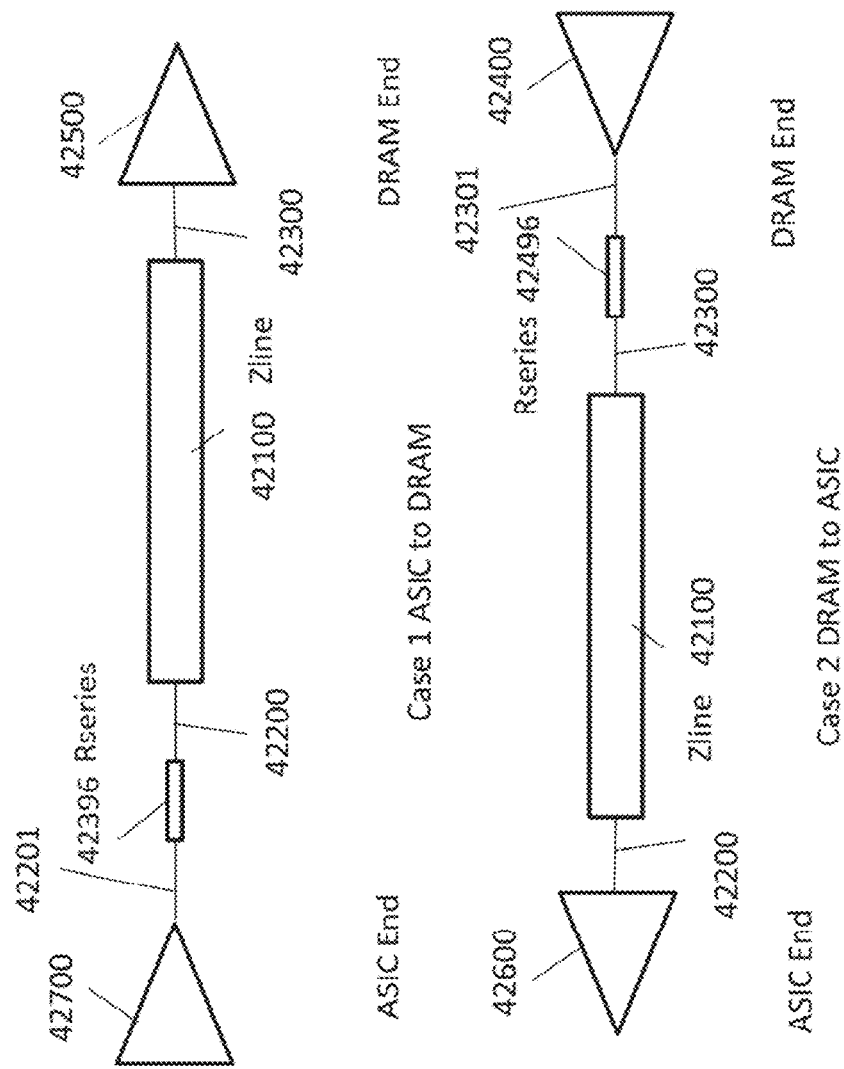
FIG. 43 shows two equivalent circuits of ASIC to DRAM signaling for scheme of FIG. 42.

FIG. 43 shows equivalent circuits for the series terminated mode of operation. In Case 1 the ASIC is driving the signal 42100 with an output impedance 42396 selected to approximate the impedance of the interconnecting link. When the DRAM drives the signal to the ASIC a similar arrangement is used with the output impedance 42496 set by Mode Register bits.

Case 2 with the DRAM driving the link is also shown in FIG. 43 In both cases, conventional series terminated switching/signaling is used. Because the receivers in each case have no parallel terminations there's no DC power consumed by the terminations.

Figure 44:
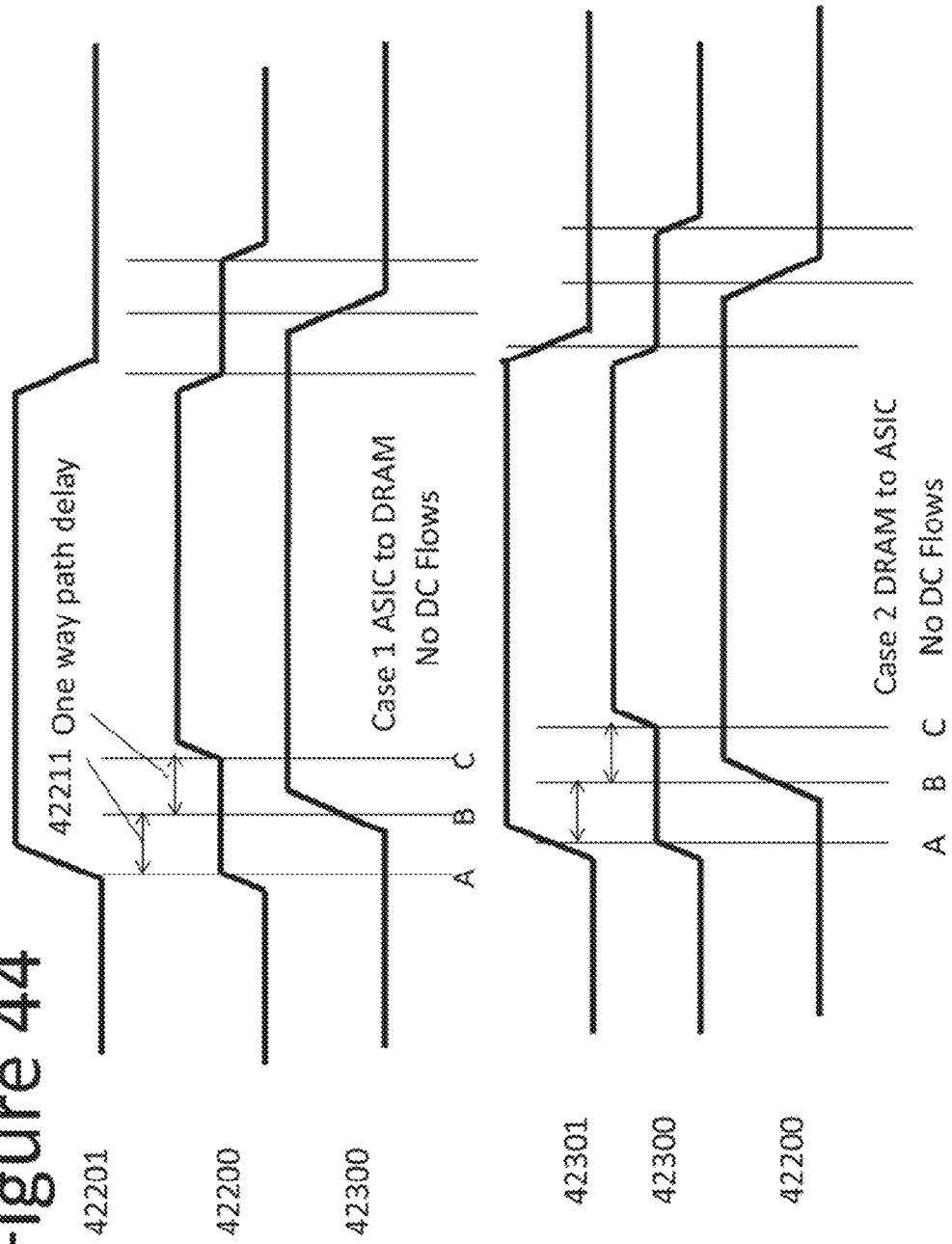
FIG. 44 shows timing diagrams for the signaling configuration of FIG. 42.

Timing waveforms of these two Cases 1 and Case 2 are shown in FIG. 44. The one way path delay 42211 is shown to apply to the transient conditions of Low to High and High to Low transitions. Both ends of the link 42200 and 42300 are shown as well as the node connecting the driver to the link through the series termination impedance on each end of the lines 42201 and 42301. During the transient period the driver-end of the link 42200 or 42300 sees a dwell period equal to twice the one-way path delay 42211 at half of the incident voltage step observed at the active driver output 42201 or 42301. The receiver in either Case 1 or Case 2 receives a full signal transition on the incident wave in either Case 1 or Case 2 in the point to point circuit topology.

Figure 45:
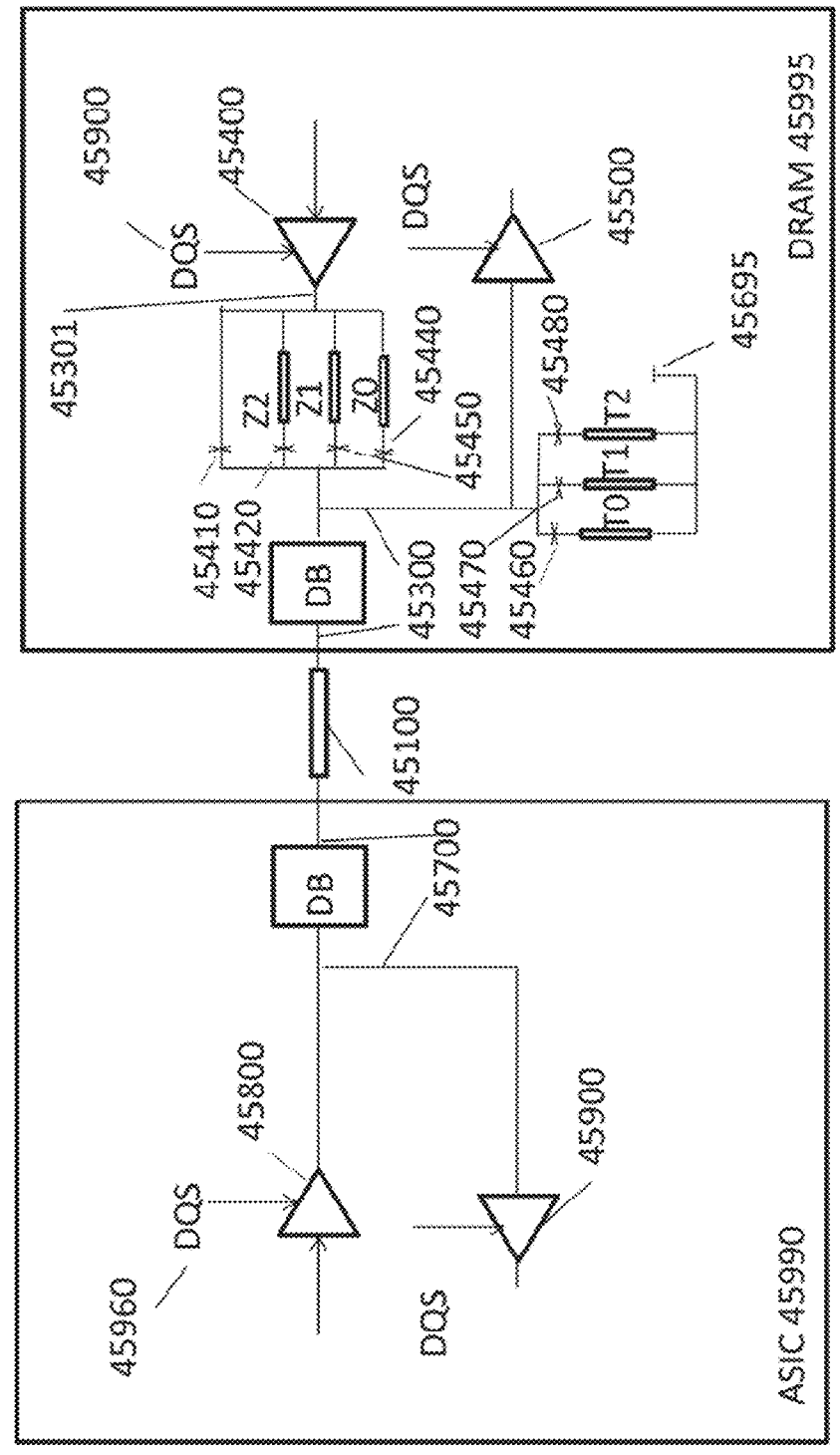
FIG. 45 shows a schematic of the IO circuits of an ASIC and DRAM interconnected for signaling using series termination scheme for flow in one direction and a parallel termination scheme for flow in the opposite direction.

FIG. 45 shows a configuration with a conventional low-impedance driver used in combination with the DRAM. In this example the IO structure of the ASIC 45990 includes no series termination resistors nor does it contain any ODT structures. The IO structure on the DRAM 45995 will be configured to provide a series terminated driver when the DRAM drives the link 45100 and provides a parallel terminated receiver via a direction-sensitive ODT when the ASIC drives the link.

Figure 46:
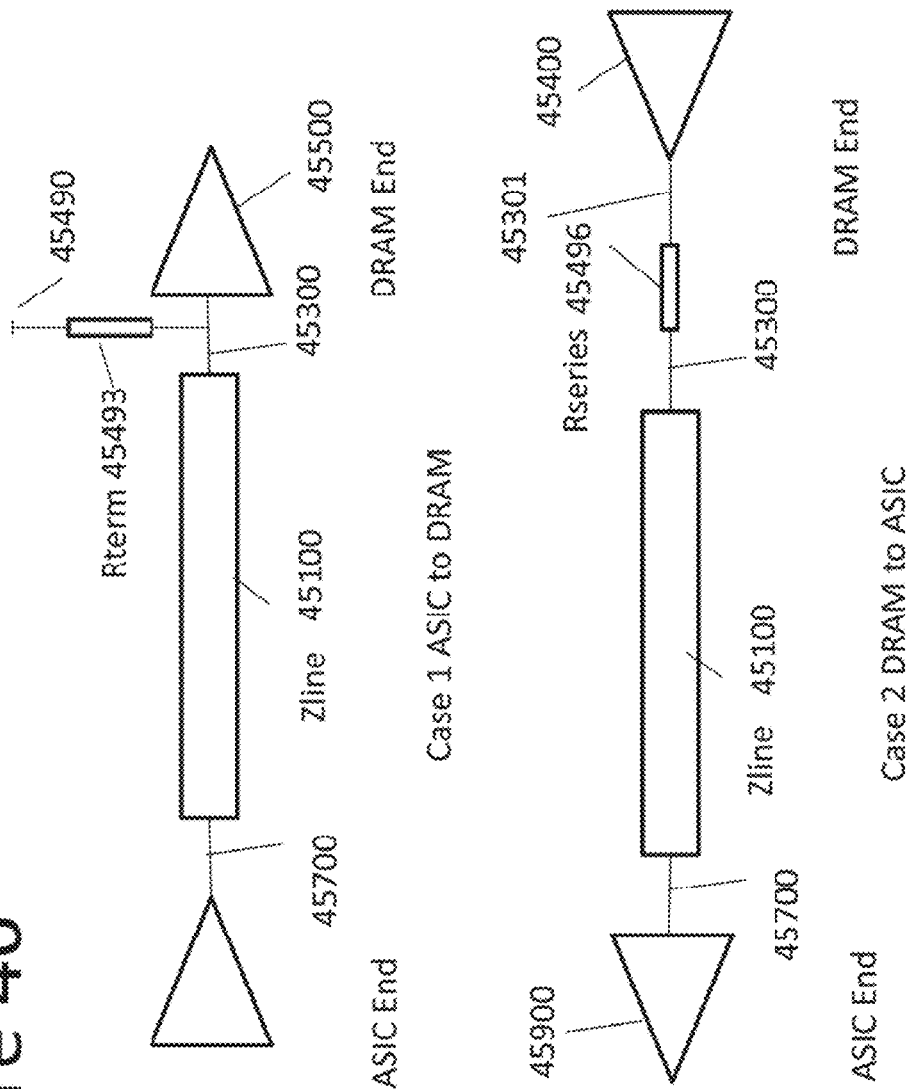
FIG. 46 shows two equivalent circuits of ASIC to DRAM signaling for scheme of FIG. 45.
Figure 47:
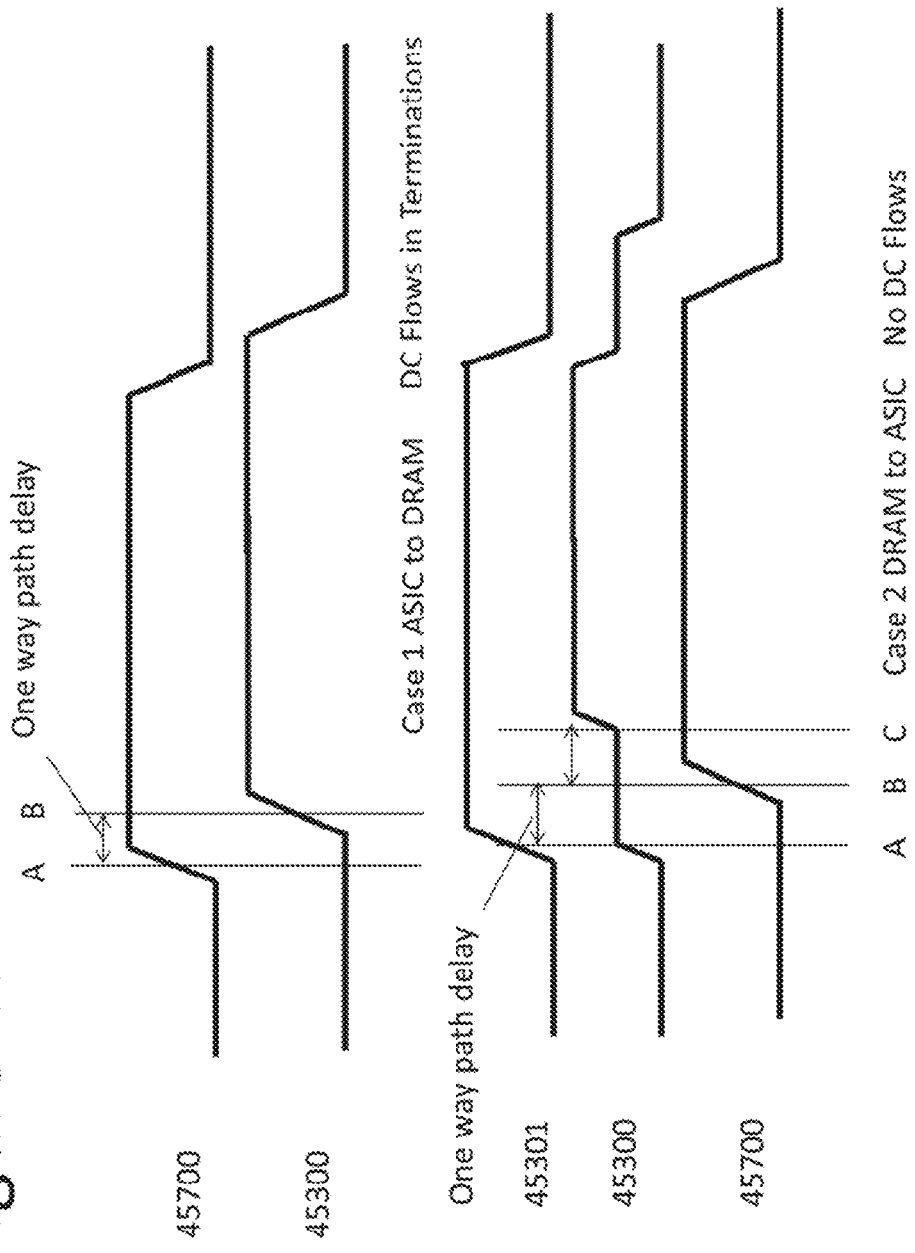
FIG. 47 shows timing diagrams for the signaling configuration of FIG. 45.

FIG. 46 shows equivalent circuits for the two cases when a low-impedance driver with no on-die termination is used to connect to the DRAM. Case 1 is when the ASIC drives the link 45100 connecting to the DRAM. The direction sensitive ODT on the DRAM dynamically connects a Mode Register-selectable termination impedance 45493 to the link inside the DRAM when the DRAM is receiving signals. When the DRAM drives the link in Case 2 this termination impedance is switched off. The DRAM drives the link through a Mode Register-selectable series termination resistor 45496. This is equivalent to the series terminated Case 2 of FIG. 43. Timing waveforms for the switching characteristics of the equivalent circuits of FIG. 46 are shown in FIG. 47.

For the Case 1 with the ASIC driving the link reflections from the DRAM end are absorbed by the ODT 45493. Case 2 for the DRAM driving the link, the reflection from the ASIC's receiver 45700 is absorbed by the series termination 45496 on the DRAM as in the all-series terminated cases shown in FIGS. 42, 43 and 44.

Operation of Signaling in Multi-Drop Environments

For multi-drop environments, series termination alone usually cannot be used so parallel termination will be preferred. The ODT circuits on the DRAM will be used for write cycles and for receiving parallel packets. The controller will also use the ODT circuit on board the controller. In this way irrespective of the source there is proper termination applied to the bus signals at all times. The terminations are enabled via the mode register and are used to set the value of the output impedance and the parallel termination impedance.

Device Floorplan

Figure 48:
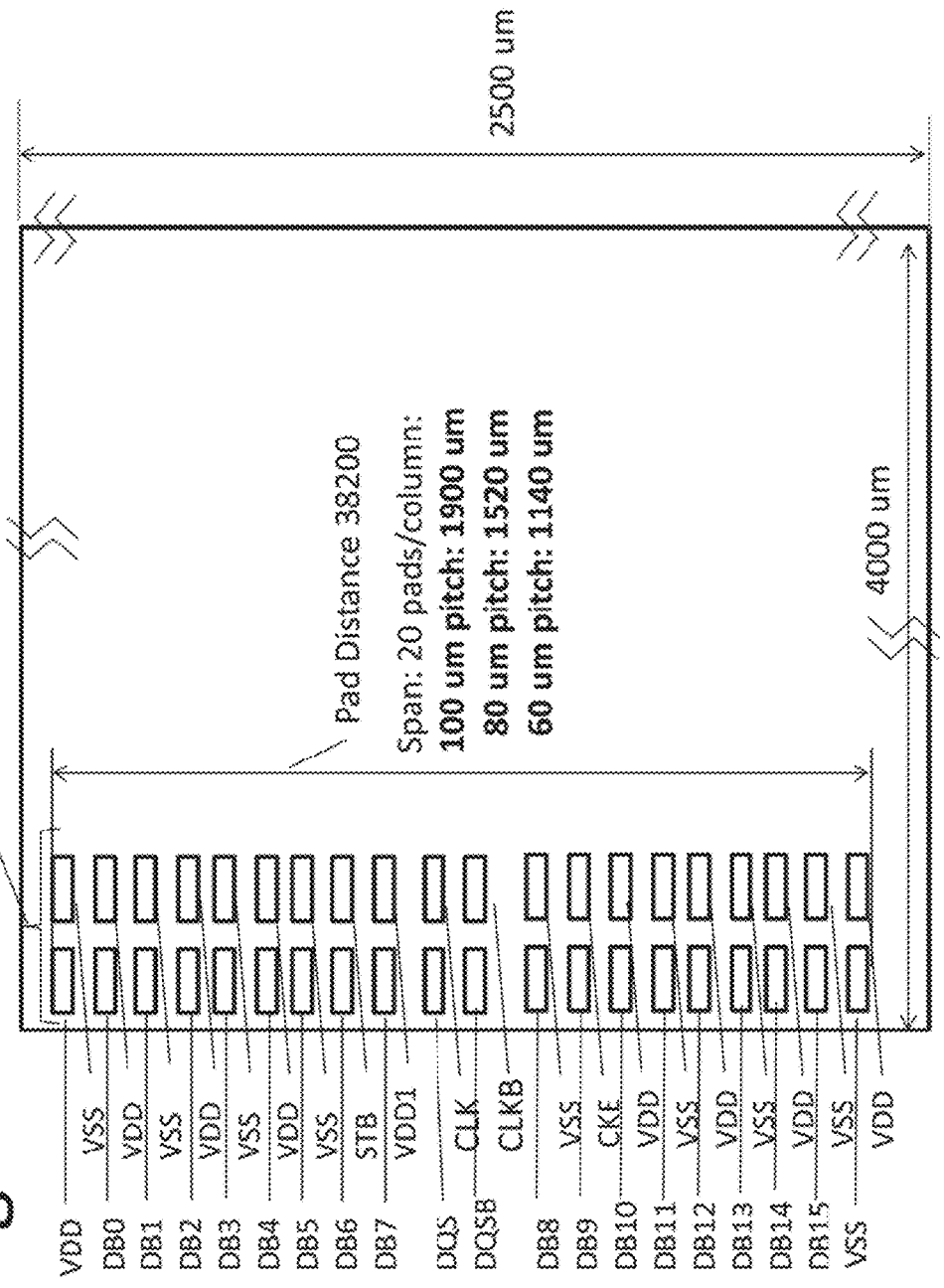
FIG. 48 shows a bonding pad configuration for a DRAM with low pin count.

The DRAM floor plan 48000 has bonding pads 48100 placed adjacent to a single edge of the die as shown in FIG. 48. In one version of the DRAM, the die is rectangular with an aspect ratio of approximately 2:1.25, though it should be understood that other shapes and sizes are possible. The bonding pads are placed adjacent to the shorter edge of the die, offering advantages for stacked die assembly configurations.

Because the DRAM has a total of 22 switching signals and accounting for an appropriate number of power and ground signals, the bonding pads are arranged into two vertical columns each containing 20 bonding pads. The Pad Distance 48200 is set by the pad pitch. Smaller pad pitch values result in a smaller total required Pad Distance. This Pad Distance can be significantly less than the Y dimension in one version of the DRAM.

Stacked Die Packaging Assemblies

Figure 49:
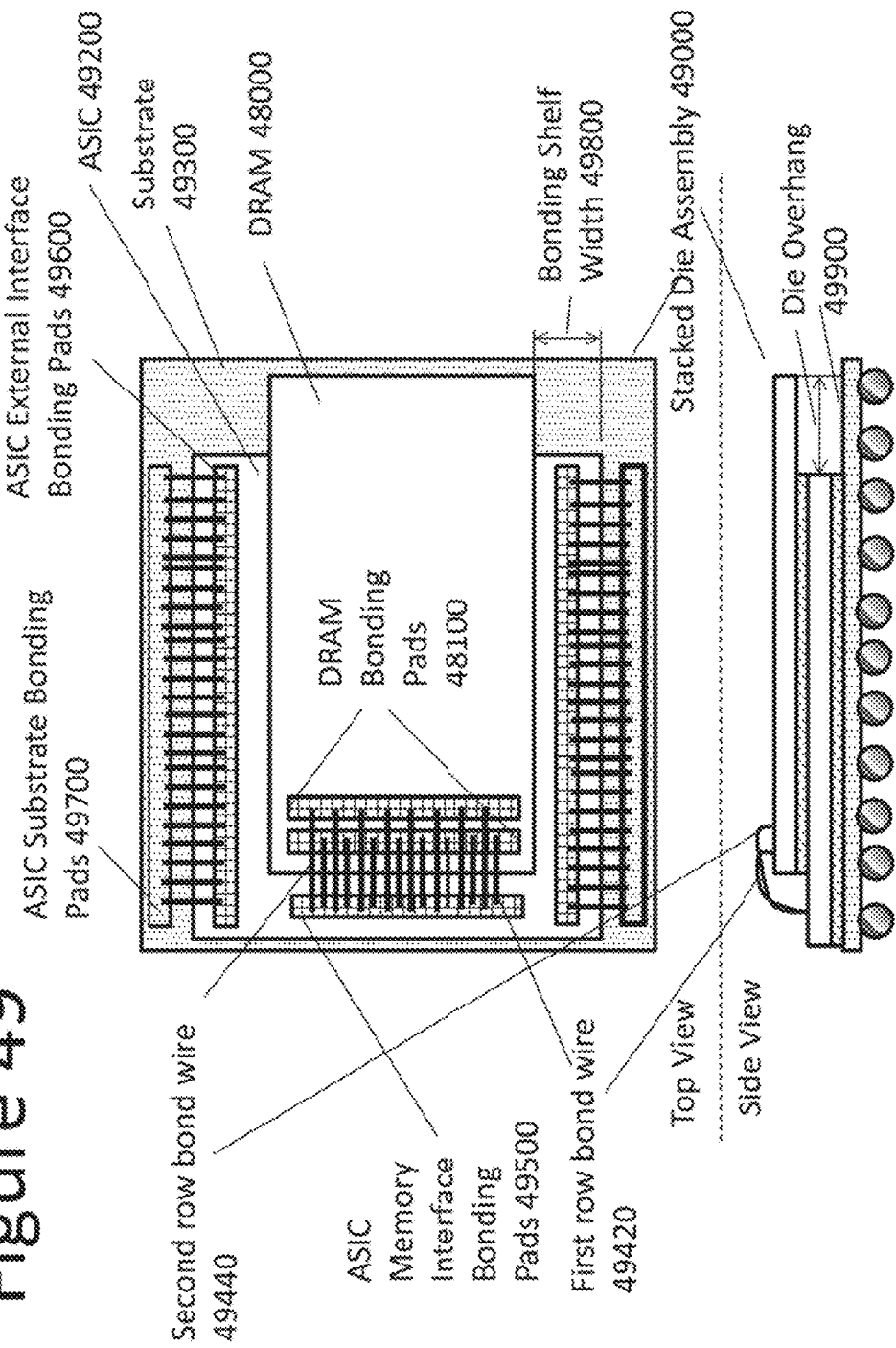
FIG. 49 shows a packaging scheme for a stacked die assembly using an ASIC and a DRAM that are interconnected together using wirebonds.

FIG. 49 shows a stacked die assembly 49000 that incorporates an ASIC die 49200 mechanically attached to a substrate 49600. Bonding pads on the ASIC 49600 are arranged along the two edges of the ASIC. These bonding pads are used to connect the ASIC's External Interface Bonding Pads 49600 to the Substrate 49300 via bondwires.

The DRAM die is mechanically attached to the exposed face of the ASIC die forming a stacked die assembly 49000. The DRAM Bonding Pads 48100 are connected to the ASIC Memory Interface Bonding Pads 49500 via bond wires 49440 and 49420.

Wirebonding processes are required to fabricate stacked die wirebonded assembly 49000. In order to make wirebonds to the ASIC die with the DRAM die stacked atop, an exposed region of the ASIC die called a Bonding Shelf of a Bonding Shelf Width 49800 is required for any region of the ASIC die receiving wirebonds.

This requirement for Bonding Shelves establishes the smallest possible ASIC die as set by mechanical assembly requirements for the structure 49000.

Figure 50:
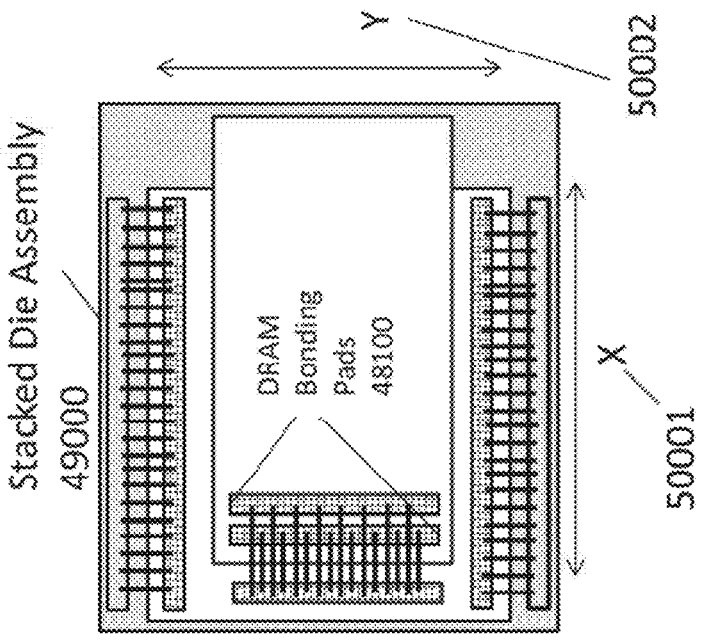
FIG. 50 shows the equations that define the mechanically limited die size of an ASIC used in the stacked die assembly of FIG. 49.

FIG. 50 shows the equations used to calculate the minimum sized ASIC die as set by these mechanical considerations. The X dimension 50001 is the sum of the DRAM X dimension and the Bonding Shelf Dimension minus any allowable Die overhang 50900. The Y dimension 50002 is equal to the DRAM Y dimension plus two Bonding Shelf widths. Typical values of bonding shelfs may be approximately a half millimeter and as much as a millimeter and a half may be a typical value for the maximum die overhang.

Using those typical values the minimum die size of the ASIC would be X=DRAM X Dimension−1 mm and Y=DRAM Y Dimension+1 mm.

Figure 51:
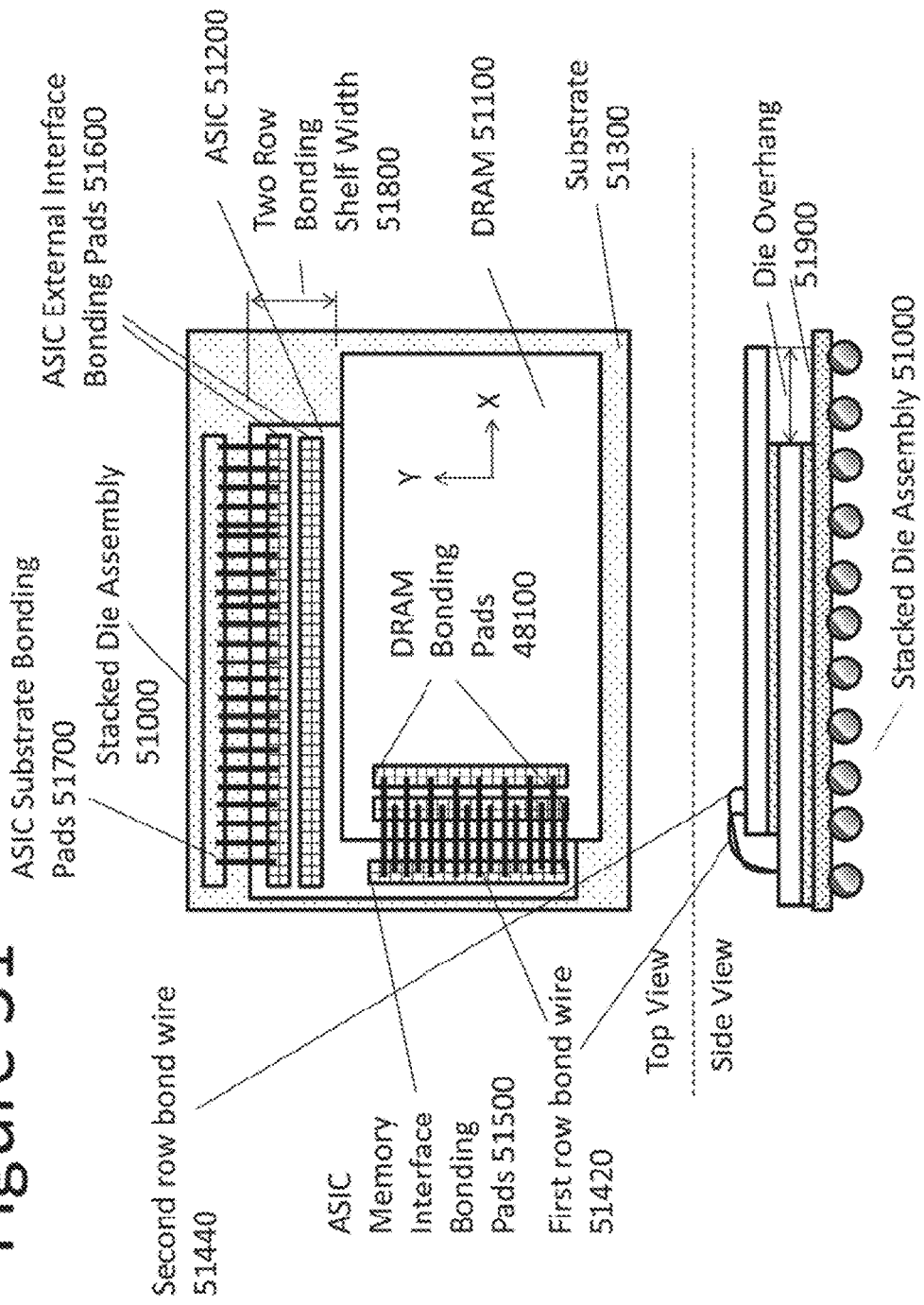
FIG. 51 shows an alternate packaging scheme for a stacked die assembly using an ASIC and a DRAM that are interconnected together using wirebonds.

FIG. 51 shows an alternate configuration for a stacked die assembly of an ASIC 51200 and DRAM 51100. The ASIC 512000 is mechanically attached to a Substrate 51300. The ASIC's External Interface Bonding Pads 51600 are arranged adjacent to a single edge of the die and are placed into two parallel rows. Double Row Wirebonding is used on the ASIC 512000 to connect these pads to Substrate Bonding Pads 51700. The DRAM 51100 is mechanically attached to the exposed face of the ASIC die and overhangs in both the X and Y directions.

Figure 52:
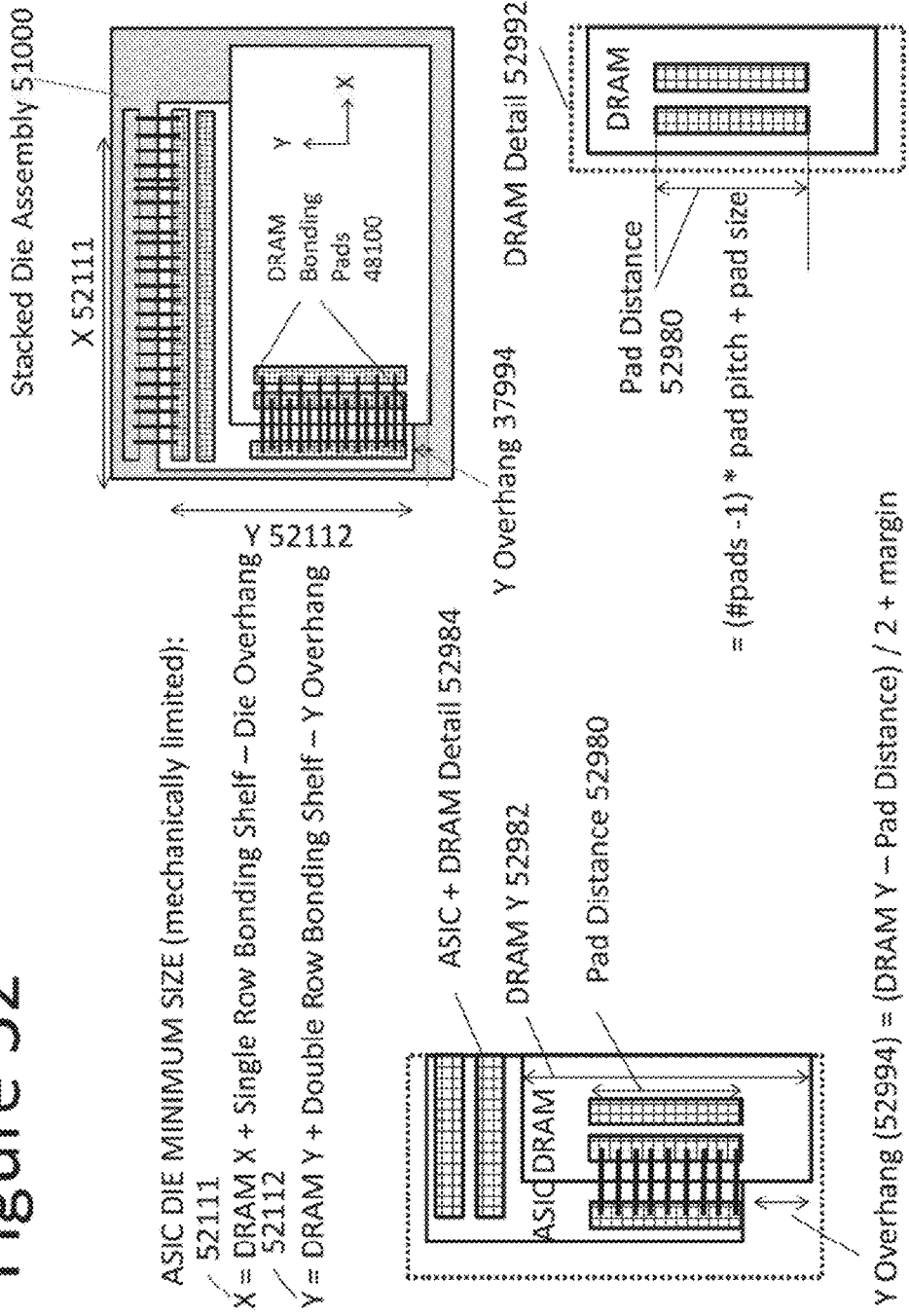
FIG. 52 shows the equations that define the mechanically limited die size of an ASIC used in the alternate stacked die assembly of FIG. 51.

FIG. 52 shows the equations used to calculate the minimum sized ASIC die as set by mechanical assembly requirements for this structure 51000. The X dimension 52111 is equal to the DRAM dimension plus the Single Row Bonding Shelf Width Dimension minus the Die Overhang in the long dimension of the DRAM 52900.

The Y dimension 52112 is equal to the DRAM Y dimension 52982 plus a Two Row Bonding Shelf Width 52800 minus the Y Overhang 52994. The Y overhang is determined in part by the number of DRAM bonding pads per column and the Pad Pitch which establish the Pad Distance 52980. The Y Overhang=½ of the difference of the DRAM Y dimension and the Pad Distance added to a margin distance. The margin may include how close to a die edge a bonding pad can be located as an example. The Two Row Bonding Shelf Width may be a value of 0.7 millimeter and the Bonding Pad Pitch on the DRAM may be 60 microns. The Pad Distance on the DRAM could be approximately 1.14 mm.

Using this configuration 51000 the minimum sized ASIC die as set by assembly mechanical considerations can be smaller than the stacked die assembly 49000 of FIG. 49.

Discrete DRAM Packaging

Figure 53:
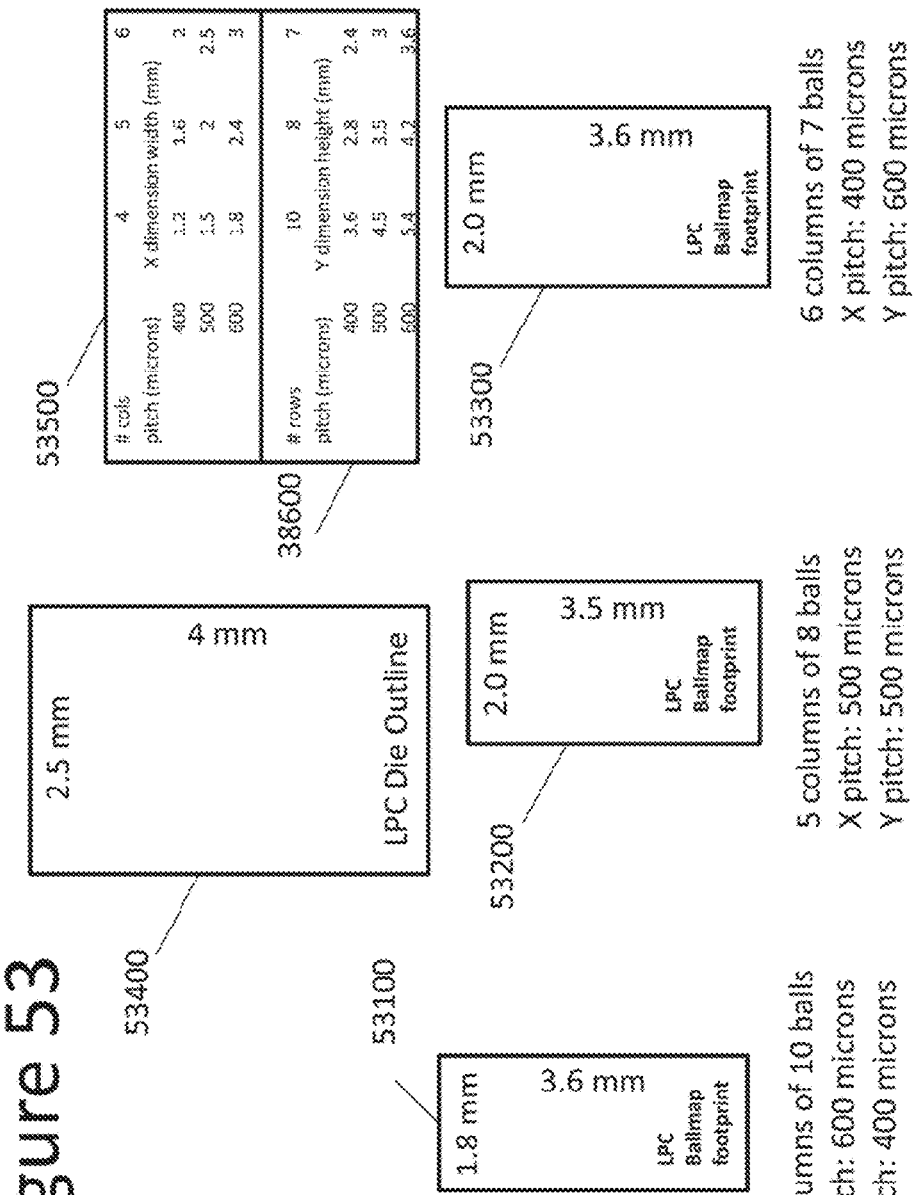
FIG. 53 shows a wafer level chip scale package and three ball map arrangements for the LPC DRAM.

FIG. 53 shows the outline of the LPC DRAM die 53400 and three different outlines showing ball map footprint possibilities for incorporating at least 40 balls (22 switching signals plus 18 power and ground balls). Because of the small number of bonding pads placed on the LPC DRAM, a fan-in type Wafer Level Chip Scale Package ("FI-WLCSP" or "WLCSP") can use ball pitch of 400 microns or greater for the device signals with an LPC DRAM physical die size of approximately 2.5 mm×4.0 mm. Table 38500 shows the X (column width) for 4, 5 and 6 columns of balls used in conjunction with Table 53600 showing the Y (row) width for 10, 8 and 7 rows for a total ball count of 40, 40 and 42 balls respectively (53100, 53200, 53300). In all cases a minimum of 40 balls can be placed with the perimeter of the 2.5×4.0 mm LPC Die arising from the low number of actual signals required by the LPC DRAM architecture. Comparing to a conventional DDR3 type x16 organized DRAM there are a total of 40 balls versus 96 balls. If 96 balls were placed on the face of a DDR3 type die of the same 2.5×4.0 size the 96 balls would be placed on a 0.45×0.25 mm pitch which is very aggressive for current low cost PCB technology. Because of the low signal count for the LPC DRAM a total of 40 balls can be placed on the face of a 2.5×4.0 mm die using a pitch of greater than 0.5×0.5 mm for compatibility with low cost PCB manufacturing.

Figure 54:
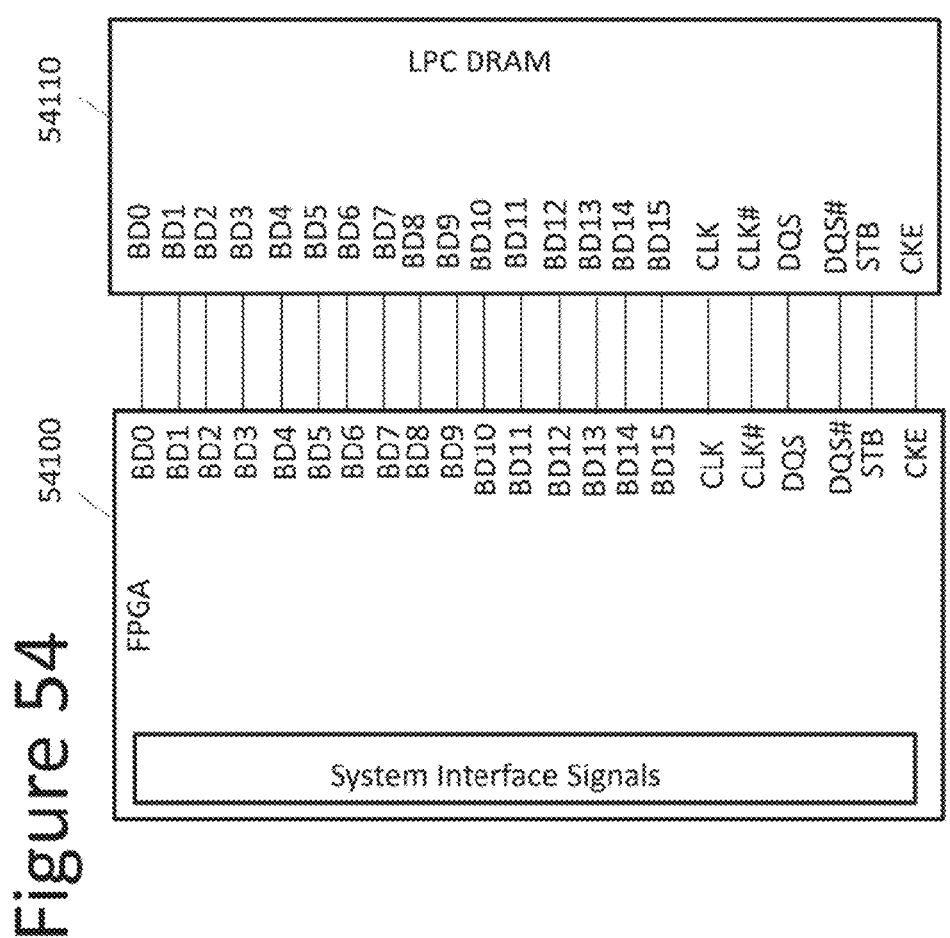
FIG. 54 shows signals used to interconnect an LPC DRAM used with a field programmable gate array (FPGA) with each chip in a separate package.

FIG. 54 shows a system level schematic of an FPGA and LPC DRAM used in a system such as a wearable video system. A total of 22 signals are used to interconnect the LPC DRAM to the controller. In this case an FPGA is used for the controller although a custom ASIC may also be used. The limited number of memory interface signals reduces the total number of signals required on the controller which reduces its physical size and cost.

Figure 55:
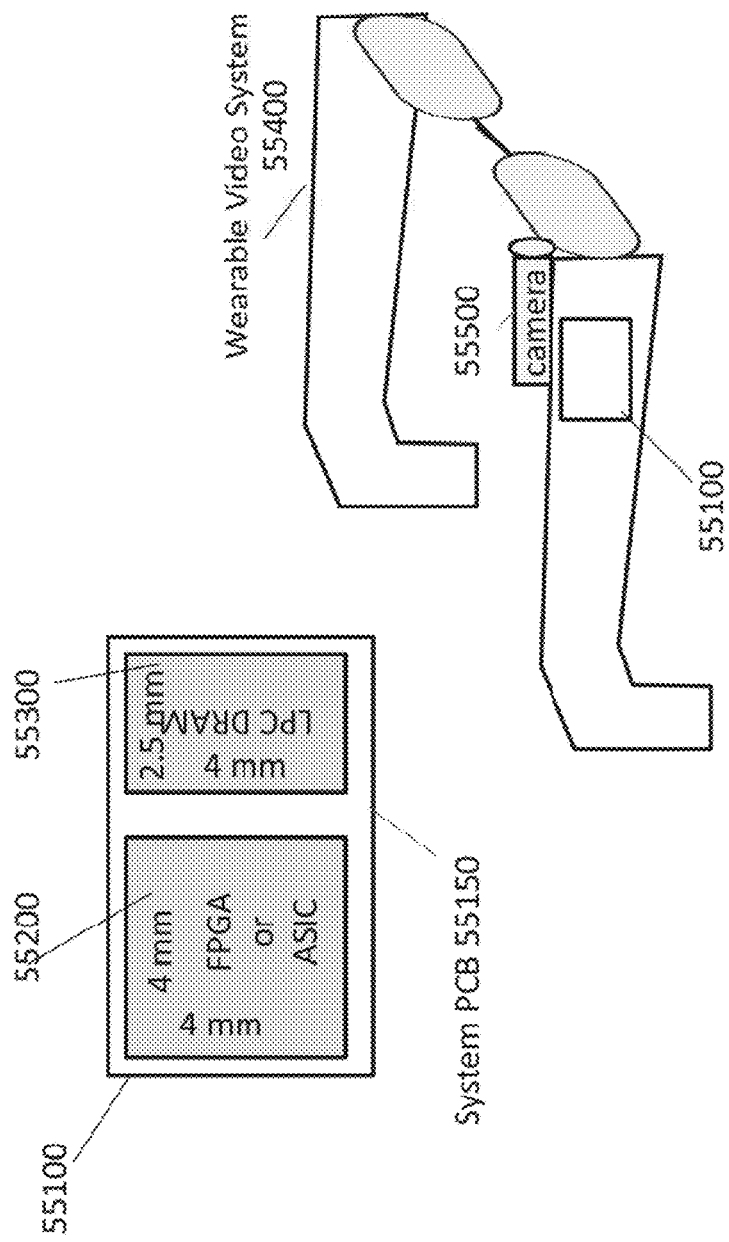
FIG. 55 shows a system usage of the wafer-level chip-scale packaged version of the LPC DRAM used in a miniaturized wearable video system.

FIG. 55 shows a wearable video system 55400 that requires a miniaturized electronics subsystem 55100 in order to meet the physical packaging requirements of the system. A printed circuit board 55150 contains an FPGA 55200 and an LPC DRAM 55300 creating a miniaturized electronics assembly 55100. This miniaturized electronics assembly can be incorporated into a wearable video system 55400 such as an eyeglass-configured appliance because of its small physical size. Because conventional PCB and soldering processes can be used to fabricate miniaturized electronics assembly 55100 owing to the >400 micron mechanical spacing of the solder balls used to interconnect the FPGA and LPC DRAM Packages to the PCB, minimum assembly cost is incurred versus using advanced assembly technologies while still producing a miniaturized electronics assembly.

Figure 56:
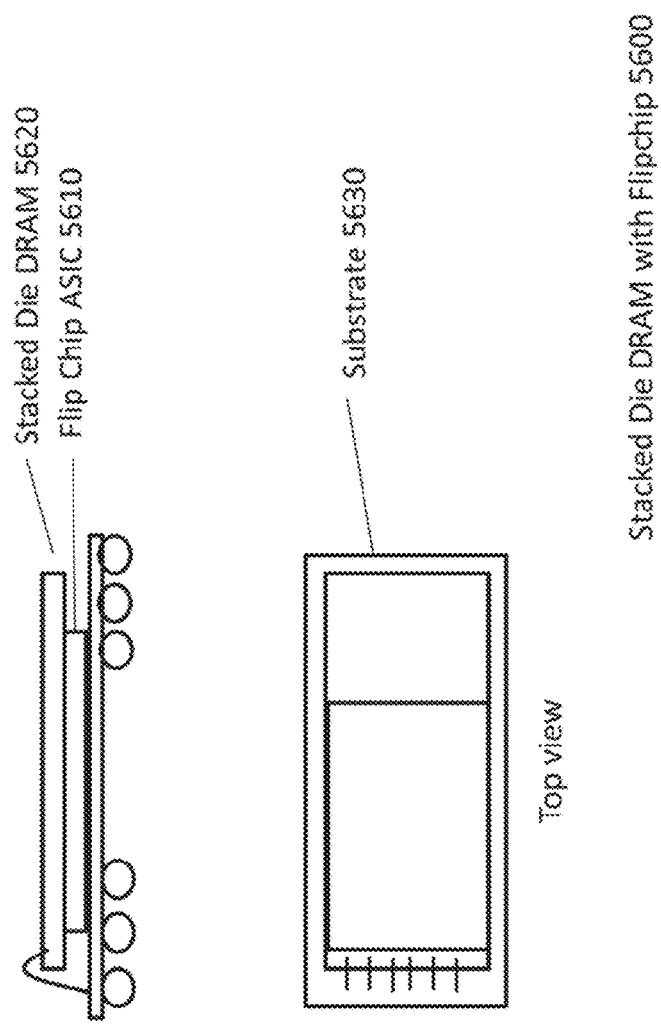
FIG. 56 shows an LPC DRAM stacked with a Flip Chip ASIC in a multi-die package.

FIG. 56 shows a multichip stacked die arrangement 5600 using a flip chip controller ASIC 5610 and a face up wirebonded memory 5620 using the LPC DRAM. The small number of signals used by the LPC DRAM offers benefits for the routing of the high speed memory signals in the substrate. Because there are a small number of signals dispatched along one edge of the memory die the signals can be kept in close proximity on the ASIC die. The substrate routing is simple using a small number of length-matched signals. The number of signals used by the LPC memory interface is less than a conventional memory so the amount of ASIC die area for said interface can be less and that may lead to a smaller ASIC die.

Figure 57:
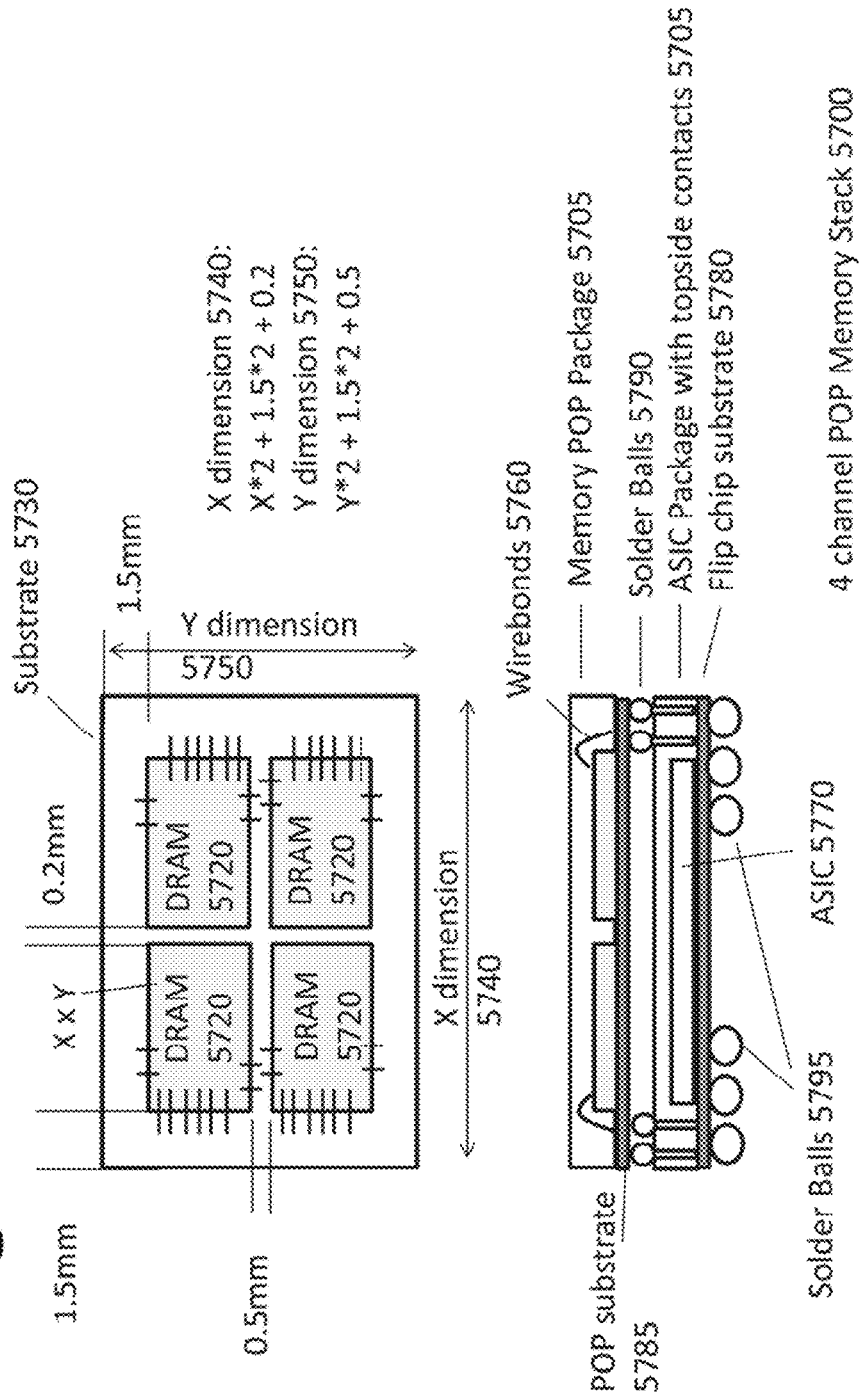
FIG. 57 shows a four channel high bandwidth POP Memory Stack using planar mounted LPC DRAM.

FIG. 57 shows a four channel POP MCP 5700 made using the LPC DRAM 5720. Four LPC DRAM die 5720 are placed on a common substrate and wirebonded in a face-up configuration. The small signal count of the LPC DRAM requires only 88 switching signals to be transferred between the four die and the ASIC. By using a POP packaging scheme 5705 for the four LPC DRAM die, a small memory/ASIC PCB footprint is possible while delivering over 12 GigaBytes/sec. Because the high speed memory signals are small in number and placed at the edge of the memory die, the electrical path length for connecting the memory to the controller can be made short and easily matched while requiring very few signal routing layers in the two substrates 5780, 5785. The small number of switching signals can allow relaxed signal pitch for the vertical interconnect technology in the lower package containing the ASIC 5705. Using relaxed pitch POP technology reduces cost by permitting the use of low cost POP packaging technology.

Figure 58:
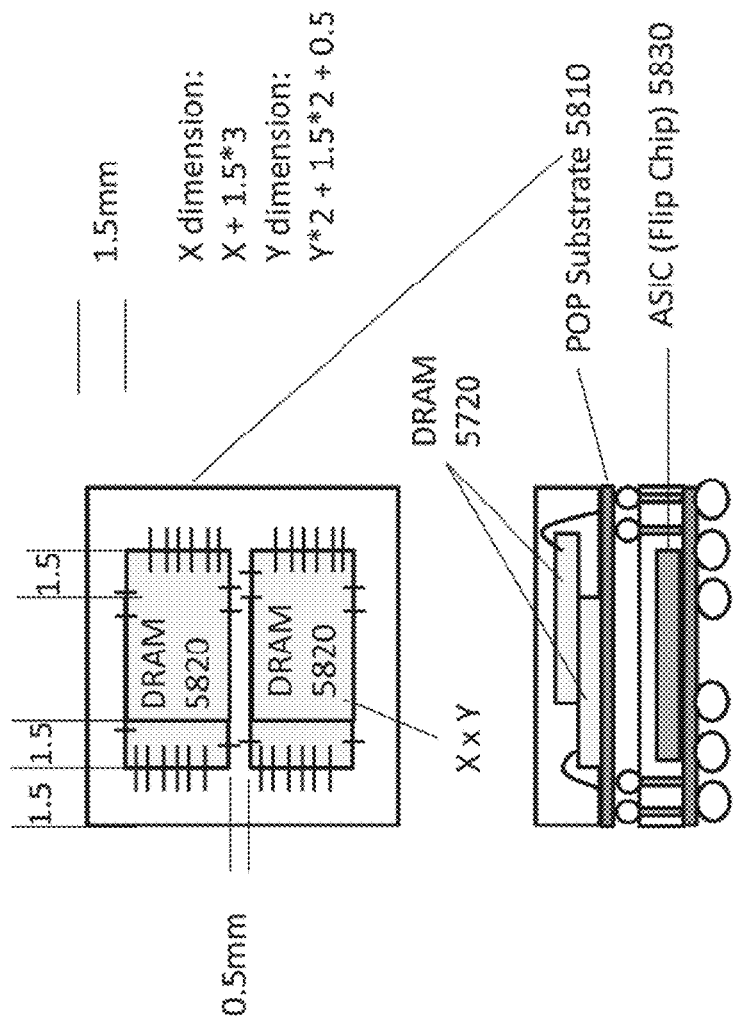
FIG. 58 shows a four channel high bandwidth POP Memory Stack using stair-step stacked LPC DRAM.

FIG. 58 shows another arrangement of four LPC DRAM die arranged into a four-channel POP package. This configuration contains two stairstep-stacked DRAM stacks with opposite facing wirebonds 5720. This configuration can permit a smaller total footprint size for the POP than the planar four die arrangement shown in FIG. 57.

Figure 59:
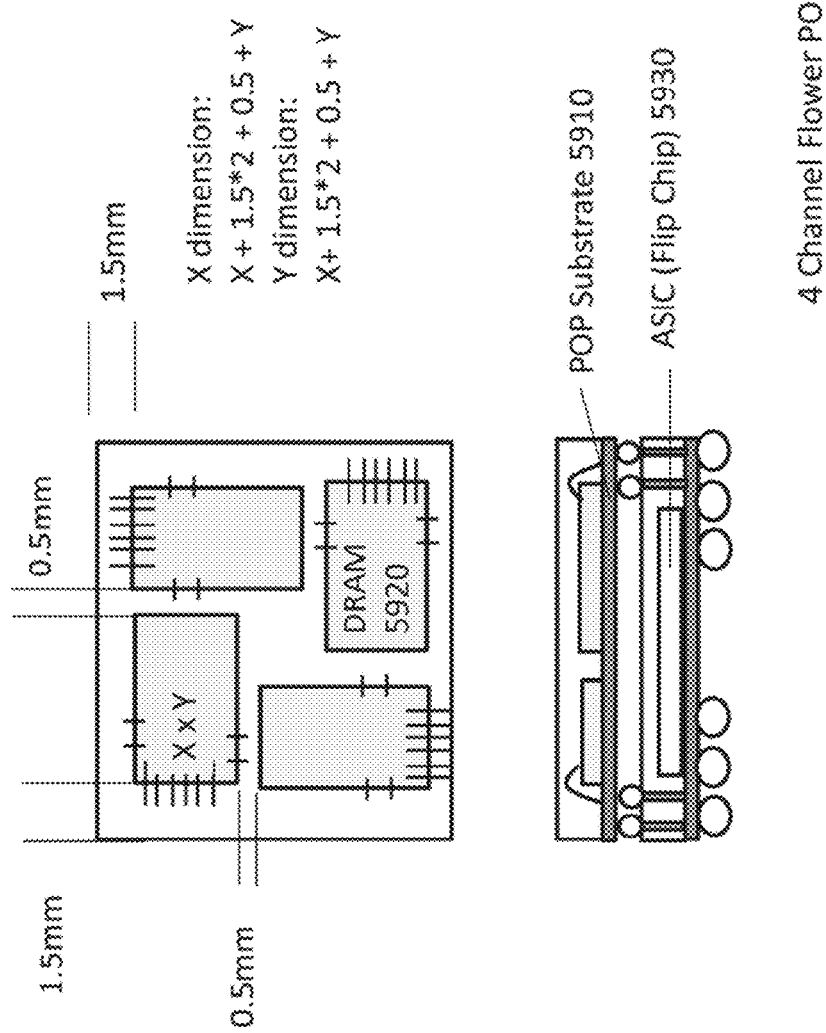
FIG. 59 shows a four channel high bandwidth POP Memory Stack using an alternate planar arrangement of LPC DRAM die.

FIG. 59 shows another four die planar arrangement 5900 that is designed to result in a square footprint and with an memory channel assigned to each side of the memory POP package.

Although three multi-die/multi-channel memory packages for POP usage have been shown, these in no way limit the application of the invention. These are examples intended to illustrate the advantages offered by the low pincount architecture when it comes to mechanical layout for packaging interconnection schemes.

X8 Version: Additional Pincount Reduction

Figure 60:
FIG. 60 is a diagram showing the signals connecting to the x8 LPC DRAM.

The LPC DRAM can be built using an 8 bit wide data bus. FIG. 60 shows switching signals for the x8 LPC DRAM 6000. The Data Bus 510 is 8 bits in width. The other signals operate in the same way as the x16 version described in this document.

Figure 61:
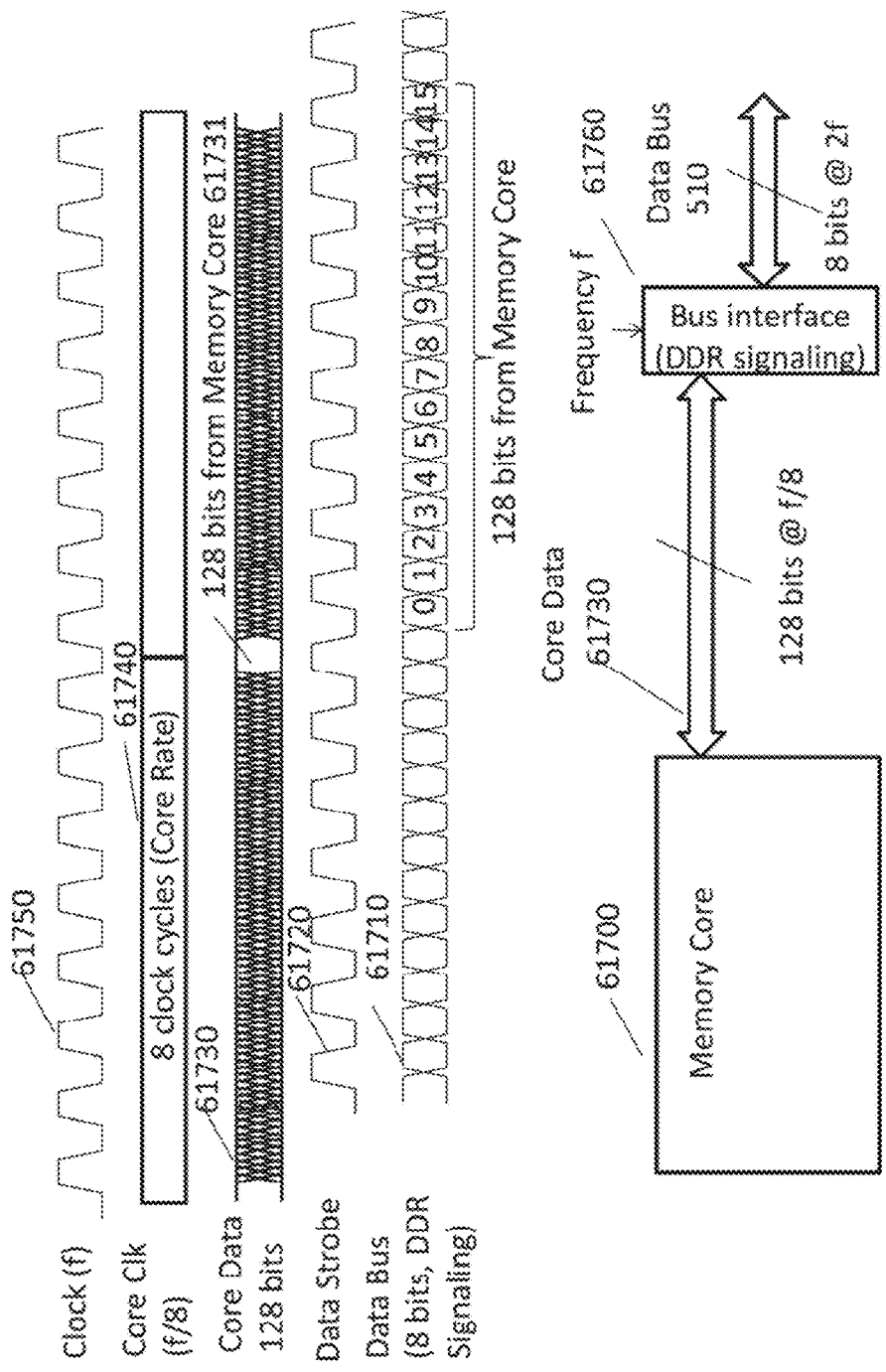
FIG. 61 is a diagram showing bandwidth matching between a moderate speed memory core and a high speed external port.

The core operation is shown in FIG. 61. Like the x16 version the external bandwidth matches internal bandwidth. Similar circuit clocking constraints apply so the same 8:1 clocking ratio is maintained. The result is a 128 bit wide Core Data path width 61730 with an external Data Bus 510 of 8 bit width.

Figure 62:
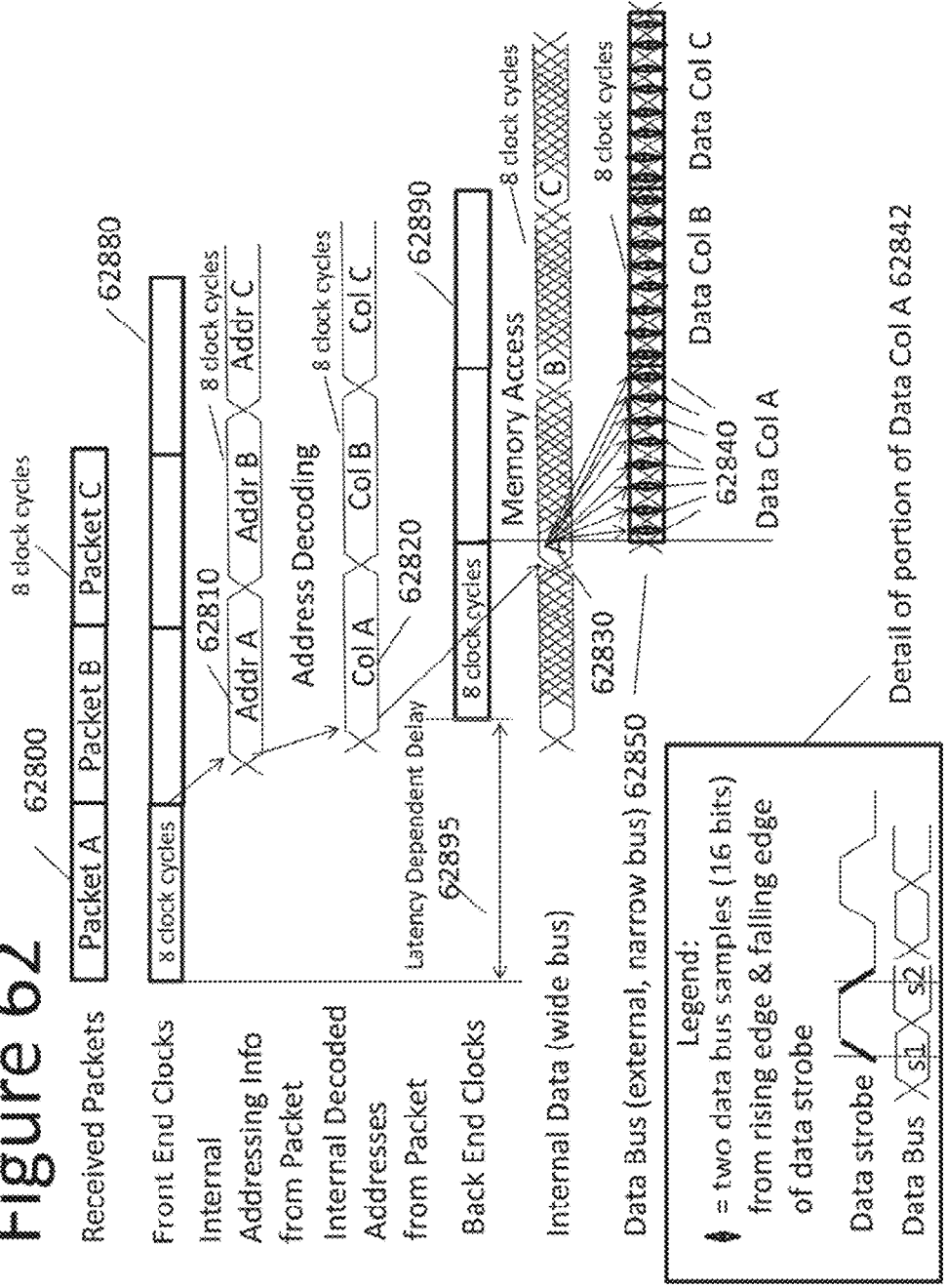
FIG. 62 is a timing diagram showing pipelined addressing and data accessing in the x8 LPC DRAM using front end and back end clocking systems.

FIG. 62 shows the major internal pipeline signals. The external data bus 510 is sampled twice per clock for a total of 16 bits transferred per clock cycle. Once the request packet is received decoding and pipelining work as in the x16 device. The primary difference is that it takes twice as many clocks to transfer a parallel request packet versus a x16 device.

Figure 63:
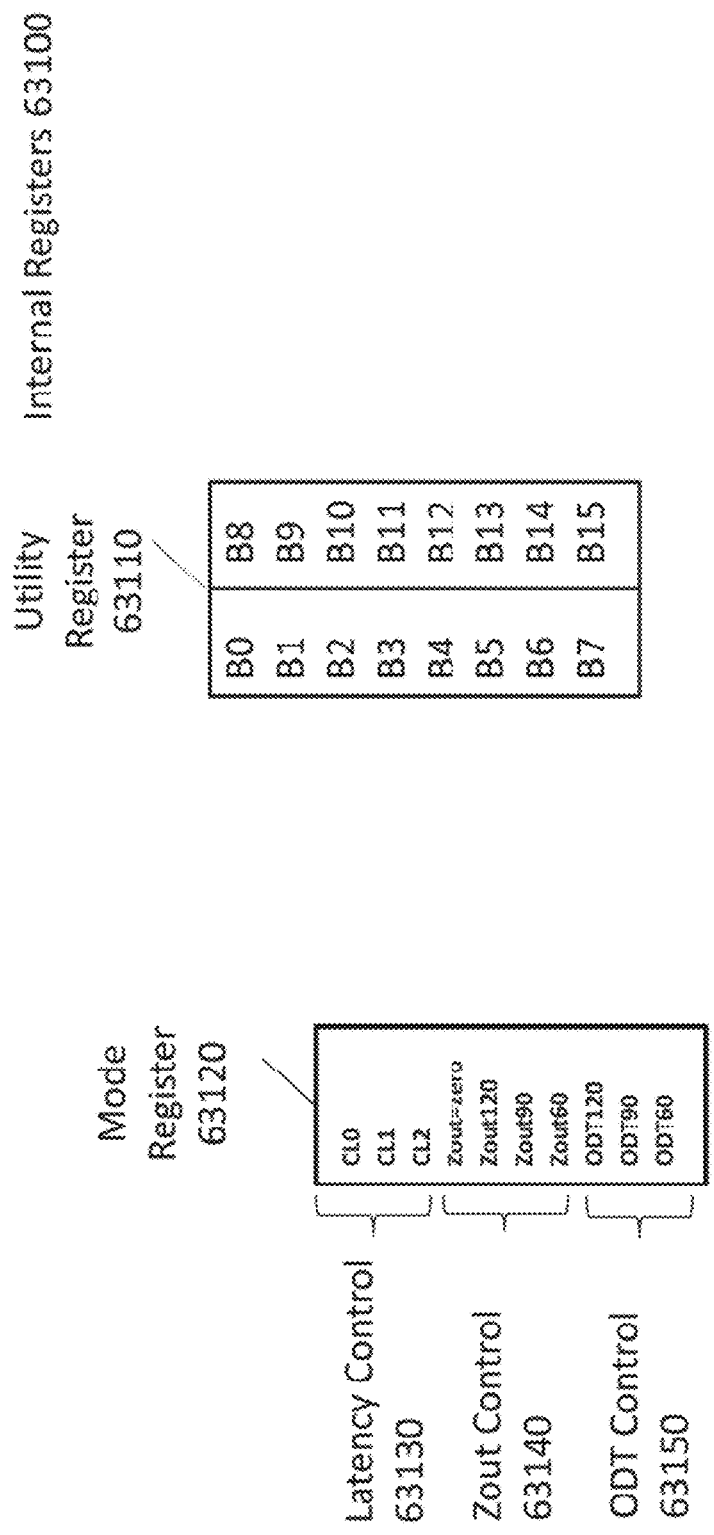
FIG. 63 shows internal registers of the x8 LPC DRAM.

FIG. 63 shows the internal registers 63100 of the x8 LPC DRAM. The Utility Register 63110 contains a total of 16 bits.

Figure 64:
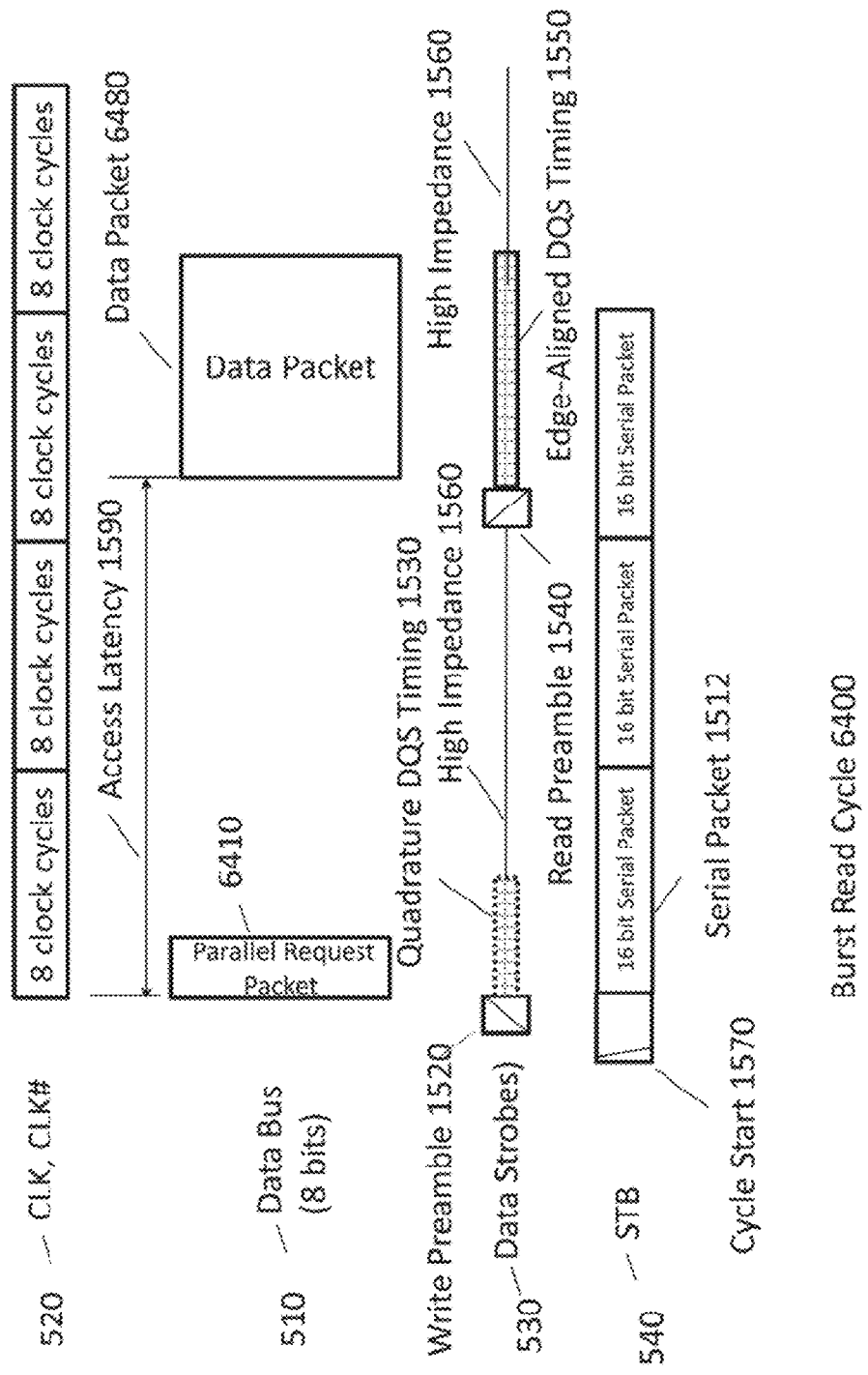
FIG. 64 is a timing diagram showing a Burst Read Operation of the x8 LPC DRAM.

FIG. 64 shows a Burst Read Cycle 6400 using the x8 LPC DRAM. The first two clock cycles are required to transmit the 32 bit Parallel Request Packet 6410 across the 8 bit wide Data Bus 510.

Figure 65:
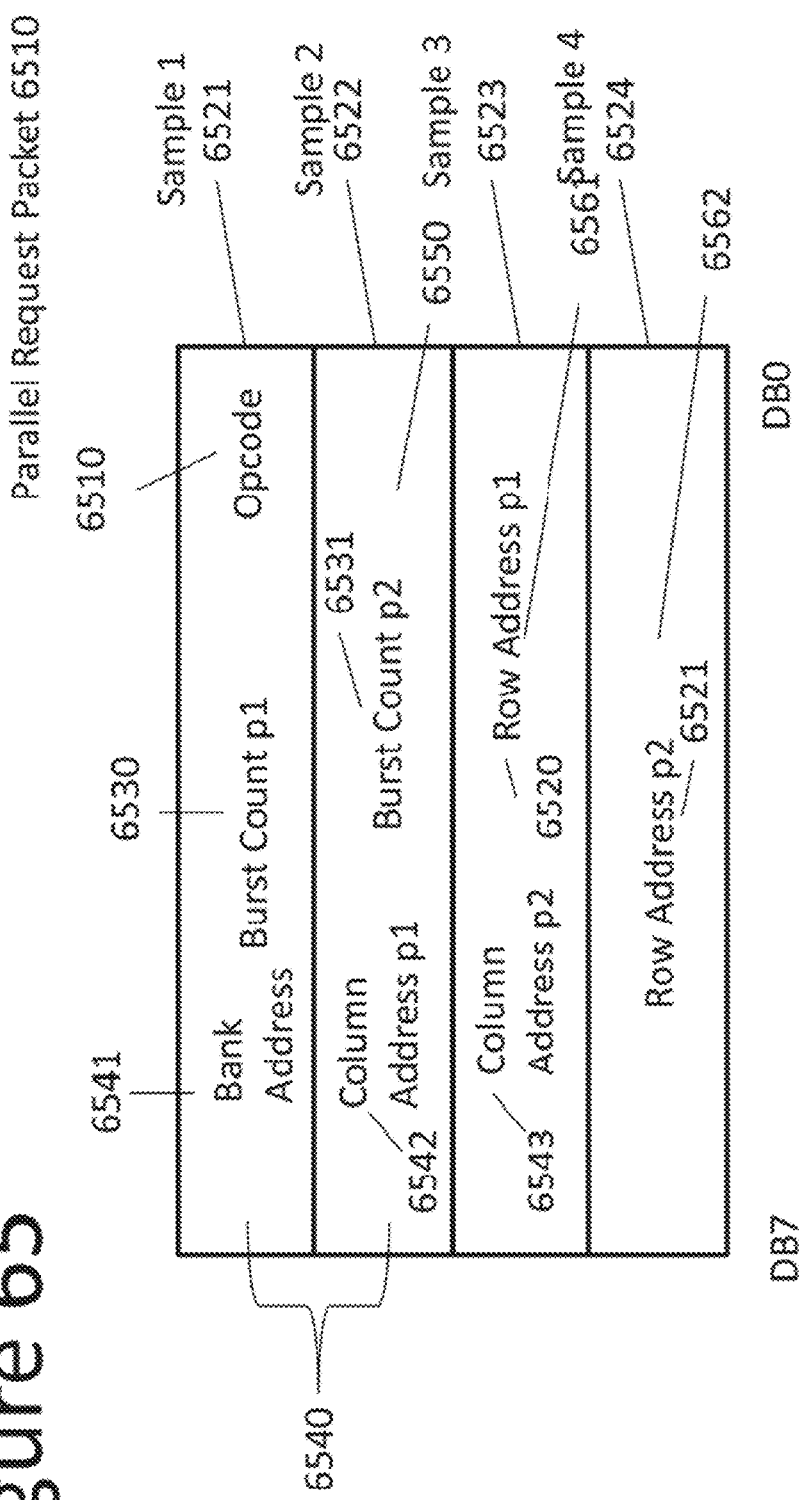
FIG. 65 is a diagram showing an x8 LPC DRAM Parallel Request Packet.

FIG. 65 shows a Parallel Request Packet bit mapping for the x8 LPC DRAM. The same information used by the x16 version of the LPC DRAM is contained within the x8 Parallel Request Packet 6510 but is transferred in 2 clock cycles over the 8 bit wide bus. As a consequence the bit mappings are apportioned differently. It is advantageous to transmit the Opcode 6510 in the first bus sample 6521. This diagram shows an example of the bit mapping and is not important for the overall practicing of the invention. Other bit assignments can provide the information used by in the control and addressing of the LPC DRAM.

Figure 66:
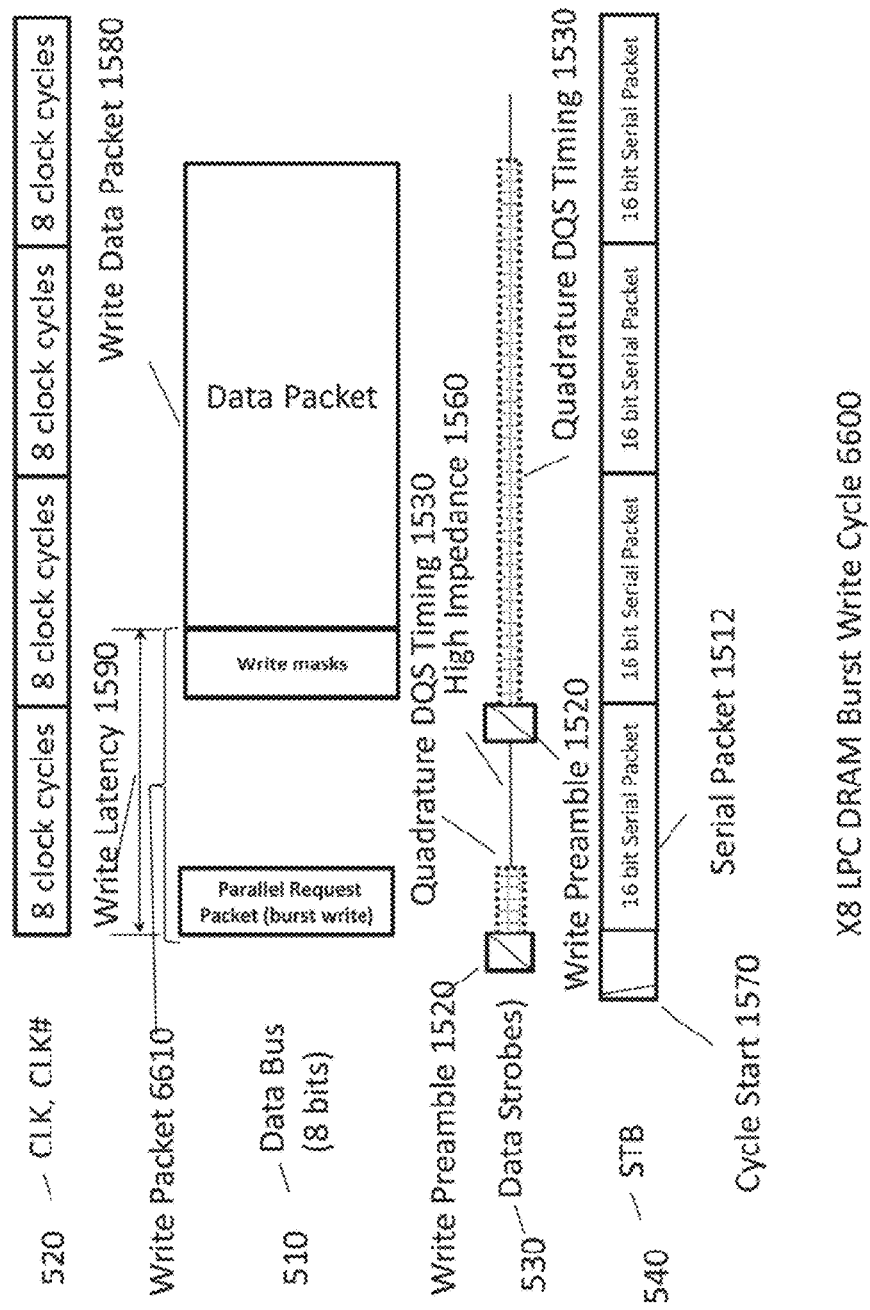
FIG. 66 is a timing diagram showing an x8 LPC DRAM Burst Write Operation.

FIG. 66 shows a Burst Write Cycle 6600 for a x8 LPC DRAM. The Parallel Request Packet 6610 is sent over the 8 bit wide Data Bus 6610 in two clock cycles with the mask requiring another two clock cycles.

Figure 67:
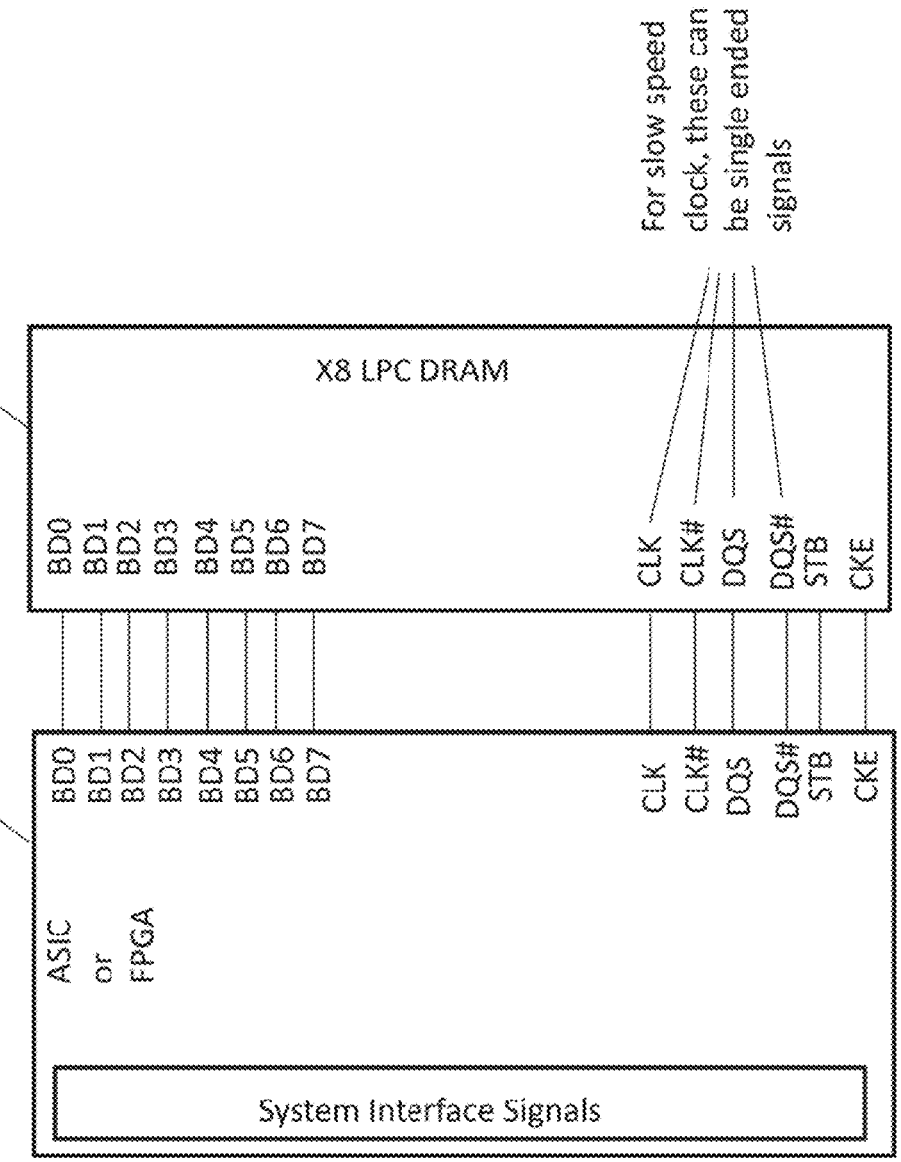
FIG. 67 shows signals used to interconnect an x8 LPC DRAM used with an FPGA with each chip in a separate package.
Figure 68:
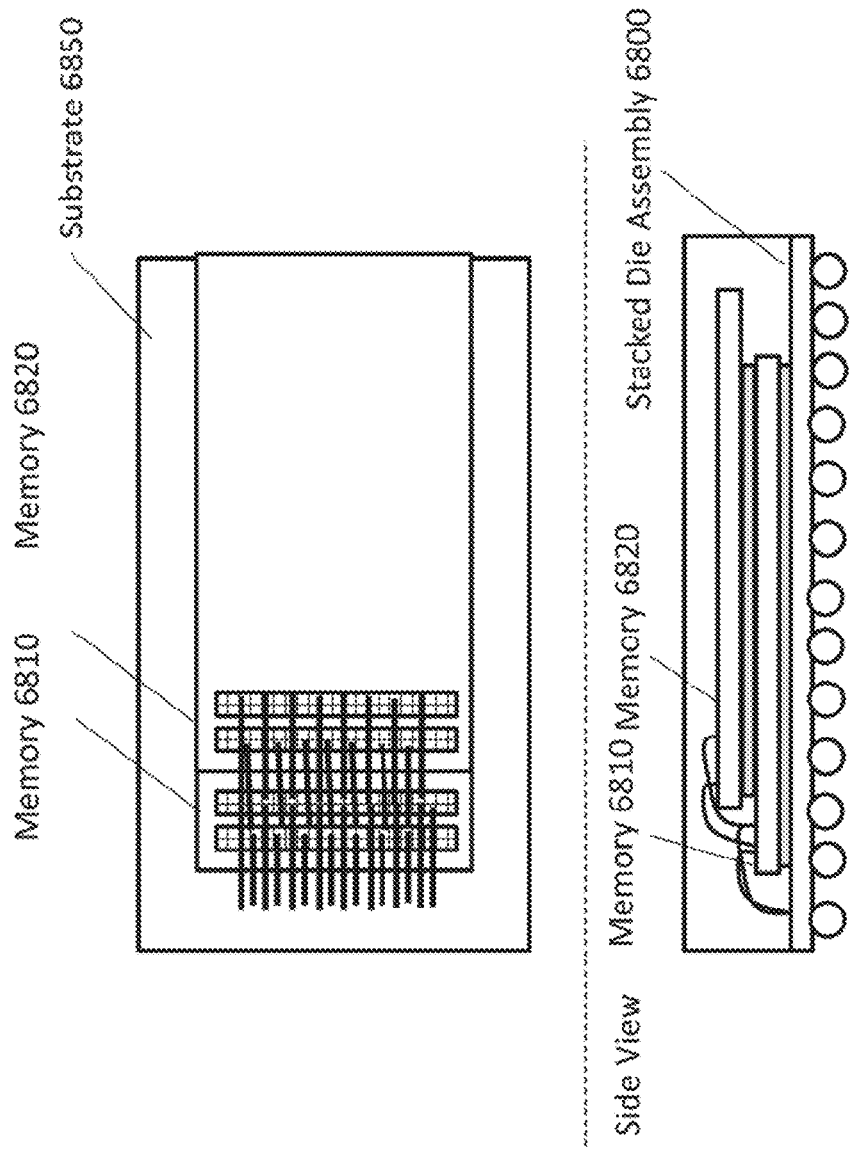
FIG. 68 is a diagram showing a stacked die dual die memory package containing two die compatible with the LPC Memory Bus.

FIG. 67 shows a system usage of the x8 LPC DRAM (6000) using an ASIC or FPGA (67100). A total of 14 switching signals are used to interconnect the two devices. For reduced clock frequencies such as below F=300 MHz, it is feasible to use single ended Clock and Data Strobe signaling. This reduces the signal count to a total of 12 for slow speed x8 type device Multi-Drop Configurations FIG. 68 shows a dual die MCP 6800 using memory die compatible with the LPC Memory Bus specification. The die can be identical or can be different types of memory. In this case two memory die are 6810 and 6820 are stairstep stacked with wirebonding used to connect them to the substrate below. The assembly is overmolded.

Figure 69:
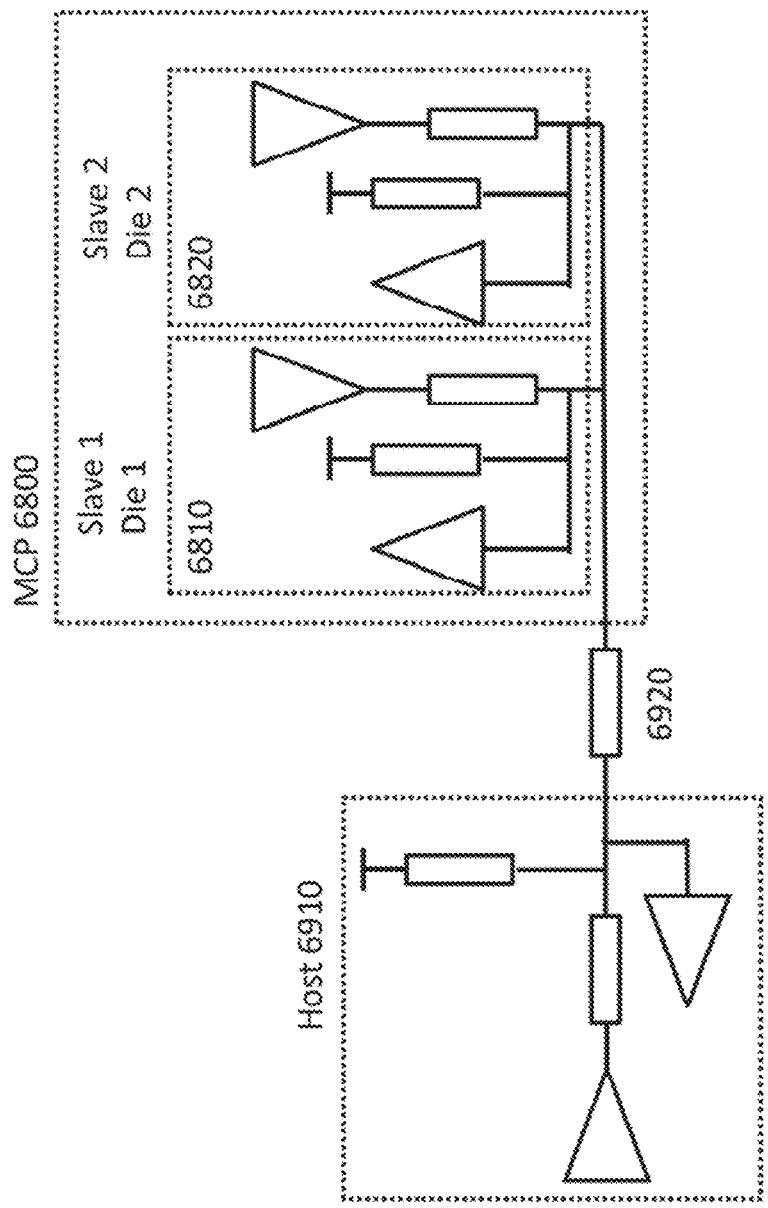
FIG. 69 is a schematic diagram of a bus signal used in the dual die memory package from FIG. 68
Figure 70:
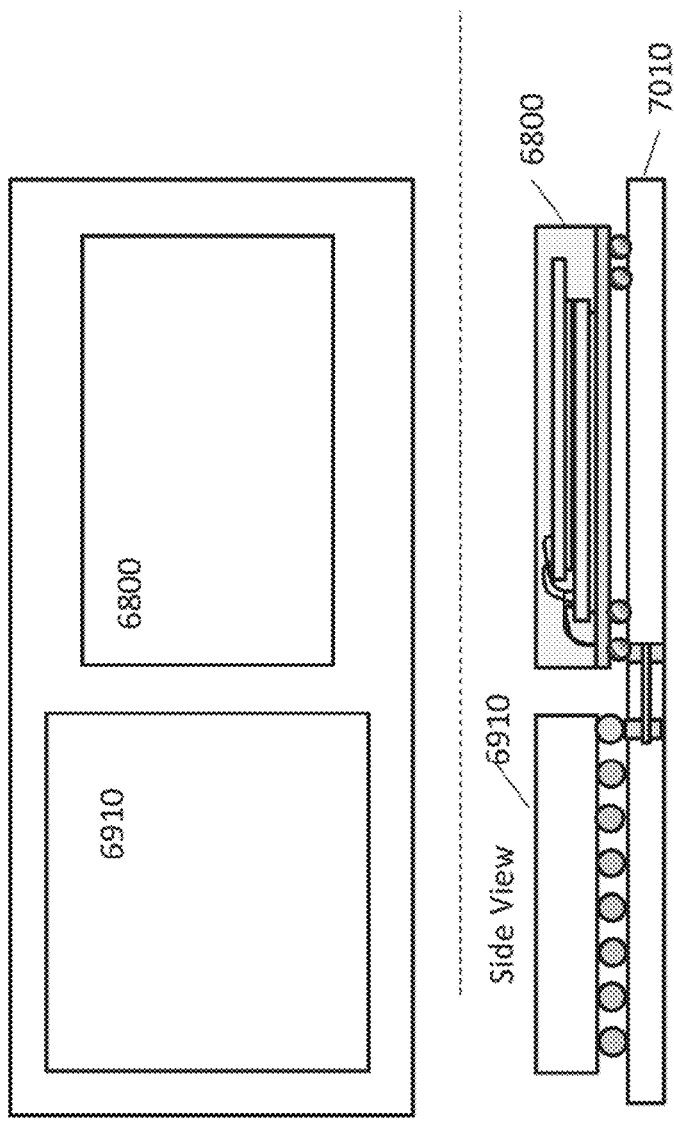
FIG. 70 is a PCB configuration showing a controller and a multi-die memory package from FIGS. 68 and 69.

FIG. 69 shows the schematic representation of a single bidirectional signal used in the LPC Memory Bus as deployed as shown in FIGS. 68 and 70. The Host 6910 is separately packaged from the memory 6800 which has two die 6810 and 6820 placed in the same package on a common bus 6920. It is not necessary to place both memory die in the same package when multiple memory die are used on a common bus. Each memory die can be separately packaged or it is possible to put all three die in a common package. The programmable ODT and output impedances of drivers give flexibility for designers to use the best packaging scheme for their application yet not have to compromise signal integrity.

FIG. 70 shows a host 6910 and an MCP memory 6800 each using the LPC Memory bus and interconnected on a common PCB 7010.

Bus Width and Capacity Scaling

Figure 71:
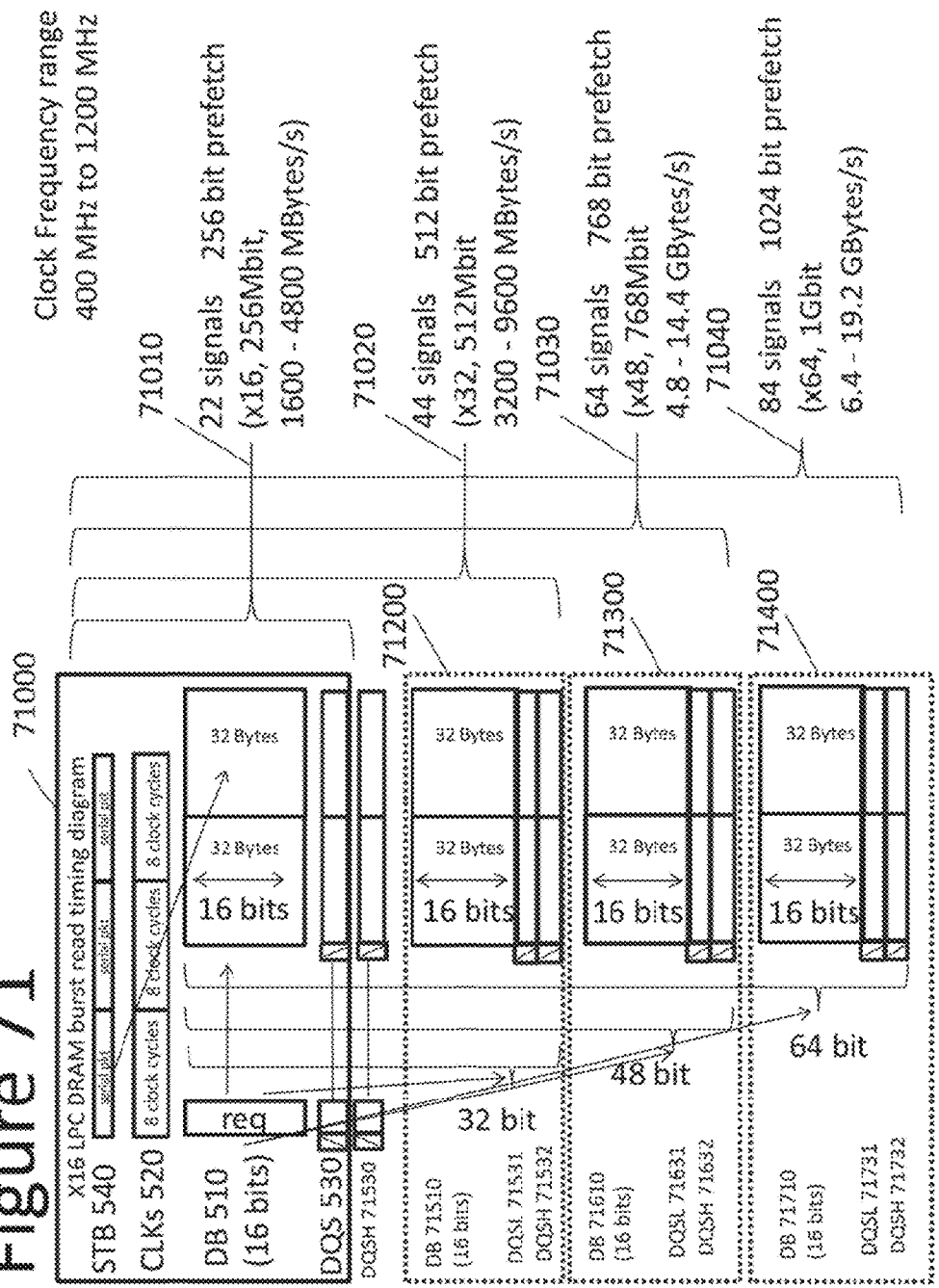
FIG. 71 shows burst read timing diagrams for wider-bus implementations of the LPC DRAM, including x32, x48 and x64 versions.

FIG. 71 shows timing diagrams for wider bus implementations of the LPC DRAM and Bus. The basic LPC DRAM burst read cycle 71000 operates like the x16 LPC DRAM. For the x32 version 71020 a 16 bit extension 71510 is added to the Data Bus. Differential bidirectional Data Strobes are used over each 8 bit field of the data bus 530, 71530, 71531, 71532. For the x48 version 71030, an additional 16 bit field 71610 is added to the data bus along with two more differential bidirectional bytewide data strobes 71631 and 71632. The x64 version 71040 has another 16 bit wide field 71710 added along with two more differential bidirectional bytewide data strobes 71731 and 71732.

For a given clock frequency, the wider versions of the LPC DRAM, 71020, 71030 and 71040 offer additional bandwidth in proportion to the width of the LPC DRAM's data bus when compared to the x16 LPC DRAM data bus. For the x64 LPC DRAM, the bandwidth would therefore be 4 times larger than from the x16 version. The bandwidth can be scaled in this manner to accommodate different bus widths. Data strobes may be used with 16 bit data bus fields, 8 bit data bus fields, 9 bit data bus fields or any other value and not deviate from the spirit of the invention.

For the x64 version the LPC DRAM has 84 switching signals, with 80 of them being Data Bus signals or Data Strobe signals.

Figure 72:
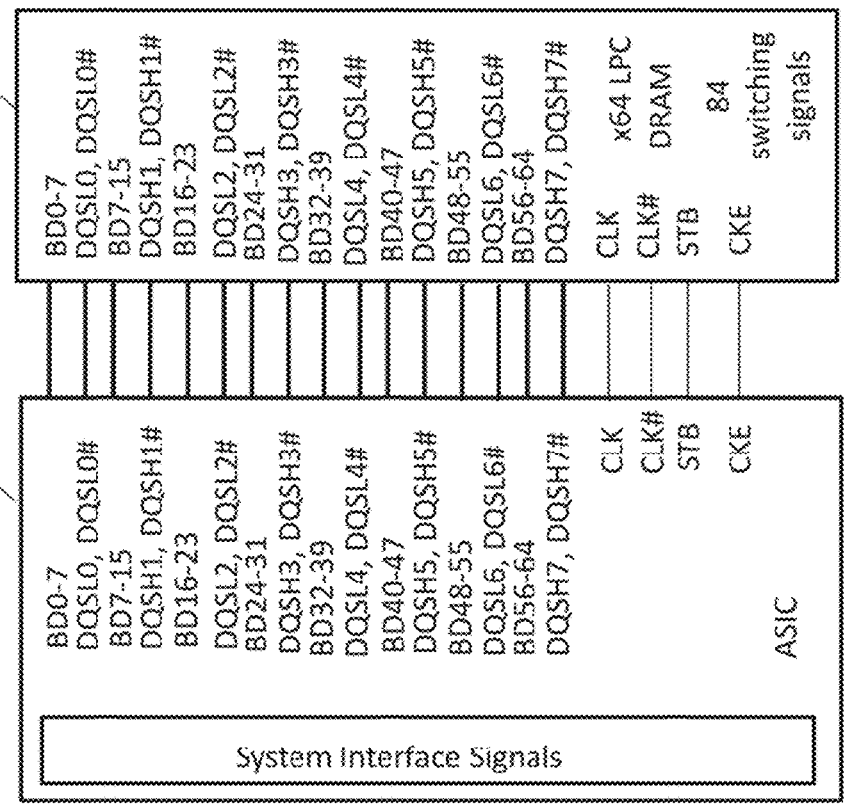
FIG. 72 shows a system interconnection diagram for an x64 LPC DRAM and an ASIC.

FIG. 72 shows a system interconnection diagram wherein an ASIC 72100 is connected to a x64 LPC DRAM 71040. There are a total of 84 switching signals used to interconnect the two ICs.

Figure 73:
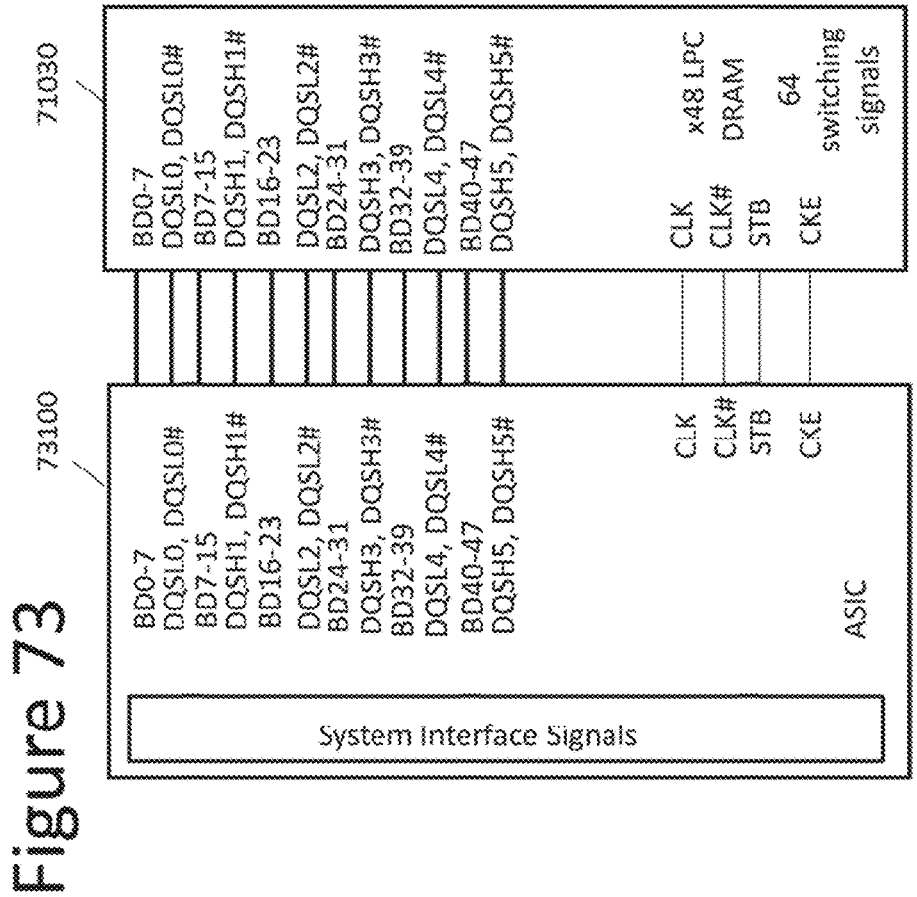
FIG. 73 shows a system interconnection diagram for an x48 LPC DRAM and an ASIC.

FIG. 73 shows a system interconnection diagram wherein an ASIC 73100 is connected to a x48 LPC DRAM 71030. There are a total of 64 switching signals used to interconnect the two ICs.

Figure 74:
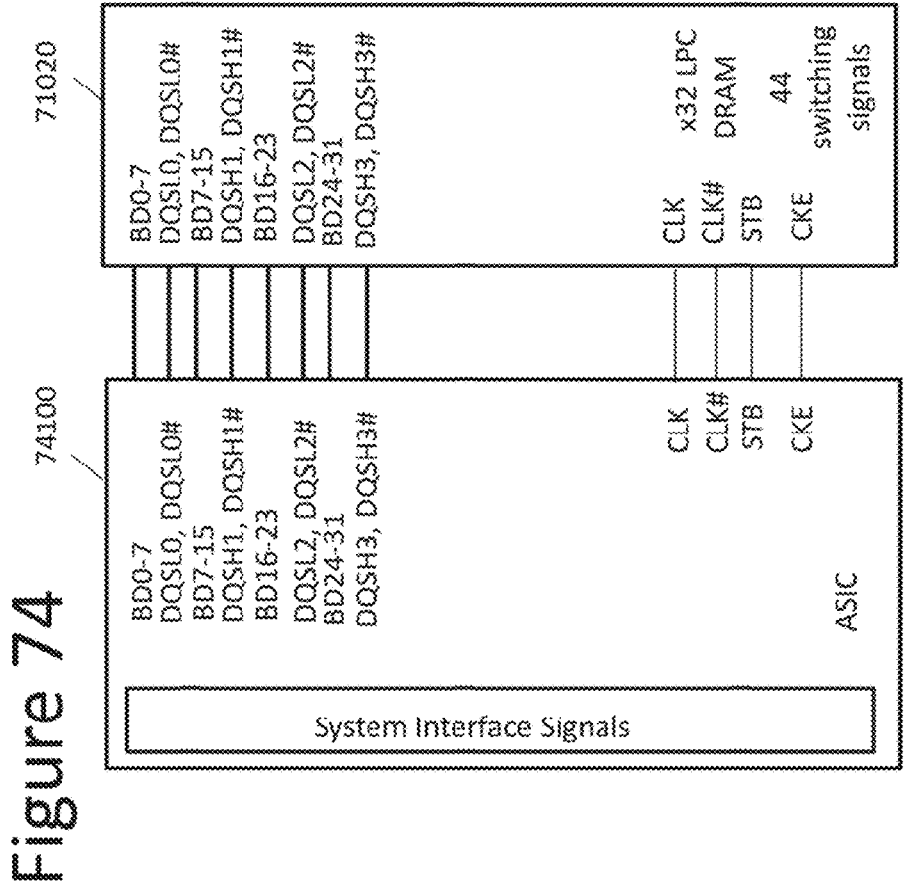
FIG. 74 shows a system interconnection diagram for an x32 LPC DRAM and an ASIC.

FIG. 74 shows a system interconnection diagram wherein an ASIC 74100 is connected to a x32 LPC DRAM 71020. There are a total of 44 switching signals used to interconnect the two ICs.

The wider bus versions of the LPC DRAM, 71020, 71030, 71040, have higher bit capacity than the x16 version in proportion to the bus width ratio. For a x64 LPC DRAM, the memory capacity is increased by a factor of four compared to the x16 LPC DRAM.

The prefetch size is also increased in proportion to the bus width ratio. The x64 LPC DRAM therefore has a prefetch size four times larger than the x16 LPC DRAM. In this way as bandwidth is scaled by adding bus width, so capacity is also scaled. The architecture of the LPC DRAM therefore maintains a substantially constant bandwidth/capacity ratio. For video display scaling, a factor of four pixel count increase may be combined with a boosting of the number frame buffer storage bits and frame buffer bandwidth by the same factor of four. The LPC DRAM architecture can therefore support a family of ASIC video controllers that can support a range of different display resolutions and memory bandwidth.

Figure 75:
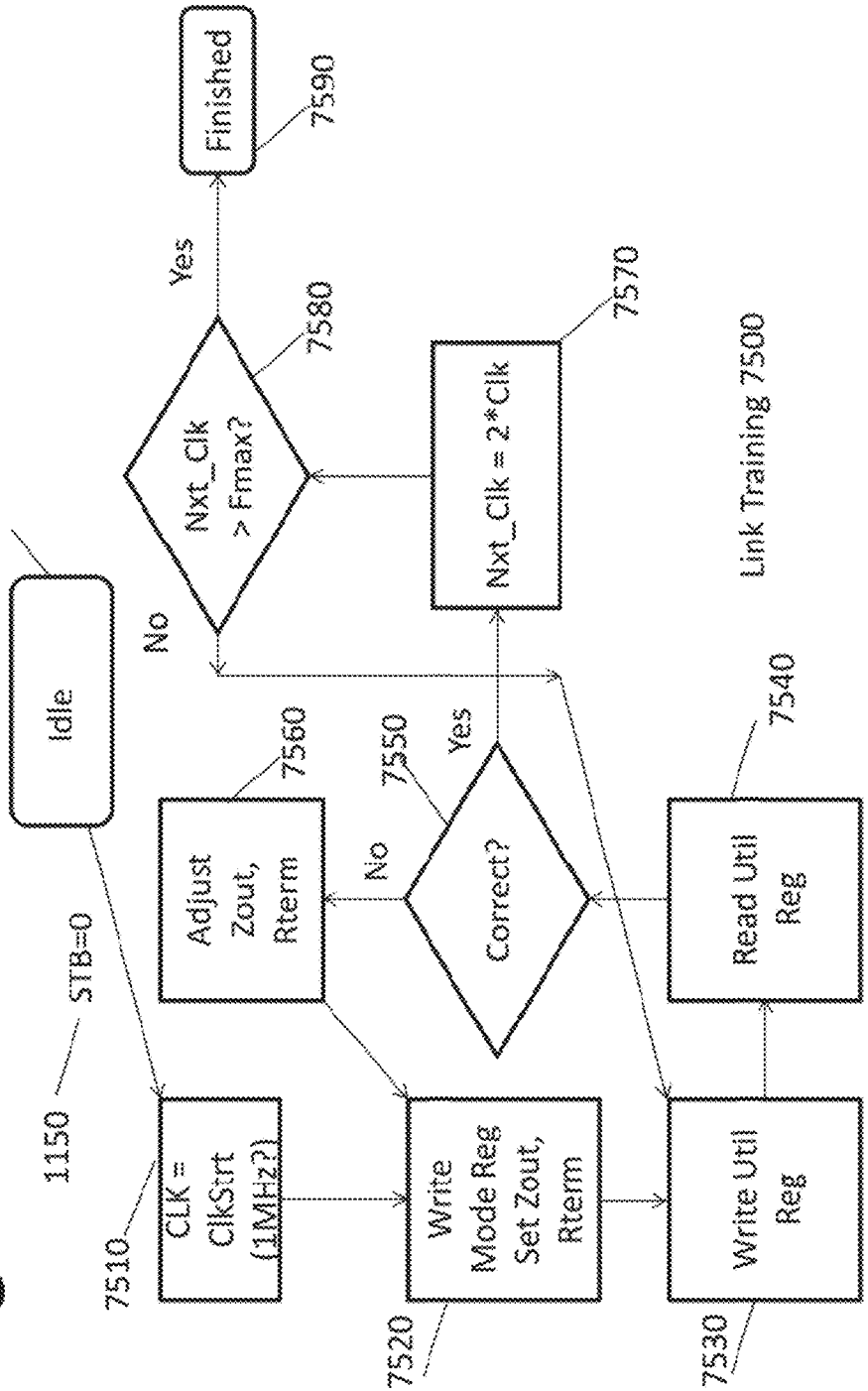
FIG. 75 is a flow chart showing a way to train the output and termination impedance values using the Utility register.

FIG. 75 shows a flow chart for an algorithm that can be used for setting the output impedance and optional ODT termination impedances using the Utility Register. The memory device is initially operated with a low frequency clock, in this example 1 MHz 7510. The output impedance Rseries 45496 is initially set to a default low impedance and the optional Rterm 45493 is set to a default intermediate impedance 7520. The Utility Register is then written with a selected data pattern 7530 and then is read back 7540 and compared 7550 to the value written. If the patterns don't match 7560, an algorithm is used to adjust the said output impedances 7520 and or said termination impedances. Said Utility register is written with a new data pattern 7530 and then read back 7540 and compared 7550 against the written data. If the patterns match then the clock frequency is adjusted, in this example doubled 7570 and then compared against the upper clock frequency limit 7580 and the cycle repeats until the desired operating frequency is reached 7590.

System Physical Packaging

Figure 76:
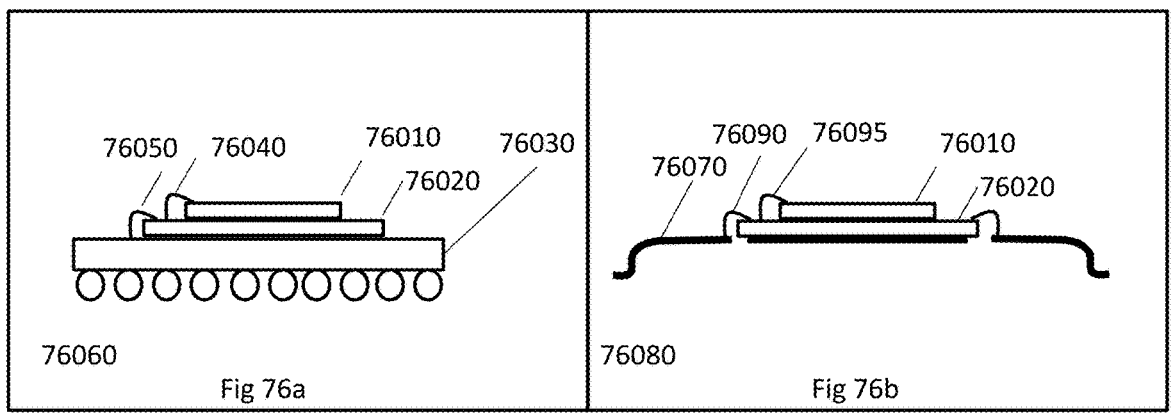
FIG. 76 shows cross section drawings of two different stacked die arrangements of the LPC DRAM and a controller placed into a common package and using wirebond technology.

FIG. 76 shows two stacked die arrangements of an LPC DRAM 76010 and a controller 76020 with the bus signals interconnected together using bondwires 76040 and 76095. In FIG. 76a the two die stack is disposed on a substrate 76030 forming a stacked die package assembly 76060. In FIG. 76b the two die stack is shown disposed on a leadframe 76070 forming a stacked die package assembly 76080. In both cases overmolding encapsulation is not shown for simplicity.

Figure 77:
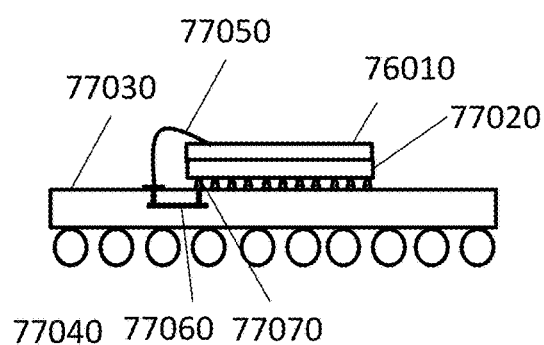
FIG. 77 shows a cross section drawing of a stacked die combination of the LPC DRAM and a controller placed into a common package and using wirebond and flip-chip technology.

FIG. 77 shows a stacked die arrangement of an LPC DRAM 76010 and a controller 77020. The controller 77020 is coupled to a flip-chip substrate 77030 using flip-chip technology. Bondwires 77050 couple bus terminals of the LPC DRAM to conductors 77060 disposed on the flip chip substrate 77030 that couple to flip-chip bumps 77070 coupled to the bus interface terminals of the controller 77020.

Figure 78:
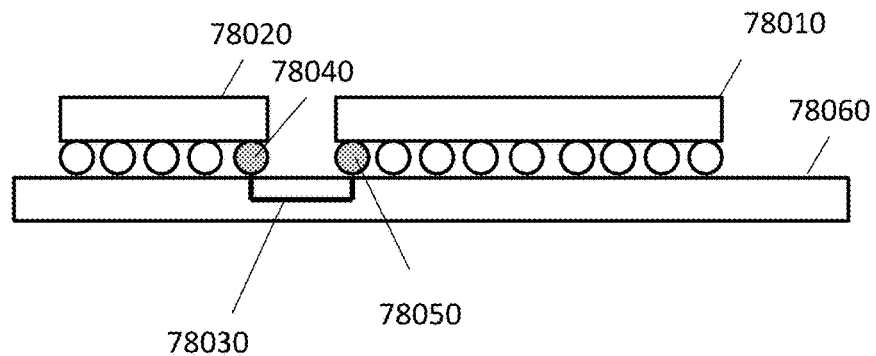
FIG. 78 shows a cross section drawing of a packaged LPC DRAM and a packaged controller IC disposed on a common substrate.

FIG. 78 shows an LPC DRAM 78020 and a controller 78010 each disposed in separate packages and both disposed on a common substrate 78060. Bus terminals 78040 for LPC DRAM 78020 couple to conductors 78030 disposed on substrate 78060 to couple to controller bus terminals 78050. One such bus conductor path is illustrated for simplicity. The remaining bus conductors are coupled chip to chip in the same way.

Figure 79:
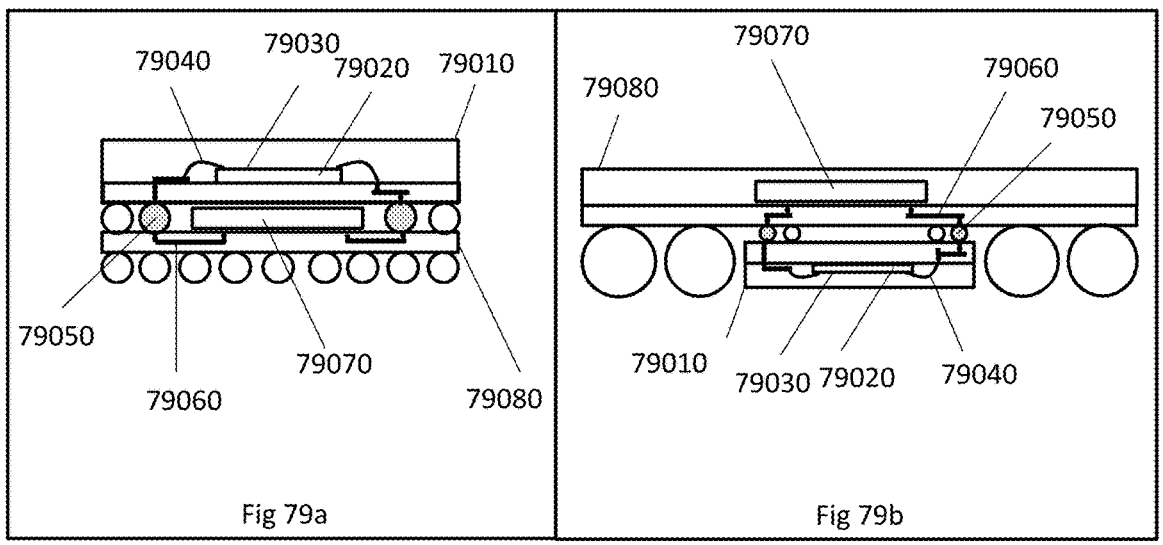
FIG. 79 shows two different configurations of package on package stacking of an LPC DRAM and a memory controller.

FIG. 79 shows package-on-package combinations of a packaged LPC DRAM 79010 and a controller 79080. In both FIG. 79a and FIG. 79b the LPC DRAM die 79020 is disposed in a package 79010 with external terminals 79050 coupled to conductors 79060 disposed on controller package 79080 such that the bus interface terminals of the LPC DRAM are coupled to the corresponding bus interface terminals of the controller. FIG. 79a shows the memory package disposed on the top surface of the controller package 79080. FIG. 79b shows the LPC memory package 79010 disposed on the underside of the controller package 79080.

Figure 80:
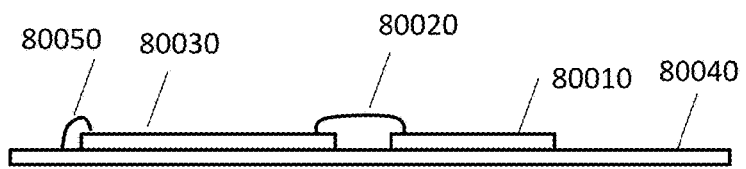
FIG. 80 shows an LPC DRAM die and a controller die disposed on a common substrate with wirebonds adapted to couple the bus interface terminals together.

FIG. 80 shows an LPC DRAM die 80010 and a controller die 80030 both disposed on a common substrate 80040. Bus terminals on each die are coupled to one another on a terminal by terminal basis with bondwires 80020 such that each bus interface terminal of the LPC DRAM is coupled to the corresponding terminal on the controller.

Figure 81:
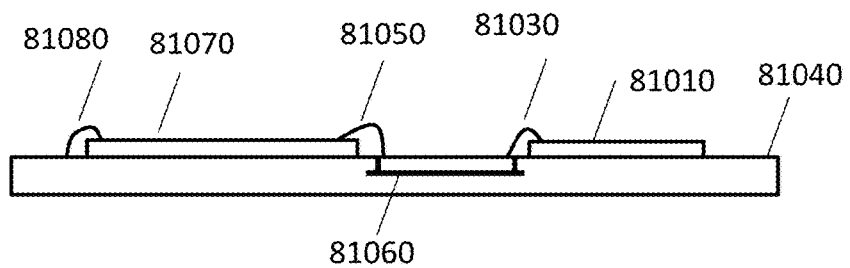
FIG. 81 shows an LPC DRAM die and a controller die disposed on a common substrate with wirebonds and substrate conductors adapted to couple the bus interface terminals together.

FIG. 81 shows an LPC DRAM 81010 and a controller 81070 both disposed on a common substrate 81040. Bus terminals of the LPC DRAM are coupled to the corresponding bus terminals of the controller using bondwires 81030 and 81050 coupled to the LPC DRAM and controller respectively and coupled to conductors 81060 disposed on the substrate 81040 such that each bus interface terminal of the LPC DRAM is coupled to the corresponding terminal on the controller.

Figure 82:
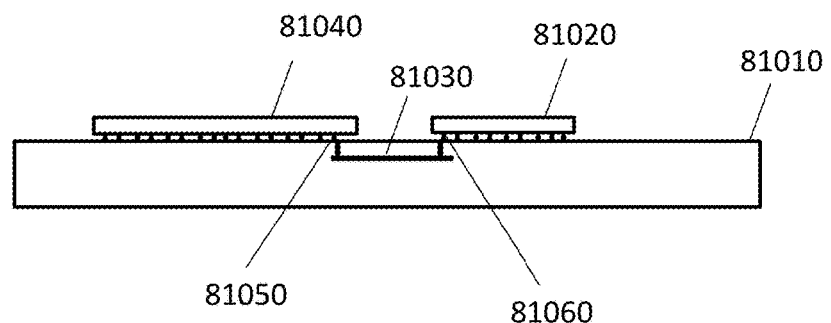
FIG. 82 shows an LPC DRAM die and a controller die disposed on a common flip-chip substrate with flip chip technology and substrate conductors adapted to couple the bus interface terminals together

FIG. 82 shows an LPC DRAM 81020 and a controller 81040 both disposed on a common flip chip substrate 81010. Bus terminals 81060 of the LPC DRAM are coupled to conductors 81060 disposed on the substrate using flip chip technology. Likewise bus terminals 81050 of the controller 81040 are coupled to conductors 81060 disposed on the substrate such that each bus interface terminal on the LPC DRAM is coupled to the corresponding terminal on the controller.

Figure 83:
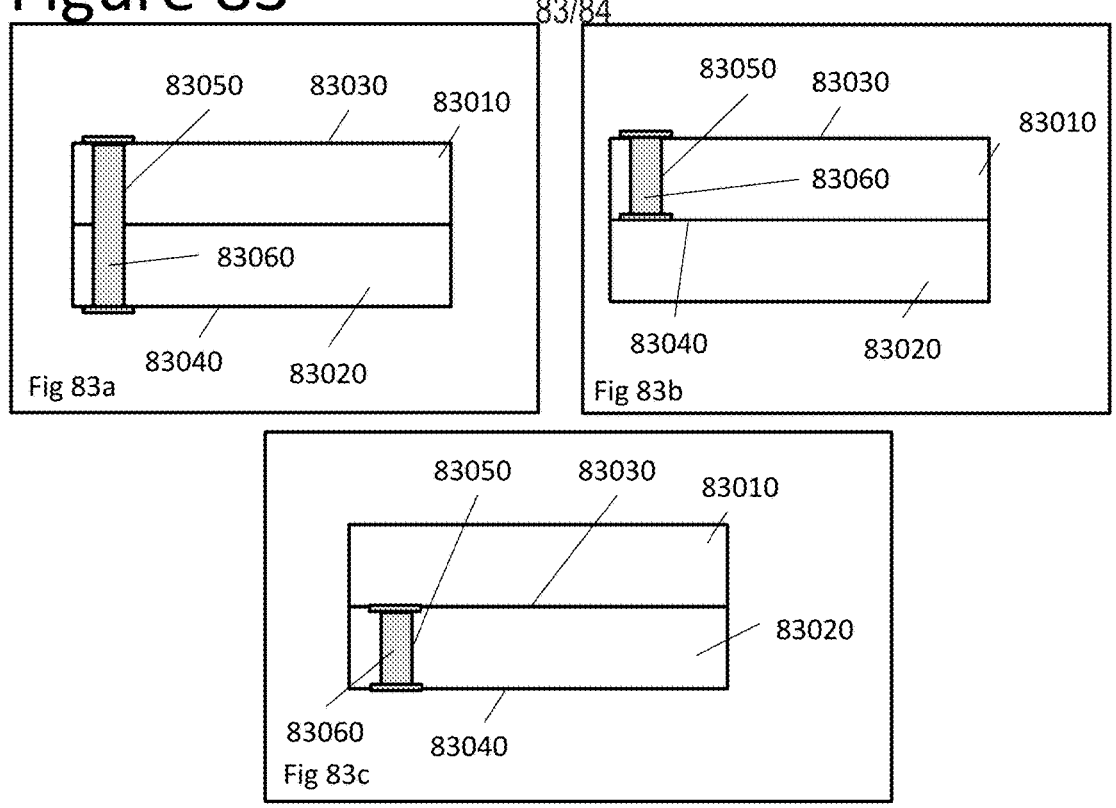
FIG. 83 shows three configurations for using through-silicon-via technology to couple bus interface terminals of an LPC DRAM die to bus interface terminals of a controller die.

FIG. 83 shows three different configurations for coupling an LPC DRAM's bus interface terminals to a controller's bus interface terminals with conductors formed using Through-Silicon-Via ("TSV") technology. The differences among FIG. 83a-83c consist of the direction the active surface of the DRAM and of the controller are facing. In FIG. 83a the active surface 83030 of the controller 83010 faces the opposite direction of the active surface 83040 of the LPC DRAM 83020. The TSV 83050 is formed in a channel etched through both ICs and is filled with a conductive metallic material 83060 such that an electrical connection is made to both ICs. In FIG. 83b the active surface 83030 of the controller 83010 and the active surface 83040 of the controller 83020 are facing in the same direction. As a consequence the TSV 83050 must pass through the controller IC only. In FIG. 83c the active surface 83040 of the LPC DRAM 83020 faces in the same direction as the active surface 83030 of the controller 83010 but with the TSV 83050 only penetrating the DRAM.

Figure 84:
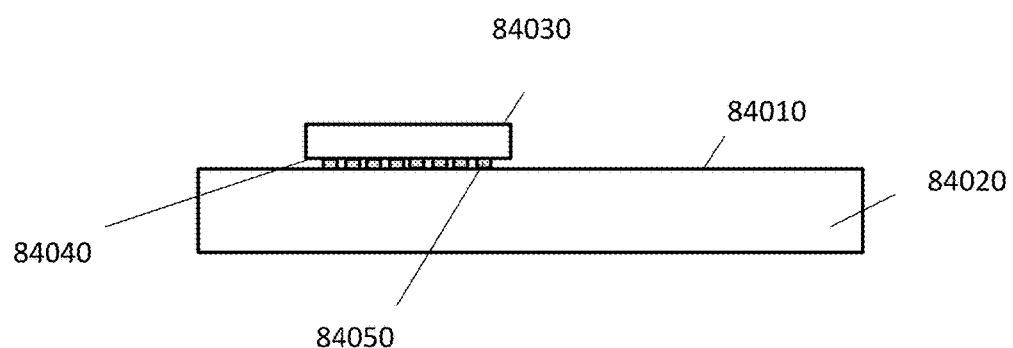
FIG. 84 shows an LPC DRAM die disposed on a controller die with face to face bumping used to couple the bus interface terminals of the LPC DRAM die to the bus interface terminals of the controller die.

FIG. 84 shows an LPC DRAM 84030 disposed on a controller IC 84020 such that the active surface 84040 of the DRAM 84030 faces the active surface 84010 of the controller 84020. Each bus interface terminal of the LPC DRAM is coupled to the corresponding bus interface terminal of the controller using metallic bumps 84050.

The foregoing example embodiments are advantageous in that they provide components useful for constructing a high bandwidth but low pincount memory to controller subsystem. The low pincount offers many benefits including reduced silicon area, reduced cost, reduced power, reduced physical size and offers numerous packaging options for a wide range of system deployment configurations.

As these and other variations and combinations of the features discussed above can be utilized without departing from the disclosure as defined by the claims, the foregoing description of the embodiments should be taken by way of illustration rather than by way of limitation of the disclosure as defined by the claims. It will also be understood that the provision of examples of the disclosure (as well as clauses phrased as "such as," "e.g.", "including" and the like) should not be interpreted as limiting the disclosure to the specific examples; rather, the examples are intended to illustrate only some of many possible embodiments.

The invention claimed is:

1. A bus configured to interconnect at least one memory storage integrated circuit (IC) to a controller IC, the bus comprising:
a plurality of electrical bus conductors configured to be electrically coupled to a collection of terminals on the memory IC and to corresponding terminals on the controller IC,
wherein the bus conductors are categorized in one or more of the following groups based on a type of signal transmitted through the bus conductor: a data bus group, a data strobe group, a clock group, a chip select group or a control group,
wherein the one or more bus conductors in the data bus group are adapted to transport a parallel command from the controller IC to the memory IC during a command transfer time and are further adapted to transport data between the memory IC and the controller IC using a burst mode during a data transfer time, and
wherein the one or more bus conductors in the control group comprise a single conductor adapted to transport a serial command from the controller IC to the memory IC during the data transfer time such that the serial command can direct the operation of the memory IC by providing address and data transfer control information to the memory IC.

2. The bus of claim 1, wherein the serial command includes an operation code specifying a function of the serial command, the function being one of a null operation function, a burst mode function, an activation function or a utility function, wherein the utility function includes means to command the memory IC to terminate an ongoing burst mode memory operation and includes means to command the memory IC to precharge banks contained therein.

3. The bus of claim 2, wherein the bus can transport a first serial command from the controller IC to the memory IC and immediately thereafter transport a second serial command to the memory IC.

4. The bus of claim 3, wherein the serial command provides for switching the bus operating mode between read mode and write mode and between write mode and read mode while the memory IC is performing a burst memory operation.

5. The bus of claim 1, wherein a width of the data bus is one byte, where a byte is a one of eight or nine bits, and wherein the data strobe group comprises two conductors.

6. The bus of claim 1, wherein a width of the data bus is two bytes, where a byte is a one of eight or nine bits, and wherein the data strobe group comprises two conductors.

7. The bus of claim 1, wherein a width of the data bus is two bytes, where a byte is a one of eight or nine bits, and where the data strobe group comprises four conductors.

8. The bus of claim 1, wherein a width of the data bus is four bytes, where a byte is a one of eight or nine bits, and where the data strobe group comprises eight conductors.

9. The bus of claim 1, wherein a width of the data bus is six bytes, where a byte is a one of eight or nine bits, and where the data strobe group comprises twelve conductors.

10. The bus of claim 1, wherein a width of the data bus is eight bytes, where a byte is a one of eight or nine bits, and where the data strobe group comprises sixteen conductors.

11. The bus of claim 1, wherein a write mask is transferred over the data bus as part of a burst write operation.

12. The bus of claim 4, wherein the bus is adapted to operate in a sustained burst mode of unlimited duration.

13. The bus of claim 12, wherein the bus is disposed within a single semiconductor package containing a controller IC die and a memory IC die, wherein the memory IC die and controller IC die are disposed in a stacked arrangement, wherein the bus conductors comprise a group of unique bondwires, with each bus interface terminal on the memory IC die coupled via a unique bondwire to the corresponding bus interface terminal on the memory controller IC die, and a backside of the memory IC die faces a frontside of the controller IC die.

14. The bus of claim 12, wherein the bus is disposed within a single semiconductor package containing a controller IC die and a memory IC die, wherein the controller IC die's bus terminals are coupled to metallic conductors disposed on a substrate using flip-chip technology wherein the memory IC die is disposed in a stacked die arrangement with the controller IC die such that an active face of the memory IC die faces away from the substrate and such that each bus conductor is comprised of a series combination of a bondwire and substrate metallic conductor adapted such that each bus interface terminal of the controller IC is electrically coupled to a first end of a unique substrate metallic conductor and where the second end of each unique substrate metallic conductor trace is electrically coupled via a unique wirebond to the corresponding bus interface terminal on the memory IC die such that each bus interface terminal of the memory IC is coupled to the corresponding bus interface terminal of the controller IC via a series connection of at least a unique bondwire and a unique conductor disposed on the substrate.

15. The bus of claim 12, wherein the memory IC and the controller IC are each disposed in individual packages, with the bus interface terminals of each IC electrically coupled to external bus terminals on an outside of each package and wherein the bus conductors are comprised of a group of individual conductors disposed on the substrate such that each external bus interface terminal of the memory IC is coupled to a first end of a unique one of the group of individual conductors disposed on the substrate wherein the second end of the individual conductor is coupled to the corresponding external bus interface terminal of the controller IC in such a way that each bus interface terminal of the memory IC is coupled to the corresponding bus interface terminal of the controller IC via unique individual conductors disposed on the substrate.

16. The bus of claim 12, wherein the memory IC and the controller IC are each disposed in individual packages, wherein the bus interface terminals of each IC are electrically coupled to external bus interface terminals on an outside of each package and the memory IC package is disposed on the controller IC package in such a way that the bus conductors include solder connections electrically coupling each bus interface external terminal of the memory IC package to the corresponding external bus interface terminal of the controller IC package in a package-on-package stacking configuration.

17. The bus of claim 12, wherein the bus conductors are comprised of a group of unique wirebonds, each electrically coupling a bus interface terminal of the controller IC die to the corresponding bus interface terminal of the memory IC die, such that each memory IC bus interface terminal is coupled to the corresponding bus interface terminal of the controller IC wherein the memory IC die and the controller IC die are disposed adjacent to one another in a common plane on a substrate with a backside of each die facing the substrate.

18. The bus of claim 12, wherein a memory IC die and a controller IC die are each disposed on a common substrate where a backside of each die faces the substrate, and where each bus interface terminal of the memory IC die has a wirebond electrically coupling it to a first end of a unique metallic conductor disposed on the substrate and where the second end of the metallic conductor has a wirebond electrically coupling it to the corresponding bus interface terminal of the controller die in such a way that each bus interface terminal on the memory IC is electrically coupled to the corresponding bus interface terminal on the controller IC wherein each bus conductor comprises an electrical circuit consisting of a series combination of a unique first bondwire, a unique substrate conductor and a unique second bondwire.

19. The bus of claim 12, wherein the controller IC die and the memory IC die are each disposed with the active surface facing a flip chip substrate and with bus interface terminals electrically coupled to metallic conductors disposed thereon using flip chip technology such that each bus interface terminal on the memory IC die is electrically coupled to the corresponding bus interface terminal on the controller IC die with a unique conductor disposed on the flip chip substrate wherein the substrate conductors comprise the bus conductors.

20. The bus of claim 12, wherein the memory interface terminals of the memory IC die are each electrically coupled via bus conductors to the corresponding memory interface terminals on the memory controller IC die such that the bus conductors comprise metallic conductors disposed in channels that pass through at least a one of the two die.

21. The bus of claim 12, wherein the bus conductors comprise metallic bumps disposed on the bus interface terminals on a one of the memory IC die and the controller IC die such that at least one unique metallic bump electrically couples each bus interface terminal of the memory IC die with the corresponding bus interface terminal on the memory controller IC wherein the active surfaces of both die face one another.

22. A bus for interconnecting at least one memory IC with a controller IC wherein the bus is adapted to transfer memory commands and data using the same conductors wherein the bus is comprised of 16 conductors adapted to transport memory commands and data, two conductors adapted to transport clocks, and no more than five additional conductors adapted to transport data strobe and memory control signals and where the bus is adapted to transfer data at a peak bandwidth of at least 3000 Megabytes per second, wherein a single conductor is adapted to transport, from the controller IC to the memory IC concurrent with the transfer of data, a serial command that can direct the operation of the memory IC by providing address and data transfer control information to the memory IC.

23. A means for interconnecting at least one memory storage integrated circuit (IC) to a controller IC, comprising:
  means for electrically coupling a collection of terminals on the memory IC to corresponding terminals on the controller IC, including means for transmitting signals of one or more of the following type: data signals, indications of stability of transmitted information, clock signals, chip selection signals, or control signals, and
  means for transmitting through a single pin a serial command from the controller IC to the memory IC during a data transfer time such that the serial command can direct the operation of the memory IC by providing address and data transfer control information to the memory IC.

\* \* \* \* \*